US012648313B2

(12) United States Patent
Liu et al.

(10) Patent No.: US 12,648,313 B2
(45) Date of Patent: Jun. 2, 2026

(54) DISPLAY SUBSTRATE, MANUFACTURING METHOD THEREOF AND DISPLAY DEVICE

(71) Applicants:Chengdu BOE Optoelectronics Technology Co., Ltd., Chengdu (CN); BOE Technology Group Co., Ltd., Beijing (CN)

(72) Inventors: Ke Liu, Beijing (CN); Dan Guo, Beijing (CN); Ling Shi, Beijing (CN); Xiaoqi Ding, Beijing (CN); Wenxuan Zhang, Beijing (CN); Qian Li, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 488 days.

(21) Appl. No.: 18/034,395

(22) PCT Filed: Jun. 23, 2022

(86) PCT No.: PCT/CN2022/100821
§ 371 (c)(1),
(2) Date: Apr. 28, 2023

(87) PCT Pub. No.: WO2023/245557
PCT Pub. Date: Dec. 28, 2023

(65) Prior Publication Data
US 2025/0081761 A1     Mar. 6, 2025

(51) Int. Cl.
H10K 59/131          (2023.01)
(52) U.S. Cl.
CPC ................................... H10K 59/131 (2023.02)
(58) Field of Classification Search
CPC ............. H10K 59/131; H10K 59/1315; H10K 59/80521; H10K 59/35; H10K 59/352
See application file for complete search history.

(56) References Cited

U.S. PATENT DOCUMENTS 10,756,136 B1 *   8/2020   Ma ........................ H10H 29/142
2006/0164359 A1   7/2006   Kimura
(Continued)

FOREIGN PATENT DOCUMENTS

CN          100565645 C      12/2009
CN          103109314 A      5/2013
(Continued)

OTHER PUBLICATIONS

European Search Report for 22947328.5 Mailed Jun. 26, 2025.

*Primary Examiner* — Yuzhen Shen
(74) *Attorney, Agent, or Firm* — Ling Wu; Stephen Yang; Ling and Yang Intellectual Property

(57)          ABSTRACT

A display substrate, a manufacturing method thereof and a display device are provided. The display substrate includes pixel regions (PD) and blank regions (PB), the pixel region (PD) includes first power supply lines (70) and a second power supply line (80), the first power supply lines (70) are configured to continuously provide high-level signals to a pixel driving circuit, and the second power supply line (80) is configured to continuously provide low-level signals to a patterned cathode (403), each blank region (PB) includes high-voltage power supply connecting lines connected to the first power supply lines (70) in the adjacent pixel regions (PD) and low-voltage power supply connecting lines connected to the second power supply lines (80) in the adjacent pixel regions (PD), the first power supply lines (70) and the high-voltage power supply connecting lines form a high-voltage power supply wiring with a mesh connection structure.

18 Claims, 20 Drawing Sheets

(56)          References Cited

U.S. PATENT DOCUMENTS

| | | | |
|---|---|---|---|
| 2011/0136302 | A1 | 6/2011 | Yamazaki et al. |
| 2011/0267297 | A1 | 11/2011 | Yamazaki et al. |
| 2018/0190741 | A1 | 7/2018 | Lou |
| 2021/0126070 | A1 | 4/2021 | Kim |
| 2021/0167320 | A1 | 6/2021 | Kim et al. |
| 2021/0193774 | A1* | 6/2021 | Won ..................... H10K 77/111 |
| 2021/0202680 | A1 | 7/2021 | Shin et al. |
| 2021/0202685 | A1 | 7/2021 | Ban et al. |
| 2021/0242297 | A1* | 8/2021 | Yuan .................... H10K 59/131 |
| 2021/0384230 | A1 | 12/2021 | Feng |
| 2022/0102466 | A1 | 3/2022 | Qiu et al. |
| 2022/0376003 | A1 | 11/2022 | Wang et al. |
| 2023/0079023 | A1* | 3/2023 | Lee .................... H10K 59/1213 |
| | | | 257/40 |
| 2023/0165110 | A1 | 5/2023 | Yu et al. |

FOREIGN PATENT DOCUMENTS

| | | | |
|---|---|---|---|
| CN | 104795323 | A | 7/2015 |
| CN | 107579102 | A | 1/2018 |
| CN | 109103176 | A | 12/2018 |
| CN | 109410764 | A | 3/2019 |
| CN | 112151696 | A | 12/2020 |
| CN | 112750879 | A | 5/2021 |
| CN | 112885971 | A | 6/2021 |
| CN | 113053955 | A | 6/2021 |
| CN | 113130594 | A | 7/2021 |
| CN | 113471268 | A | 10/2021 |
| CN | 113725272 | A | 11/2021 |
| CN | 113793856 | A | 12/2021 |
| CN | 113871418 | A | 12/2021 |
| CN | 114039013 | A | 2/2022 |
| KR | 20190054563 | A | 5/2019 |
| WO | 2022067464 | A1 | 4/2022 |

* cited by examiner

DISPLAY SUBSTRATE, MANUFACTURING METHOD THEREOF AND DISPLAY DEVICE

CROSS-REFERENCE TO RELATED APPLICATION

The present application is a U.S. National Phase Entry of International Application No. PCT/CN2022/100821 having an international filing date of Jun. 23, 2022. The above-identified application is hereby incorporated by reference.

TECHNICAL FIELD

The present disclosure relates to, but is not limited to, the field of display technology, and more particularly, to a display substrate, a manufacturing method thereof and a display device.

BACKGROUND

Organic light emitting diodes (OLEDs) and quantum-dot light emitting diodes (QLEDs), which are active light emitting display components, have advantages such as self-luminescence, wide viewing angle, high contrast, low power consumption, extremely high response speed, lightness and thinness, bendability, low cost, etc. With the continuous development of display technology, flexible display devices (Flexible Display) that use OLEDs or QLEDs as light emitting components and use thin film transistors (TFTs) for signal control have become mainstream products in the field of display at present.

SUMMARY

The following is a summary of subject matters described in the present disclosure in detail. The summary is not intended to limit the protection scope of the claims.

In one aspect, the present disclosure provides a display substrate including a display area, which includes a plurality of pixel regions and a plurality of blank regions, wherein the blank regions are arranged between adjacent pixel regions in a first direction and between adjacent pixel regions in a second direction, the first direction intersects the second direction, the pixel regions are configured to display images, and the blank regions are configured to transmit light; in a plane perpendicular to the display substrate, the display substrate includes a driving circuit layer disposed on a substrate and a light emitting structure layer disposed on a side of the driving circuit layer away from the substrate, the driving circuit layer of a pixel region includes a plurality of circuit units, a plurality of first power supply lines and at least one second power supply line, a the circuit unit at least includes a pixel driving circuit, the light emitting structure layer of the pixel region at least includes a patterned cathode, the area of an orthographic projection of the cathode on the substrate is 1.1 to 1.3 times the area of an orthographic projection of the pixel region on the substrate; the first power supply lines are configured to continuously provide high-level signals to the pixel driving circuit, and the second power supply line is configured to continuously provide low-level signals to the cathode; the driving circuit layer of a blank region includes high-voltage power supply connecting lines connected to the first power supply lines in the adjacent pixel regions and low-voltage power supply connecting lines connected to the second power supply lines in the adjacent pixel regions, the first power supply lines and the high-voltage power supply connecting lines form a high-voltage power supply wiring with a mesh connection structure, and the second power supply line and the low-voltage power supply connecting lines form a low-voltage power supply wiring with a mesh connection structure.

In an exemplary embodiment, the high-voltage power supply connecting lines include first high-voltage connecting lines extending along the first direction and second high-voltage connecting lines extending along the second direction; the first high-voltage connecting lines are connected to the first power supply lines in the adjacent pixel regions in the first direction respectively, and the second high-voltage connecting lines are connected to the first power supply lines in the adjacent pixel regions in the second direction respectively; the driving circuit layer includes a plurality of conductive layers, the first high-voltage connecting lines are disposed on at least two of the conductive layers, and the second high-voltage connecting lines are disposed on at least two of the conductive layers.

In an exemplary embodiment, the pixel driving circuit includes a storage capacitor including a first plate and a second plate, an orthographic projection of the first plate on the substrate overlapping at least partially with an orthographic projection of the second plate on the substrate, and the second plate being connected to the first power supply lines; the first high-voltage connecting lines include a first transverse connecting line, which is connected to the second plates in the adjacent pixel regions in the first direction respectively, and the first transverse connecting line and the second plates are disposed on the same layer and are connected to each other to form an integrated structure.

In an exemplary embodiment, the first high-voltage connecting lines further include a second transverse connecting line, the second transverse connecting line and the first transverse connecting line are disposed on different conductive layers, both ends of the second transverse connecting line in the first direction are connected to both ends of the first transverse connecting line in the first direction through via holes respectively, and an orthographic projection of the second transverse connecting line on the substrate overlaps at least partially with an orthographic projection of the first transverse connecting line on the substrate.

In an exemplary embodiment, the first high-voltage connecting lines further include a third transverse connecting line, the third transverse connecting line and the second transverse connecting line are disposed on different conductive layers, the third transverse connecting line is connected to the both ends of the second transverse connecting line in the first direction through via holes respectively, and an orthographic projection of the third transverse connecting line on the substrate overlaps at least partially with the orthographic projection of the second transverse connecting line on the substrate.

In an exemplary embodiment, the third transverse connecting line includes at least two first sub-lines extending along the first direction and at least two second sub-lines extending along the second direction, the at least two second sub-lines are respectively connected to both ends of the at least two first sub-lines to form a mesh in the blank region, and an orthographic projection of at least one of the first sub-lines on the substrate overlaps at least partially with the orthographic projection of the second transverse connecting line on the substrate.

In an exemplary embodiment, the pixel region further includes a light emitting control signal line, the light emitting control signal line is configured to provide a light emitting control signal to the pixel driving circuit, the blank region further includes a light emitting control connecting line connected to the light emitting control signal lines in the adjacent pixel regions in the first direction, and the orthographic projection of the at least one of the first sub-lines on the substrate overlaps at least partially with an orthographic projection of the light emitting control signal line on the substrate.

In an exemplary embodiment, the second high-voltage connecting lines include at least one first vertical connecting line, the first vertical connecting line is connected to the first power supply lines in the adjacent pixel regions in the second direction respectively, and the first vertical connecting line and the first power supply line are disposed on the same layer and are connected to each other to form an integrated structure.

In an exemplary embodiment, the second high-voltage connecting lines further include at least one second vertical connecting line, the second vertical connecting line and the first vertical connecting line are disposed on different conductive layers, the second vertical connecting line is connected to the first power supply lines in the adjacent pixel regions in the second direction respectively, and an orthographic projection of the second vertical connecting line on the substrate overlaps at least partially with an orthographic projection of the first vertical connecting line on the substrate.

In an exemplary embodiment, the pixel region further includes a high-voltage mesh line, the first power supply line and the high-voltage grid line are disposed on different conductive layers, the high-voltage grid line is connected to the first power supply line through a via hole, and an orthographic projection of the high-voltage grid line on the substrate overlaps at least partially with an orthographic projection of the first power supply line on the substrate.

In an exemplary embodiment, the high-voltage mesh line and the second vertical connecting line of the second high-voltage connecting lines are disposed on the same layer and are connected to each other to form an integrated structure.

In an exemplary embodiment, the high-voltage mesh line includes at least two first mesh lines extending along the first direction and a plurality of second mesh lines extending along the second direction, the at least two first mesh lines are connected to both ends of the plurality of second mesh lines respectively, an orthographic projection of the second mesh line on the substrate overlaps at least partially with the orthographic projection of the first power supply line on the substrate, and the second mesh lines are connected to the first power supply line through via holes.

In an exemplary embodiment, the low-voltage power supply connecting lines include first low-voltage connecting lines extending along the first direction and second low-voltage connecting lines extending along the second direction; the second low-voltage connecting lines are connected to the second power supply lines in the adjacent pixel regions in the second direction respectively, and the first low-voltage connecting lines are connected to adjacent second low-voltage connecting lines in the first direction respectively; the driving circuit layer includes a plurality of conductive layers, and the first low-voltage connecting lines and the second low-voltage connecting lines are disposed on the same conductive layer.

In an exemplary embodiment, the second low-voltage connecting lines at least include a third vertical connecting line, which includes a plurality of third sub-lines extending along the second direction and at least two third connection blocks, the at least two third connection blocks being connected to both ends of the at least two third sub-lines.

In an exemplary embodiment, the pixel region further includes a plurality of data signal lines, the data signal lines are configured to provide data signals to the pixel driving circuit, the blank region further includes a data signal connecting line connected to the data signal lines in the adjacent pixel regions in the second direction, and an orthographic projection of the third sub-line on the substrate overlaps at least partially with an orthographic projection of the data signal connecting line on the substrate.

In an exemplary embodiment, the first low-voltage connecting lines include a plurality of fourth transverse connecting lines and a plurality of cathode connection electrodes alternately arranged along the first direction, the fourth transverse connecting lines being connected to the third sub-lines, and adjacent fourth transverse connecting lines in the first direction being connected to each other through the cathode connection electrodes.

In an exemplary embodiment, each of the fourth transverse connecting lines at least includes fourth sub-lines extending along the first direction and fourth connection blocks respectively disposed at both ends of the fourth sub-lines, the fourth connection blocks being connected to the third sub-lines, and the cathode connection electrodes being connected to the fourth connection blocks through via holes.

In an exemplary embodiment, the cathode is connected to the cathode connection electrodes through cathode electrode openings.

In an exemplary embodiment, the display substrate further includes a bonding area located at a side of the display area in the second direction and a bezel area located at other sides of the display area, the bezel area including a top bezel region located at a side of the display area away from the bonding area and a side bezel region located at one or two sides of the display area in the first direction; a bonding high-voltage lead and a bonding low-voltage lead are provided in the bonding area, a top bezel high-voltage lead and a top bezel low-voltage lead are provided in the top bezel region, and a side bezel high-voltage lead and a side bezel low-voltage lead are provided in the side bezel region; the bonding high-voltage lead is connected to the side bezel high-voltage lead and the side bezel high-voltage lead is connected to the top bezel high-voltage lead to form an annular high-voltage lead surrounding the display area; the bonding low-voltage lead is connected to the side bezel low-voltage lead and the side bezel low-voltage lead is connected to the top bezel low-voltage lead to form an annular low-voltage lead surrounding the display area.

In an exemplary embodiment, the annular low-voltage lead is located at a side of the annular high-voltage lead away from the display area.

In an exemplary embodiment, the top bezel high-voltage lead, the top bezel low-voltage lead, the side bezel high-voltage lead, and the side bezel low-voltage lead each has a patterned structure of a multi-line layout.

In an exemplary embodiment, in the plane perpendicular to the display substrate, the top bezel region includes a plurality of conductive layers, the top bezel high-voltage lead and the top bezel low-voltage lead are disposed on at least two of the conductive layers, the top bezel high-voltage lead is connected to the high-voltage power supply wiring in the display area through a high-voltage connecting line on one of the at least two of the conductive layers, and the top bezel low-voltage lead is connected to the low-voltage power supply wiring in the display area through a low-voltage connecting line in the other one of the at least two of the conductive layers.

In an exemplary embodiment, in the plane perpendicular to the display substrate, the side bezel region includes a plurality of conductive layers, the side bezel high-voltage lead and the side bezel low-voltage lead are disposed on at least two of the conductive layers, the side bezel high-voltage lead is connected to the high-voltage power supply wiring in the display area through a high-voltage connecting line in one of the at least two of the conductive layers, and the side bezel low-voltage lead is connected to the low-voltage power supply wiring in the display area through a low-voltage connecting line in the other one of the at least two of the conductive layers.

In an exemplary embodiment, both the bonding high-voltage lead and the bonding low-voltage leads have planar structures.

In an exemplary embodiment, in the plane perpendicular to the display substrate, the bonding area includes a plurality of conductive layers, the bonding high-voltage lead is disposed on at least two of the conductive layers, and the bonding low-voltage lead is disposed on at least two of the conductive layers.

In another aspect, the present disclosure further provides a display device including the display substrate described above.

In a further aspect, the present disclosure further provides a manufacturing method for a display substrate including a display area, which includes a plurality of pixel regions and a plurality of blank regions, the blank regions being arranged between adjacent pixel regions in a first direction and between adjacent pixel regions arranged in a second direction, the first direction intersecting the second direction, the pixel regions being configured to display images, the blank regions being configured to transmit light, and the manufacturing method including:

forming a driving circuit layer on a substrate, wherein the driving circuit layer of the pixel region includes a plurality of circuit units, a plurality of first power supply lines and at least one second power supply line, the circuit unit at least includes a pixel driving circuit, and the first power supply lines are configured to continuously provide high-level signals to the pixel driving circuit; the driving circuit layer of the blank region includes high-voltage power supply connecting lines connected to the first power supply lines in the adjacent pixel regions and low-voltage power supply connecting lines connected to the second power supply lines in the adjacent pixel regions, the first power supply lines and the high-voltage power supply connecting lines form a high-voltage power supply wiring with a mesh connection structure, and the second power supply line and the low-voltage power supply connecting lines form a low-voltage power supply wiring with a mesh connection structure; and forming a light emitting structure layer on the driving circuit layer, wherein the light emitting structure layer of a pixel region includes a patterned cathode, the area of an orthographic projection of the cathode on the substrate is 1.1 to 1.3 times the area of an orthographic projection of the pixel region on the substrate, and the second power supply line is configured to continuously provide low-level signals to the cathode.

Other aspects may become clear after the accompanying drawings and the detailed description are read and understood.

BRIEF DESCRIPTION OF DRAWINGS

The accompanying drawings are intended to provide an understanding for technical schemes of the present disclosure and form a part of the specification, and are used to explain the technical schemes of the present application together with embodiments of the present application, and not intended to form limitations to the technical schemes of the present disclosure.

Figure 1:
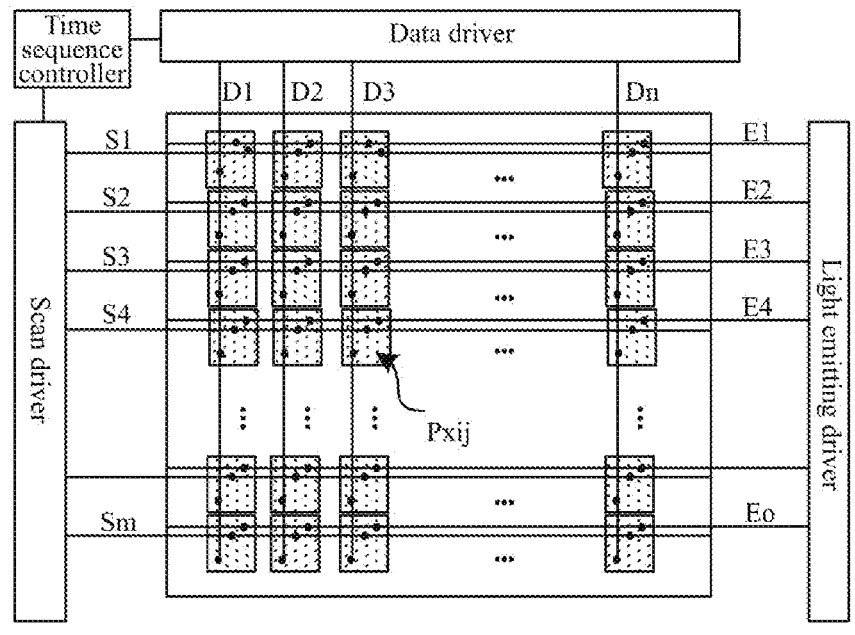
FIG. 1 is a schematic structure diagram of a display device.

quantity of sub-pixels in each pixel are not limited to the number shown in the drawings. The drawings described in the present disclosure are a schematic structure diagram

| Description of reference signs: | | |
|---|---|---|
| 11-first active layer; | 12-second active layer; | 13-third active layer; |
| 14-fourth active layer; | 15-fifth active layer; | 16-sixth active layer; |
| 17-seventh active layer; | 21-first scan signal line; | 22-second scan signal line |
| 23-light emitting control signal line; | 24-auxiliary scan signal line; | 25-first plate; |
| 31-first initial signal line; | 32-second initial signal line; | 33-second plate; |
| 34-plate connection line; | 41-first connection electrode; | 42-second connection electrode; |
| 43-third connection electrode; | 44-fourth connection electrode; | 45-data signal line; |
| 46-scan connection electrode; | 47-first initial connection line; | 48-second initial connection line; |
| 51-anode connection electrode; | 61-first scan connecting line; | 62-second scan connecting line; |
| 63-light emitting control connecting line; | 64-first initial transverse connecting line; | 65-Second initial transverse connecting line; |
| 66-data signal connecting line; | 67-first initial vertical connecting line; | 68-Second initial vertical connecting line; |
| 70-first power supply line; | 80-second power supply line; | 90-high-voltage grid line; |
| 91-first transverse connecting line; | 92-second transverse connecting line; | 93- third transverse connecting line; |
| 94-fourth transverse connecting line; | 95-first vertical connecting line; | 96-second vertical connecting line; |
| 97- third vertical connecting line; | 100-display area; | 101-substrate; |
| 102-driving circuit layer; | 103-light emitting structure layer; | 104-encapsulation structure layer; |
| 110-cathode connection electrode; | 200-bonding area; | 300-bezel area; |
| 301-anode; | 302-pixel definition layer; | 303-organic light emitting layer; |
| 304-cathode; | 310-top bezel region; | 320-side bezel region; |
| 401-first encapsulation layer; | 402-second encapsulation layer; | 403-third encapsulation layer; |
| 410-bonding high-voltage lead; | 420-bonding low-voltage lead; | 430-first high-voltage bonding pad; |
| 440-second high-voltage bonding pad; | 450-low-voltage transition line; | 460-low-voltage connection block; |
| 470-transparent low-voltage lead; | 480-transparent bonding pad; | 490-transparent connecting line; |
| 510-top bezel high-voltage lead; | 520-top bezel low-voltage lead; | 610-side bezel high-voltage lead; |
| 620-side bezel low-voltage lead. | | |

DETAILED DESCRIPTION

In order to make objects, technical schemes and advantages of the present disclosure more clear, embodiments of the present disclosure will be described below in detail in combination with the drawings. It should be noted that embodiments may be implemented in a number of different forms. Those of ordinary skills in the art may readily understand the fact that implementations and contents may be transformed into various forms without departing from the purpose and scope of the present disclosure. Therefore, the present disclosure should not be interpreted as being limited to the contents recorded in following embodiments only. The embodiments in the present disclosure and features in the embodiments can be arbitrarily combined with each other if there are no conflicts.

Scales of the drawings in the present disclosure can be used as references in the actual processes, but are not limited thereto. For example, the width-to-length ratio of a channel, the thickness of each film layer and the spacing between two film layers, and the width of each signal line and the spacing between two signal lines can be adjusted according to actual needs. The quantity of pixels in a display substrate and the only, and one implementation of the present disclosure is not limited to the shapes or numerical values shown in the drawings.

Ordinal numerals such as "first", "second", "third" and the like in the specification are set in order to avoid confusion of the constituent elements, but not to set a limit in quantity.

For convenience, the terms such as "middle", "upper", "lower", "front", "back", "vertical", "horizontal", "top", "bottom", "inside", "outside" and the like indicating orientation or position relationships are used in the specification to illustrate position relationships between the constituent elements with reference to the drawings, and are intended to facilitate description of the specification and simplification of the description, but not to indicate or imply that the mentioned device or element must have a specific orientation or be constructed and operated in a specific orientation, therefore, they should not be understood as limitations to the present disclosure. The position relationships between the constituent elements are appropriately changed according to directions of the constituent elements described. Therefore, words and phrases used in the specification are not limited and appropriate substitutions may be made according to situations.

Unless otherwise specified and defined explicitly, the terms "installed", "coupled" and "connected" should be understood in a broad sense in the specification. For example, the connection may be a fixed connection, a detachable connection or an integrated connection, or may be a mechanical connection or an electrical connection, or may be a direct connection, an indirect connection through intermediate components, or communication inside two components. The specific meanings of the above terms in the present disclosure can be understood by a person of ordinary skill in the art according to the specific situations.

In the specification, a transistor refers to a component which at least includes three terminals, a gate electrode, a drain electrode and a source electrode. The transistor has a channel region between the drain electrode (drain electrode terminal, drain region or drain) and the source electrode (source electrode terminal, source region or source), and a current can flow through the drain electrode, the channel region and the source electrode. In the specification, the channel region refers to a region which the current flows mainly through.

In the specification, the first electrode may be a drain electrode and the second electrode may be a source electrode, or the first electrode may be a source electrode and the second electrode may be a drain electrode. In the case that transistors with opposite polarities are used or the case that a current direction is changed during circuit operation, functions of the "source electrode" and the "drain electrode" are sometimes interchangeable. Therefore, in the specification, the "source electrode" and the "drain electrode" may be interchangeable and a "source terminal" and "a drain terminal" may be interchangeable.

In the specification, "electrical connection" includes a case where the constituent elements are connected together through an element with a certain electrical effect. The "element with the certain electrical effect" is not particularly limited as long as electrical signals can be sent and received between the connected constituent elements. Examples of the "element with the certain electrical action" not only include an electrode and a wiring, but also include a switching element such as a transistor, a resistor, an inductor, a capacitor, other elements with various functions, etc.

In the specification, "parallel" refers to a state in which an angle formed by two straight lines is greater than −10° and less than 10°, and thus also includes a state in which the angle is greater than −5° and less than 5°. In addition, "vertical" refers to a state in which an angle formed by two straight lines is greater than 800 and less than 100°, and thus also includes a state in which the angle is greater than 850 and less than 95°.

In the specification, "film" and "layer" may be interchangeable. For example, sometimes "conductive layer" may be replaced by "conductive film". Similarly, sometimes "insulating film" may be replaced by "insulating layer".

Triangle, rectangle, trapezoid, pentagon or hexagon in the specification are not in the strict sense, and they may be approximate triangle, rectangle, trapezoid, pentagon or hexagon, in which there may be some small deformation caused by tolerance, or there may be chamfers, arc edges and deformation, etc. "About" in the present disclosure means that a boundary is defined loosely and numerical values in process and measurement error ranges are allowed.

FIG. 1 is a schematic structure diagram of a display device. As shown in FIG. 1, the display device may include a time sequence controller, a data driver, a scan driver, a light emitting driver and a pixel array. The time sequence controller is connected to the data driver, the scan driver and the light emitting driver respectively, the data driver is connected to a plurality of data signal lines (D1 to Dn) respectively, the scan driver is connected to a plurality of scan signal lines (S1 to Sm) respectively, and the light emitting driver is connected to a plurality of light emitting control signal lines (E1 to Eo) respectively. The pixel array may include a plurality of sub-pixels Pxij, wherein i and j may be natural numbers. At least one sub-pixel Pxij may include a circuit unit and a light emitting device connected to the circuit unit, wherein the circuit unit may at least include a pixel driving circuit which is connected to the scan signal lines, the light emitting control signal lines and the data signal lines, respectively. In an exemplary embodiment, the time sequence controller may provide grayscale values and control signals suitable for the specification of the data signal driver to the data signal driver, provide clock signals and scan start signals suitable for the specification of the scan driver to the scan driver, and provide clock signals and emission stop signals suitable for the specification of the light emitting driver to the light emitting driver. The data driver may generate data voltages to be provided to the data signal lines D1, D2, D3 . . . , and Dn using the grayscale values and the control signals that are received from the time sequence controller. For example, the data driver may sample the grayscale values using the clock signals and apply the data voltages corresponding to the grayscale values to the data signal lines D1 to Dn by taking a row of sub-pixels as a unit, wherein n may be a natural number. The scan driver may generate scan signals to be provided to the scan signal lines S1, S2, S3, . . . , and Sm by receiving the clock signals and the scan start signals from the time sequence controller. For example, the scan driver may sequentially provide scan signals with on-level pulse to the scan signal lines S1 to Sm. For example, the scan driver may be constructed in the form of a shift register and generate the scan signals by sequentially transmitting the scan start signals provided in the form of an on-level pulse to a next-stage circuit under the control of the clock signals, wherein m may be a natural number. The light emitting driver may generate emission signals to be provided to the light emitting control signal lines E1, E2, E3, . . . , and Eo by receiving the clock signals and the emission stop signals from the time sequence controller. For example, the light emitting driver may sequentially provide emission signals with off-level pulse to the light emitting control signal lines E1 to Eo. For example, the light emitting driver may be constructed in the form of a shift register and generate the emission signals by sequentially transmitting the emission stop signals provided in the form of an off-level pulse to a next-stage circuit under the control of the clock signals, wherein o may be a natural number.

Figure 2:
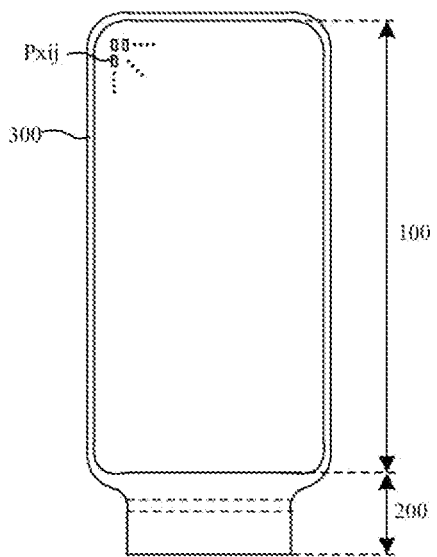
FIG. 2 is a schematic structure diagram of a display substrate.

FIG. 2 is a schematic structure diagram of a display substrate. As shown in FIG. 2, the display substrate may include a display area 100, a bonding area 200 located at one side of the display area 100 and a bezel area 300 located at other sides of the display area 100. In an exemplary embodiment, the display area 100 may be a flat area including a plurality of sub-pixels Pxij that form a pixel array. The plurality of sub-pixels Pxij is configured to display dynamic pictures or static images. The display area 100 may be referred to as an active area (AA). In an exemplary embodiment, the display substrate may be deformable, e.g., curled, crooked, folded or rolled-up.

In an exemplary embodiment, the bonding area 200 may include a fan-out region, a bending region, a driver chip region and a bonding pin region that are arranged sequentially along a direction away from the display area 100. The fan-out region, which is connected to the display area 100, may at least include data fan-out lines. A plurality of data fan-out lines is configured to be connected to the data signal lines in the display area. The bending region, which is connected to the fan-out region, may include a composite insulating layer, in which grooves are provided, and the bending region is configured to cause the bonding area to bend to the back of the display area. The driver chip region may at least include an integrated circuit (IC), and be configured to be connected to the plurality of data fan-out lines. The bonding pin region may at least include a plurality of bonding pads, and be configured to be bound to an external flexible printed circuit (FPC).

In an exemplary embodiment, the bezel area 300 may include a circuit region, a power supply line region, a crack dam zone and a cutting region which are sequentially arranged along the direction away from the display area 100. The circuit region, which is connected to the display area 100, may at least include a gate driving circuit which is connected to a first scan line, a second scan line and a light emitting control signal line of the pixel driving circuit in the display area 100. The power supply line region, which is connected to the circuit region, may at least include a bezel power supply lead, the bezel power supply lead extends along a direction parallel to an edge of the display area and is connected to a cathode in the display area 100. The crack dam region, which is connected to the power supply line region, may at least include a plurality of cracks arranged on the composite insulating layer. The cutting region, which is connected to the crack dam region, may at least include the cutting grooves provided in the composite insulating layer. After manufacturing for all film layers of the display substrate has been completed, a cutting device performs cutting along the cutting grooves respectively.

In an exemplary embodiment, a first isolation dam and a second isolation dam may be provided in the fan-out region in the bonding area 200 and the power supply line region in the bezel area 300. The first isolation dam and the second isolation dam may extend in the direction parallel to the edge of the display area 100 to form an annular structure surrounding the display area 100. The edge of the display area is an edge at one side of the bonding area or the bezel area of the display area.

Figure 3:
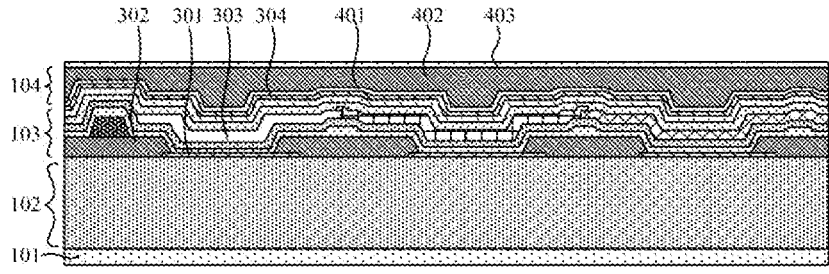
FIG. 3 is a schematic diagram of a cross-section structure of a display area in a display substrate.

FIG. 3 is a schematic diagram of a cross-section structure of a display area in a display substrate. As shown in FIG. 3, in a plane perpendicular to the display substrate, the display substrate may include a driving circuit layer 102 disposed on a substrate 101, a light emitting structure layer 103 disposed on one side of the driving circuit layer 102 away from the substrate 101 and an encapsulation structure layer 104 disposed on one side of the light emitting structure layer 103 away from the substrate 101. In some possible implementations, the display substrate may include other film layers, such as a touch structure layer, the present disclosure is not limited thereto.

In an exemplary embodiment, the substrate 101 may be a flexible substrate or a rigid substrate. The driving circuit layer 102 may include a plurality of circuit units, each of which may include a pixel driving circuit formed by a plurality of transistors and a storage capacitor. The light emitting structure layer 103 may include a plurality of sub-pixels, each of which may include a light emitting device and a pixel definition layer 302. The light emitting device may include an anode 301, an organic light emitting layer 303 and a cathode 304. The anode 301 is connected to the pixel driving circuit of the corresponding circuit unit, the organic light emitting layer 303 is connected to the anode

301, and the cathode 304 is connected to the organic light emitting layer 303. The organic light emitting layer 303 emits light of a corresponding color under driving of the anode 301 and the cathode 304. The encapsulation structure layer 104 may include a first encapsulation layer 401, a second encapsulation layer 402 and a third encapsulation layer 403 that are stacked. The first encapsulation layer 401 and the third encapsulation layer 403 may be made of inorganic materials, and the second encapsulation layer 402 may be made of an organic material. The second encapsulation layer 402 is disposed between the first encapsulation layer 401 and the third encapsulation layer 403 to form a stacked structure of inorganic material/organic material/inorganic material, so as to ensure that external water vapor cannot enter the light emitting structure layer 103.

In an exemplary embodiment, the organic light emitting layer may include a light emitting layer (EML) and any one or more of a hole injection layer (HIL), a hole transport layer (HTL), an electron block layer (EBL), a hole block layer (HBL), an electron transport layer (ETL) and an electron injection layer (EIL). In an exemplary embodiment, one or more of hole injection layers, hole transport layers, electron block layers, hole block layers, electron transport layers and electron injection layers of all sub-pixels may be connected to each other to form a common layer. Light emitting layers of adjacent circuit units may overlap with each other slightly, or may isolate from each other.

Figure 4:
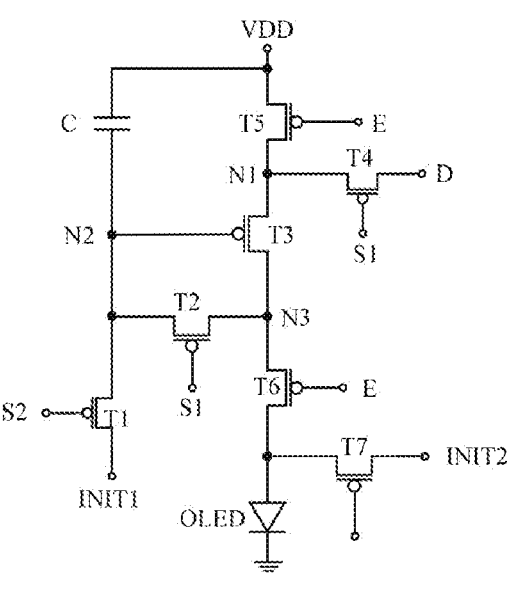
FIG. 4 is a schematic diagram of an equivalent circuit of a pixel driving circuit.

FIG. 4 is a schematic diagram of an equivalent circuit of a pixel driving circuit. In an exemplary embodiment, the pixel driving circuit may have a structure of 3T1C, 4T1C, 5T1C, 5T2C, 6T1C, 7T1C or 8T1C. As shown in FIG. 4, the pixel driving circuit may include seven transistors (a first transistor T1 through a seventh transistor T7) and one storage capacitor C. The pixel driving circuit is connected to eight signal lines (a data signal line D, a first scan signal line S1, a second scan signal line S2, a light emitting control signal line E, a first initial signal line INIT1, a second initial signal line INIT2, a first power supply line VDD and a second power supply line VSS) respectively.

In an exemplary embodiment, the pixel driving circuit may include a first node N1, a second node N2 and a third node N3. The first node N1 is connected to a first electrode of the third transistor T3, a second electrode of the fourth transistor T4 and a second electrode of the fifth transistor T5 respectively, the second node N2 is connected to a second electrode of the first transistor, a first electrode of the second transistor T2, a control electrode of the third transistor T3 and a second end of the storage capacitor C respectively, and the third node N3 is connected to a second electrode of the second transistor T2, a second electrode of the third transistor T3 and a first electrode of the sixth transistor T6 respectively.

In an exemplary embodiment, a first end of the storage capacitor C is connected to the first power supply line VDD, and the second end of the storage capacitor C is connected to the second node N2, i.e., the second end of the storage capacitor C is connected to the control electrode of the third transistor T3.

A control electrode of the first transistor T1 is connected to the second scan signal line S2, a first electrode of the first transistor T1 is connected to the first initial signal line INIT1, and the second electrode of the first transistor is connected to the second node N2. When a scan signal with on-level is applied to the second scan signal line S2, the first transistor T1 will transmit a first initial voltage to the second end of the storage capacitor C and the control electrode of the third transistor T3 so as to initialize charge quantities of the storage capacitor C and the control electrode of the third transistor T3.

A control electrode of the second transistor T2 is connected to the first scan signal line S1, the first electrode of the second transistor T2 is connected to the second node N2, and a second electrode of the second transistor T2 is connected to the third node N3. When a scan signal with on-level is applied to the first scan signal line S1, the second transistor T2 will cause the control electrode of the third transistor T3 to be connected to the second electrode of the third transistor T3.

The control electrode of the third transistor T3 is connected to the second node N2, i.e., the control electrode of the third transistor T3 is connected to the second end of the storage capacitor C, the first electrode of the third transistor T3 is connected to the first node N1, and the second electrode of the third transistor T3 is connected to the third node N3. The third transistor T3 may be referred to as a driving transistor. The third transistor T3 determines the amount of drive current flowing between the first power supply line VDD and the second power supply line VSS according to a potential difference between its control electrode and first electrode.

A control electrode of the fourth transistor T4 is connected to the first scan signal line S1, a first electrode of the fourth transistor T4 is connected to the data signal line D, and the second electrode of the fourth transistor T4 is connected to the first node N1. The fourth transistor T4 may be referred to as a switching transistor, a scanning transistor, etc. When a scan signal with on-level is applied to the first scan signal line S1, the fourth transistor T4 will cause a data voltage of the data signal line D to be input to the pixel driving circuit.

A control electrode of the fifth transistor T5 is connected to the light emitting control signal line E, a first electrode of the fifth transistor T5 is connected to the first power supply line VDD, and the second electrode of the fifth transistor T5 is connected to the first node N1. A control electrode of the sixth transistor T6 is connected to the light emitting control signal line E, the first electrode of the sixth transistor T6 is connected to the third node N3, and a second electrode of the sixth transistor T6 is connected to a first electrode of the light emitting device. The fifth transistor T5 and the sixth transistor T6 may be referred to as light emitting transistors. When a light emitting signal with on-level is applied to the light emitting control signal line E, the fifth transistor T5 and the sixth transistor T6 will cause the light emitting device to emit light by forming a drive current path between the first power supply line VDD and the second power supply line VSS.

A control electrode of the seventh transistor T7 is connected to the first scan signal line S1, a first electrode of the seventh transistor T7 is connected to the second initial signal line INIT2, and a second electrode of the seventh transistor T7 is connected to the first electrode of the light emitting device. When a scan signal with on-level is applied to the first scan signal line S1, the seventh transistor T7 will transmit a second initial voltage to the first electrode of the light emitting device so as to initialize or release a charge quantity accumulated in the first electrode of the light emitting device.

In an exemplary embodiment, the light emitting device may be an OLED including a first electrode (anode), an organic light emitting layer and a second electrode (cathode) which are stacked, or may be a QLED including a first electrode (anode), a quantum dot light emitting layer and a second electrode (cathode) which are stacked.

In an exemplary embodiment, a second electrode of the light emitting device is connected to the second power supply line VSS, signals of the second power supply line VSS are low-level signals continuously provided, and signals of the first power supply line VDD are high-level signals continuously provided.

In an exemplary embodiment, the first transistor T1 through the seventh transistor T7 may be P-type transistors or N-type transistors. Using the same type of transistors in the pixel driving circuit may simplify process flows, reduce process difficulties of a display panel, and improve the product yield. In some possible implementations, the first transistor T1 through the seventh transistor T7 may include P-type transistors and N-type transistors.

In an exemplary embodiment, the first transistor T1 through the seventh transistor T7 may be low temperature poly-silicon thin film transistors, or may be oxide thin film transistors, or may be low temperature poly-silicon thin film transistors and oxide thin film transistors. Active layers of the low temperature poly-silicon thin film transistors may be made of low temperature poly-silicon (LTPS), and active layers of the oxide thin film transistors may be made of oxide semiconductor (Oxide). The low temperature poly-silicon thin film transistors have advantages such as high migration rate and fast charging. The oxide thin film transistors have advantages such as low leakage current. The low temperature poly-silicon thin film transistors and the oxide thin film transistors are integrated on one display substrate to form a low temperature polycrystalline oxide (LTPO) display substrate, so that the advantages of both the low temperature poly-silicon thin film transistor and the oxide thin film transistors can be utilized, to implement low-frequency driving, decrease power consumption, and improve display quality.

In an exemplary embodiment, taking the seven transistors shown in FIG. 4 each being N-type transistors as an example, a working process of the pixel driving circuit may include the following stages.

In a first stage A1, referred to as a reset stage, a signal of the second scan signal line S2 is a low-level signal, and signals of the first scan signal line S1 and the light emitting control signal line E are high-level signals. The signal of the second scan signal line S2 is a low-level signal, such that the first transistor T1 is turned on. The first transistor T1 is turned on, such that an initial voltage of the first initial signal line INIT1 is provided to the second node N2 to initialize the storage capacitor C and clear the original data voltage in the storage capacitor. The signals of the first scan signal line S1 and the light emitting control signal line E are high-level signals, so that the second transistor T2, the fourth transistor T4, the fifth transistor T5, the sixth transistor T6 and the seventh transistor T7 are turned off. The OLED does not emit light in this stage.

In a second stage A2, referred to as a data writing stage or a threshold compensation stage, the signal of the first scan signal line S1 is a low-level signal, signals of the second scan signal line S2 and the light emitting control signal line E are high-level signals, and the data signal line D outputs a data voltage. In this stage, because the second end of the storage capacitor C is at a low level, the third transistor T3 is turned on. The signal of the first scan signal line S1 is a low-level signal, so that the second transistor T2, the fourth transistor T4 and the seventh transistor T7 are turned on. The second transistor T2 and the fourth transistor T4 are turned on, so that the data voltage output by the data signal line D is provided to the second node N2 through the first node N1, the turned-on third transistor T3, the third node N3 and the turned-on second transistor T2, and a difference between the data voltage output by the data signal line D and a threshold voltage of the third transistor T3 is charged to the storage capacitor C. A voltage of the second end (the second node N2) of the storage capacitor C is Vd−|Vth|, wherein Vd is the data voltage output by the data signal line D, and Vth is the threshold voltage of the third transistor T3. The seventh transistor T7 is turned on, so that a second initial voltage of the second initial signal line INIT2 is provided to a first electrode of the OLED to initialize (reset) the first electrode of the OLED and clear its internal pre-stored voltage, so as to complete the initialization. The signal of the second scan signal line S2 is a high-level signal, so that the first transistor T1 is turned off. The signal of the light emitting control signal line E is a high-level signal, so that the fifth transistor T5 and the sixth transistor T6 are turned off.

In a third stage A3, referred to as a light emitting stage, the signal of the light emitting control signal line E is a low-level signal, and the signals of the first scan signal line S1 and the second scan signal line S2 are high-level signals. The signal of the light emitting control signal line E is a low-level signal, so that the fifth transistor T5 and the sixth transistor T6 are turned on, and a power supply voltage output by the first power supply line VDD provides a drive voltage to the first electrode of the OLED through the turned-on fifth transistor T5, third transistor T3 and sixth transistor T6 to drive the OLED to emit light.

In the driving process of the pixel driving circuit, a drive current flowing through the third transistor T3 (driving transistor) is determined by a voltage difference between its gate electrode and first electrode. Because a voltage of the second node N2 is Vdata−|Vth|, the drive current of the third transistor T3 is:

$$I = K * (Vgs - Vth)^2 = K * [(Vdd - Vd + |Vth|) - Vth]^2 =$$
$$K * [(Vdd - Vd)]^2$$

wherein I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power supply voltage output by the first power supply line VDD.

With the continuous development of display technology, the OLED technology is increasingly applied in transparent display. The transparent display, which is an important personalized display field of the display technology, means that a display device itself has a certain degree of light penetration. The display device can display images in a transparent state, so that a viewer can see not only video images in the display device, but also scenes behind the display device. The transparent display may be widely applied to outdoor display or vehicle-mounted display.

Figure 5:
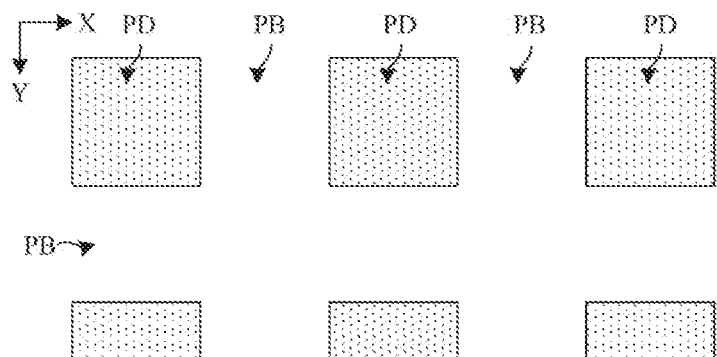
FIG. 5 is a schematic diagram of a planar structure of a display area in a display substrate.

FIG. 5 is a schematic diagram of a planar structure of a display area in a transparent display substrate. As shown in FIG. 5, in a plane parallel to the display substrate, the display area may include a plurality of pixel regions PD and a plurality of blank regions PB. The pixel regions PD and the blank regions PB are alternately arranged in the first direction X and the pixel regions PD and the blank regions PB are alternately arranged in the second direction Y, such that a blank region PB is arranged both between adjacent pixel regions PD in the first direction X and between adjacent pixel regions PD in the second direction Y, the first direction X intersecting the second direction Y. The pixel regions PD are configured to implement display of images, and the blank regions PB are configured to implement transmission of light, so as to implement transparent display.

In an exemplary embodiment, in the plane perpendicular to the display substrate, the display area, which implements transparent display, may include a driving circuit layer disposed on a substrate, a light emitting structure layer disposed on one side of the driving circuit layer away from the substrate, and an encapsulation layer disposed on one side of the light emitting structure layer away from the substrate.

Figure 6:
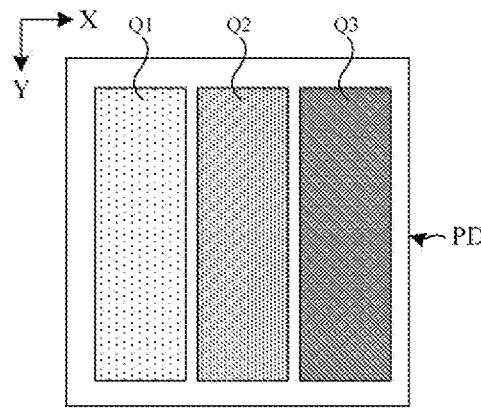
FIG. 6 is a schematic diagram of a planar structure of a driving circuit layer in a pixel region.

FIG. 6 is a schematic diagram of a planar structure of a driving circuit layer in a pixel region. As shown in FIG. 6, in the plane parallel to the display substrate, the driving circuit layer of at least one pixel region PD may include a first circuit unit Q1, a second circuit unit Q2 and a third circuit unit Q3, each of which may at least include a pixel driving circuit configured to output a corresponding current under the control of the corresponding signal line. In an exemplary embodiment, the first circuit unit Q1, the second circuit unit Q2 and the third circuit unit Q3 may be arranged in sequence along the first direction X to form a horizontal and parallel layout.

Figure 7:
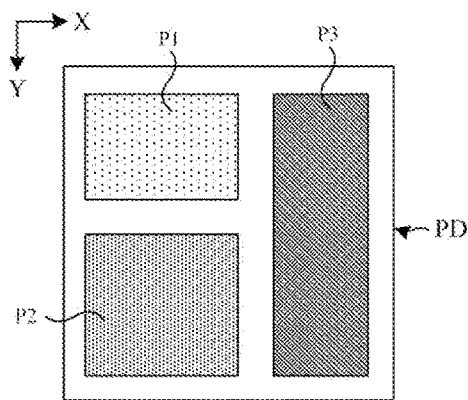
FIG. 7 is a schematic diagram of a planar structure of a light emitting structure layer in a pixel region.

FIG. 7 is a schematic diagram of a planar structure of a light emitting structure layer in a pixel region. As shown in FIG. 7, in the plane parallel to the display substrate, the light emitting structure layer of at least one pixel region PD may include a first sub-pixel P1 emitting light of a first color, a second sub-pixel P2 emitting light of a second color and a third sub-pixel P3 emitting light of a third color. Each sub-pixel may include a light emitting device, which is connected to the pixel driving circuit of the corresponding circuit unit and configured to emit light of corresponding luminance in response to a current output by the pixel driving circuit to which the light emitting circuit is connected.

In an exemplary embodiment, the first sub-pixel P1 may be a red (R) sub-pixel emitting red light, the second sub-pixel P2 may be a blue (B) sub-pixel emitting blue light, and the third sub-pixel P3 may be a green (G) sub-pixel emitting green light. The sub-pixels may be in the shape of a rectangle, a rhombus, a pentagon or hexagon.

In an exemplary embodiment, the first sub-pixel P1 and the second sub-pixel P2 may be arranged in sequence along the second direction Y, and the third sub-pixel P3 may be arranged at one side of the first sub-pixel P1 and the second sub-pixel P2 in the first direction X, to form a layout in the shape of the Chinese character "a".

In some possible exemplary embodiments, the driving circuit layer of the pixel region PD may include four circuit units, and the light emitting structure layer of the pixel region PD may include four sub-pixels. The four circuit units and the four sub-pixels may be arranged side by side horizontally, side by side vertically, in the shape of a square or in the shape of a diamond, the present disclosure is not limited thereto.

In an exemplary embodiment, the circuit unit mentioned in the present disclosure refers to an area divided according to the pixel driving circuit, and the sub-pixel mentioned in the present disclosure refers to an area divided according to the light emitting device. In an exemplary embodiment, the positions and shapes of orthographic projections of the sub-pixels on the substrate may correspond to the positions and shapes of orthographic projections of the circuit units on the substrate, or the positions and shapes of the orthographic projections of the sub-pixels on the substrate may not correspond to the positions and shapes of the orthographic projections of the circuit units on the substrate.

An exemplary embodiment of the present disclosure provides a display substrate, which implements transparent display, including a display area, the display area includes a plurality of pixel regions and a plurality of blank regions, wherein a blank region is arranged between its adjacent pixel regions in a first direction and between its adjacent pixel regions arranged in a second direction, the first direction intersects the second direction, the pixel regions are configured to display images, and the blank regions are configured to transmit light; in a plane perpendicular to the display substrate, the display substrate includes a driving circuit layer disposed on a substrate and a light emitting structure layer disposed on one side of the driving circuit layer away from the substrate, the driving circuit layer of the pixel region includes a plurality of circuit units, a plurality of first power supply lines and at least one second power supply line, each of the circuit units at least includes a pixel driving circuit, the light emitting structure layer of the pixel region includes a patterned cathode, the area of an orthographic projection of the cathode on the substrate is 1.1 to 1.3 times the area of an orthographic projection of the pixel region on the substrate; the first power supply lines are configured to continuously provide high-level signals to the pixel driving circuit, and the second power supply line is configured to continuously provide low-level signals to the cathode; the driving circuit layer of the blank region includes high-voltage power supply connecting lines connected to the first power supply lines in the adjacent pixel regions and low-voltage power supply connecting lines connected to the second power supply lines in the adjacent pixel regions, the first power supply lines and the high-voltage power supply connecting lines form a high-voltage power supply wiring of a mesh connection structure, and the second power supply line and the low-voltage power supply connecting lines form a low-voltage power supply wiring of a mesh connection structure.

In an exemplary embodiment, the high-voltage power supply connecting lines include first high-voltage connecting lines extending along the first direction and second high-voltage connecting lines extending along the second direction; the first high-voltage connecting lines are connected to the first power supply lines in the adjacent pixel regions in the first direction respectively, and the second high-voltage connecting lines are connected to the first power supply lines in the adjacent pixel regions in the second direction respectively; the driving circuit layer includes a plurality of conductive layers, the first high-voltage connecting lines are disposed on at least two of the conductive layers, and the second high-voltage connecting lines are disposed on at least two of the conductive layers.

In an exemplary embodiment, the low-voltage power supply connecting lines include first low-voltage connecting lines extending along the first direction and second low-voltage connecting lines extending along the second direction; the second low-voltage connecting lines are connected to the second power supply lines in the adjacent pixel regions in the second direction respectively, and the first low-voltage connecting lines are connected to adjacent second low-voltage connecting lines in the first direction respectively; the driving circuit layer includes a plurality of conductive layers, and the first low-voltage connecting lines and the second low-voltage connecting lines are disposed on the same conductive layer.

In the present disclosure, "A extending along a direction B" means that A may include a primary portion, which is a line, a line segment or a strip-shaped body, and a secondary portion connected to the primary portion. The primary portion extends along the direction B, and the length of the primary portion extending along the direction B is greater than the length of the secondary portion extending along other directions. "A extending along the direction B" mentioned in the following description means that "the primary portion of A extends along the direction B". In an exemplary embodiment, the second direction Y may be a direction from the display area towards the bonding area, and the opposite direction of the second direction Y may be a direction from the bonding area towards the display area.

Figure 8:
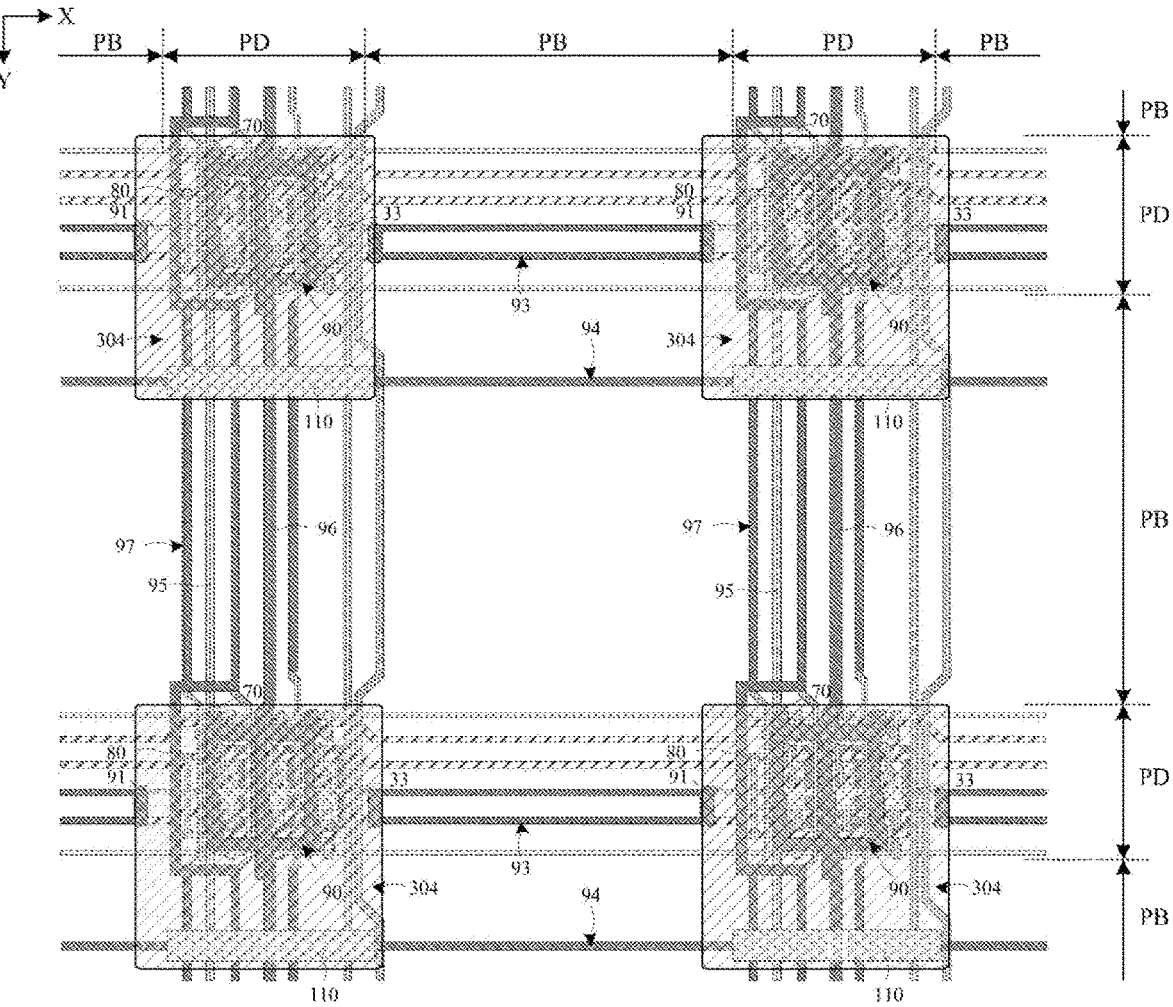
FIG. 8 is a schematic diagram of a planar structure of a display area in accordance with an exemplary embodiment of the present disclosure.

FIG. 8 is a schematic diagram of a planar structure of a display area in accordance with an exemplary embodiment of the present disclosure, which illustrates a structure of four pixel regions and a plurality of blank regions. In the plane parallel to the display substrate, the display area implementing transparent display may include a plurality of pixel regions PD and a plurality of blank regions PB, which are alternately arranged in the first direction X and the second direction Y. In the plane perpendicular to the display substrate, the display substrate may include a driving circuit layer disposed on the substrate and a light emitting structure layer disposed on one side of the driving circuit layer away from the substrate.

In an exemplary embodiment, the driving circuit layer of the pixel region PD may include three circuit units, a plurality of first power supply lines 70 and at least one second power supply line 80. Each of the circuit units may at least include a pixel driving circuit. The light emitting structure layer of the pixel region may at least include a patterned cathode 304. The first power supply lines 70 are connected to the pixel driving circuit of each circuit unit, and are configured to continuously provide high-level signals to the pixel driving circuit. The second power supply line 80 is connected to the cathode 304, and is configured to continuously provide low-level signals to the cathode 304.

In an exemplary embodiment, the patterned cathode 304 refers to a blocky structure processed through patterning. A main area, which is relatively large in area, in the cathode 304 of the blocky structure is provided in an area where the pixel region PD is located, and a connection area or other areas, which are relatively small in area, in the cathode 304 are provided in an area where the blank region PB is located, that is, the cathode 304 is not provided in the larger area of the blank region PB, so as to improve the transmittance of the display substrate.

In an exemplary embodiment, an orthographic projection of the cathode 304 on the substrate may contain an orthographic projection of the pixel region PD on the substrate. The orthographic projection of the patterned cathode 304 on the substrate has a cathode projection area, and the orthographic projection of the pixel region PD on the substrate has a pixel region projection area. The cathode projection area may be about 1.1 to 1.3 times the pixel region projection area.

In an exemplary embodiment, the driving circuit layer of the blank region PB may include at least one high-voltage power supply connecting line configured to be connected to the first power supply lines 70 in the adjacent pixel regions PD and at least one low-voltage power supply connecting line configured to be connected to the second power supply lines 80 in the adjacent pixel regions PD.

In an exemplary embodiment, the high-voltage power supply connecting line may include a first high-voltage connecting line extending along the first direction X and a second high-voltage connecting line extending along the second direction Y. The first high-voltage connecting line is configured to be connected to the first power supply lines 70 in the adjacent pixel regions PD in the first direction X, to implement continuous transmission by the first power supply lines 70 in the first direction X, and the second high-voltage connecting line is configured to be connected to the first power supply lines 70 in the adjacent pixel region PD in the second direction Y, to implement continuous transmission by the first power supply lines 70 in the second direction Y. The first power supply lines 70, the first high-voltage connecting line and the second high-voltage connecting line form a high-voltage power supply wiring with a mesh connection structure in the display area, through high-voltage power supply wiring, high-voltage power supply signals are transmitted.

In an exemplary embodiment, the low-voltage power supply connecting line may include a first low-voltage connecting line extending along the first direction X and a second low-voltage connecting line extending along the second direction Y. The first low-voltage connecting line is configured to be connected to the second power supply lines 80 in the adjacent pixel regions PD in the first direction X, to implement continuous transmission by the second power supply line 80 in the first direction X, and the second low-voltage connecting line is configured to be connected to the second power supply line 80 in the adjacent pixel region PD in the second direction Y, to implement continuous transmission by the second power supply line 80 in the second direction Y. The second power supply line 80, the first low-voltage connecting line and the second low-voltage connecting line form a low-voltage power supply wiring with a mesh connection structure in the display area, through the low-voltage power supply wiring, low-voltage power supply signals are transmitted.

In an exemplary embodiment, in a plane perpendicular to the substrate, the driving circuit layer may include a plurality of conductive layers. The first high-voltage connecting line and the second high-voltage connecting line may be disposed on at least two of the conductive layers, to form a high-voltage power supply wiring of a double-layer structure in the display area, and the high-voltage power supply wiring in each layer have a mesh connection structure. The first low-voltage connecting line and the second low-voltage connecting line may be disposed on the same conductive layer and formed synchronously through the same running of patterning processes.

In an exemplary embodiment, the plurality of conductive layers of the driving circuit layer may at least include a first conductive layer, a second conductive layer, a third conductive layer and a fourth conductive layer disposed in sequence on the substrate. The first high-voltage connecting line and the second high-voltage connecting line may be respectively disposed on the second conductive layer, the third conductive layer and the fourth conductive layer, and the first low-voltage connecting line and the second low-voltage connecting line may be disposed on the fourth conductive layer.

Figure 9:
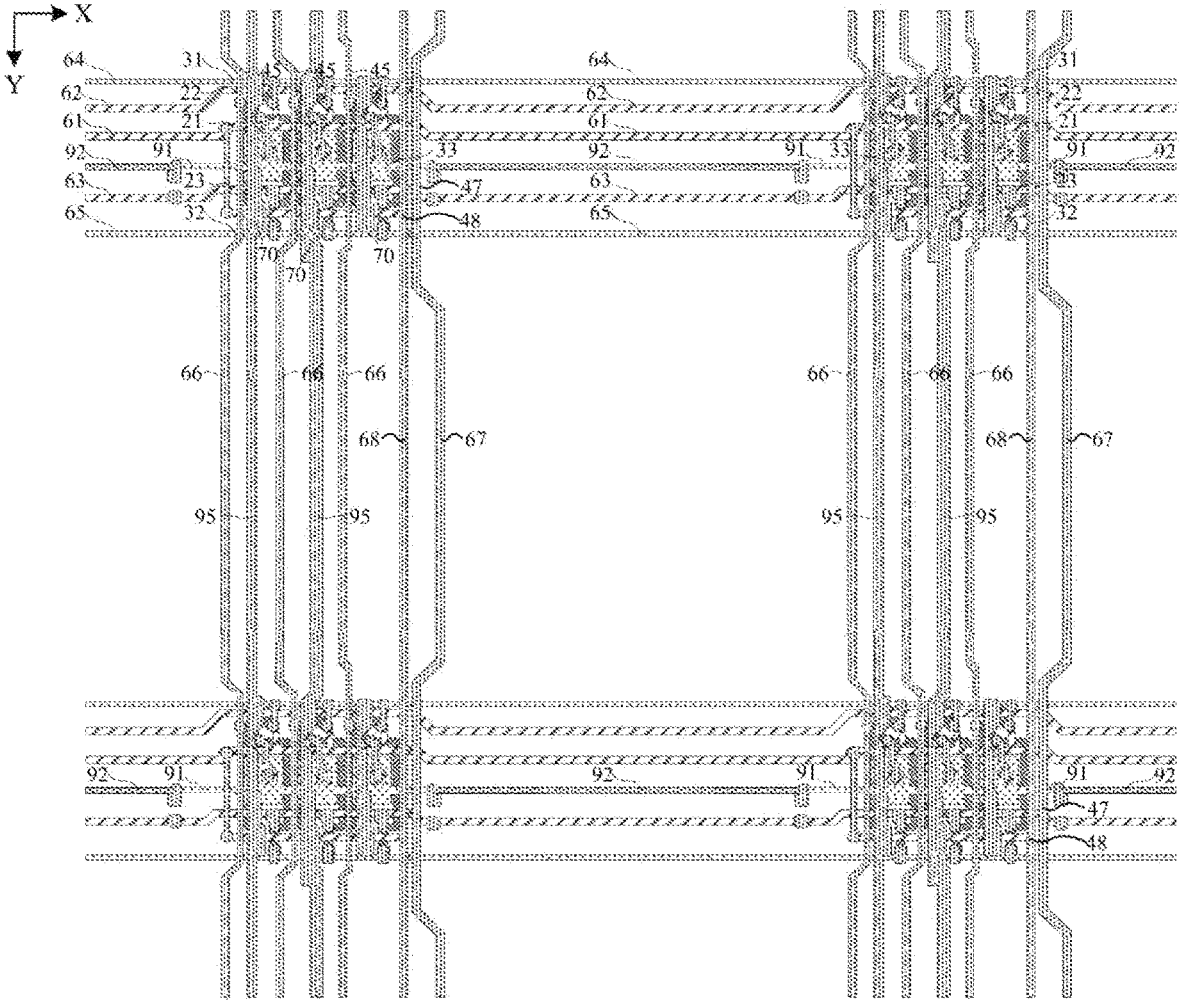
FIGS. 9 and 10 are schematic diagrams of a planar structure of power supply wirings in accordance with an exemplary embodiment of the present disclosure.
Figure 10:
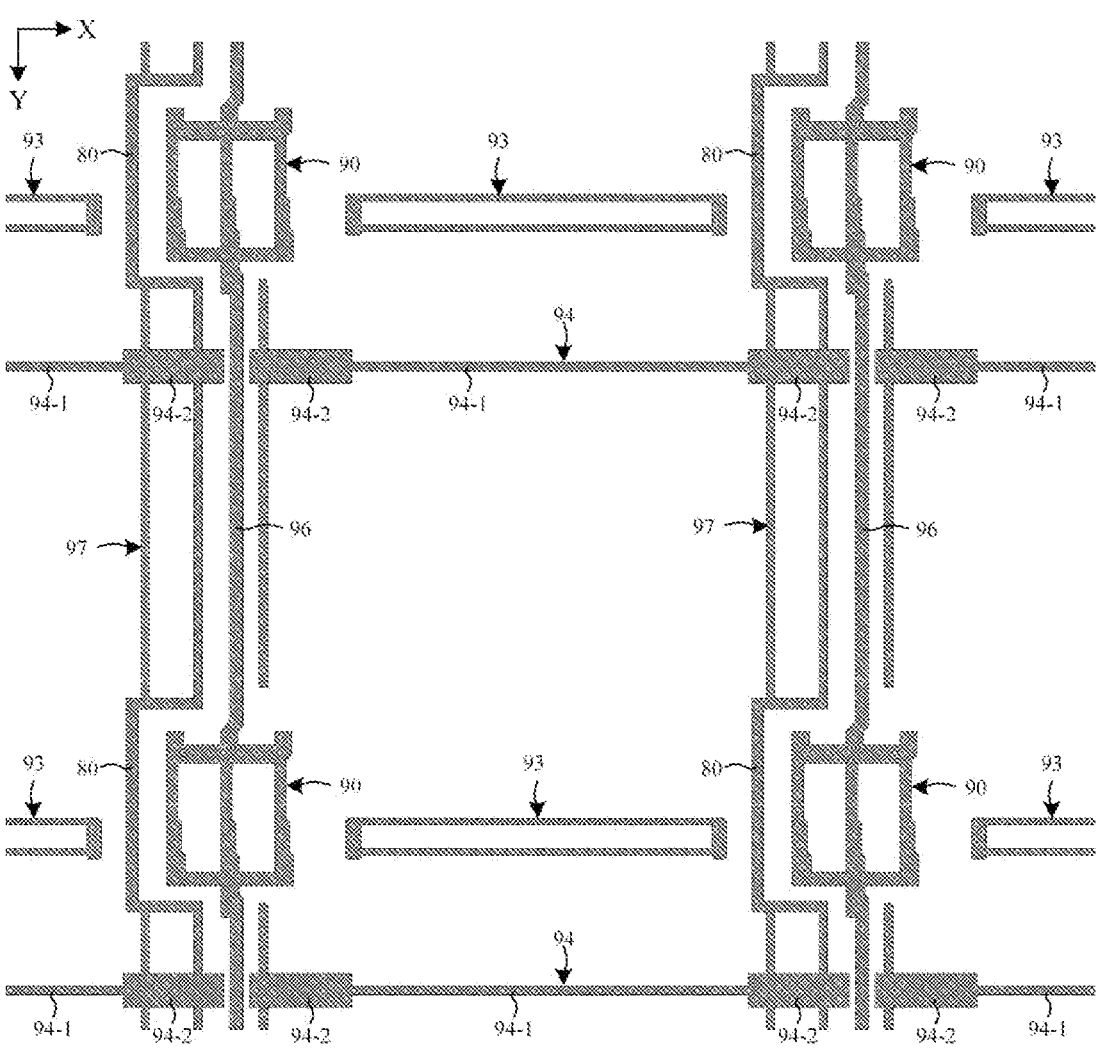

FIGS. 9 and 10 are schematic diagrams of a planar structure of a power supply wiring in accordance with an exemplary embodiment of the present disclosure. FIG. 9 is a schematic diagram of a planar structure of the first conductive layer through the third conductive layer in FIG. 8, and FIG. 10 is a schematic diagram of a planar structure of the fourth conductive layer in FIG. 8. As shown in FIGS. 8, 9 and 10, the driving circuit layer of at least one pixel region may include three circuit units, three first power supply lines 70 and at least one second power supply line 80, the driving circuit layer of at least one blank region may include high-voltage power supply connecting lines and low-voltage power supply connecting lines, the first power supply lines 70 and the high-voltage power supply connecting lines form a high-voltage wiring with a mesh connection structure in the display area, by high-voltage wiring the high-voltage power supply signals are transmitted, and the second power supply line 80 and the low-voltage power supply connecting lines form a low-voltage wiring with a mesh connection structure in the display area, by low-voltage wiring, the low-voltage power supply signals are transmitted.

In an exemplary embodiment, at least one pixel driving circuit may include a storage capacitor and a plurality of transistors. The pixel driving circuit may be connected to a plurality of signal lines. The plurality of signal lines in the pixel region may at least include a first scan signal line 21 providing a first scan signal to the pixel driving circuit, a second scan signal line 22 providing a second scan signal to the pixel driving circuit, a light emitting control signal line 23 providing a light emitting control signal to the pixel driving circuit, a first initial signal line 31 providing a first initial voltage signal to the pixel driving circuit, a second initial signal line 32 providing a second initial voltage signal to the pixel driving circuit, a data signal line 45 providing a data voltage signal to the pixel driving circuit, a first initial connection line 47 connected to the first initial signal line 31, a second initial connection line 48 connected to the second initial signal line 32 and first power supply lines 70 providing first power supply signals to the pixel driving circuit. In an exemplary embodiment, the storage capacitor may include a first plate and a second plate 33. The first power supply lines 70 are connected to the second plate 33. The second plates 33 of the three pixel driving circuits in the pixel region are connected to each other to form an integrated structure.

In an exemplary embodiment, the first scan signal line 21, the second scan signal line 22, the light emitting control signal line 23, the first initial signal line 31 and the second initial signal line 32 may be in the shape of a straight line or a fold line, which extends along the first direction X, and the first power supply line 70 and the data signal line 45 may be in the shape of a straight line or a fold line, which extends along the second direction Y.

In an exemplary embodiment, a plurality of signal lines in one pixel region may be connected to a plurality of signal lines in another adjacent pixel region through a plurality of blank region connecting lines in a blank region, to implement continuous transmission by the plurality of signal lines in the first direction X and the second direction Y. In an exemplary embodiment, the plurality of blank region connecting lines in the blank region may at least include a first scan line connecting line 61 connected to the first scan signal lines 21 in the adjacent pixel regions in the first direction X, a second scan line connecting line 62 connected to the second scan signal lines 22 in the adjacent pixel regions in the first direction X, a light emitting control connecting line 63 connected to the light emitting control signal lines 23 in the adjacent pixel regions in the first direction X, a first initial transverse connecting line 64 connected the first initial signal lines 31 in the adjacent pixel regions in the first direction X, a second initial transverse connecting line 65 connected the second initial signal lines 32 in the adjacent pixel regions in the first direction X, a first high-voltage connecting line connected to the first power supply lines 70 in the adjacent pixel regions in the first direction X, a first low-voltage connecting line connected to the second power supply lines 80 in the adjacent pixel regions in the first direction X, a data signal connecting line 66 connected to the data signal lines 45 in the adjacent pixel regions in the second direction Y, a first initial vertical connecting line 67 connected to the first initial connection lines 47 in the adjacent pixel regions in the second direction Y, a second initial vertical connecting line 68 connected to the second initial connection lines 48 in the adjacent pixel regions in the second direction Y, a second high-voltage connecting line connected to the first power supply lines 70 in the adjacent pixel regions in the second direction Y, and a second low-voltage connecting line connected to the second power supply lines 80 in the adjacent pixel regions in the second direction Y.

In an exemplary embodiment, the first scan connecting line 61, the second scan connecting line 62, the light emitting control connecting line 63, the first initial transverse connecting line 64, the second initial transverse connecting line 65, the first high-voltage connecting line and the first low-voltage connecting line may be in the shape of a straight line or a fold line, which extends along the first direction X, and the data signal connecting line 66, the first initial connection line 47, the second initial connection line 48, the first initial vertical connecting line 67, the second initial vertical connecting line 68, the second high-voltage connecting line and the second low-voltage connecting line may be in the shape of a straight line or a fold line, which extends along the second direction Y.

In an exemplary embodiment, the first scan signal line 21, the second scan signal line 22, the light emitting control signal line 23, the first scan connecting line 61, the second scan connecting line 62 and the light emitting control connecting line 63 may be disposed on the first conductive layer. The first scan signal line 21 and the first scan connecting line 61 may be connected to each other to form an integrated structure, the second scan signal line 22 and the second scan connecting line 62 may be connected to each other to form an integrated structure, and the light emitting control signal line 23 and the light emitting control connecting line 63 may be connected to each other to form an integrated structure.

In an exemplary embodiment, the first initial signal line 31, the second initial signal line 32, the first initial transverse connecting line 64 and the second initial transverse connecting line 65 may be disposed on the second conductive layer. The first initial signal line 31 and the first initial transverse connecting line 64 may be connected to each other to form an integrated structure, and the second initial signal line 32 and the second initial transverse connecting line 65 may be connected to each other to form an integrated structure.

In an exemplary embodiment, the data signal line 45 and the data signal connecting line 66 may be disposed on the third conductive layer. The data signal line 45 and the data signal connecting line 66 may be connected to each other to form an integrated structure.

In an exemplary embodiment, the first initial connection line 47, the second initial connection line 48, the first initial vertical connecting line 67 and the second initial vertical connecting line 68 may be disposed on the third conductive layer. The first initial connection line 47 and the first initial vertical connecting line 67 may be connected to each other to form an integrated structure, and the second initial connection line 48 and the second initial vertical connecting line 68 may be connected to each other to form an integrated structure.

In an exemplary embodiment, the pixel region includes three circuit units, one first power supply line 70 being provided in each of circuit units. The first power supply line 70 may be in the shape of a straight line or a fold line, which extends along the second direction Y. The first power supply line 70 is connected to the second plate 33 of the circuit unit in which the first power supply line 70 is located.

In an exemplary embodiment, the first high-voltage connecting line may at least include a first transverse connecting line 91, a second transverse connecting line 92 and a third transverse connecting line 93, the first low-voltage connecting line may at least include a fourth transverse connecting line 94 and a cathode connection electrode 110, the second high-voltage connecting line may at least include a first vertical connecting line 95 and a second vertical connecting line 96, and the second low-voltage connecting line may at least include a third vertical connecting line 97.

In an exemplary embodiment, the first transverse connecting line 91 may be in the shape of a straight line or a fold line, which extends along the first direction X, and the first transverse connecting line 91 is connected to the second plates 33 of the storage capacitors in the adjacent pixel regions in the first direction X. Because the second plates 33 of the three pixel driving circuits in the pixel region are connected to each other to form an integrated structure and the second plates 33 are connected to the first power supply lines 70, the first transverse connecting line 91 can form a first high-voltage connecting line by which the high-voltage power supply signals are transmitted in the first direction X.

In an exemplary embodiment, the second plate 33 and the first transverse connecting line 91 may be disposed on the second conductive layer. The second plate 33 and the first transverse connecting line 91 may be connected to each other to form an integrated structure.

In an exemplary embodiment, the second transverse connecting line 92 may be in the shape of a straight line or a fold line, which extends along the first direction X. Both ends of the second transverse connecting line 92 in the first direction X are connected to both ends of the first transverse connecting line 91 in the first direction X respectively. Because the first transverse connecting line 91 is connected to the first power supply lines 70, the second transverse connecting line 92 may form another first high-voltage connecting line by which the high-voltage power supply signals are transmitted in the first direction X.

In an exemplary embodiment, the second transverse connecting line 92 may be disposed on the third conductive layer. An orthographic projection of the second transverse connecting line 92 on the substrate overlaps at least partially with an orthographic projection of the first transverse connecting line 91 on the substrate. Because both ends of the second transverse connecting line 92 are connected to both ends of the first transverse connecting line 91 through via holes respectively, the first transverse connecting line 91 located on the second conductive layer and the second transverse connecting line 92 located on the third conductive layer form a double-layer wiring in the blank region, by the double-layer wiring the high-voltage power supply signals are transmitted in the first direction X.

In an exemplary embodiment, the third transverse connecting line 93 may in the shape of a mesh, which extends along the first direction X. Both ends of the third transverse connecting line 93 in the first direction X are connected to both ends of the second transverse connecting line 92 in the first direction X respectively, to form a mesh in the shape of a rectangular ring in the blank region. Because the second transverse connecting line 92 is connected to the first power supply lines 70, the third transverse connecting line 93 may form yet another first high-voltage connecting line by which the high-voltage power supply signals are transmitted in the first direction X.

In an exemplary embodiment, the third transverse connecting line 93 may be disposed on the fourth conductive layer. An orthographic projection of the third transverse connecting line 93 on the substrate overlaps at least partially with the orthographic projection of the second transverse connecting line 92 on the substrate. Because both ends of the third transverse connecting line 93 are connected to both ends of the second transverse connecting line 92 through via holes respectively, the first transverse connecting line 91 located on the second conductive layer, the second transverse connecting line 92 located on the third conductive layer and the third transverse connecting line 93 located on the fourth conductive layer form a three-layer wiring in the blank region, by three-layer wiring the high-voltage power supply signals are transmitted in the first direction X.

In an exemplary embodiment, the third transverse connecting line 93 may include at least two first sub-lines extending along the first direction X and at least two second sub-lines extending along the second direction Y. The at least two second sub-lines are connected to both ends of the at least two first sub-lines in the first direction X respectively, to form a mesh in the shape of a rectangular ring in the blank region. An orthographic projection of one of the first sub-lines on the substrate overlaps at least partially with the orthographic projection of the second transverse connecting line 92 on the substrate, and an orthographic projection of the other one of the first sub-lines on the substrate overlaps at least partially with an orthographic projection of the light emitting control connecting line 63 on the substrate.

In an exemplary embodiment, the first sub-lines and the second sub-lines may be disposed on the fourth conductive layer and are connected to each other to form an integrated structure. At least one of the second sub-lines is connected to one end of the second transverse connecting line 92 through a via hole, and at least one of the second sub-lines is connected to the other end of the second transverse connecting line 92 through a via hole.

In an exemplary embodiment, the first vertical connecting line 95 may be in the shape of a straight line or a fold line, which extends along the second direction Y. Because the first vertical connecting line 95 is connected to the first power supply lines 70 in the adjacent pixel regions in the second direction Y, the first vertical connecting line 95 may form the second high-voltage connecting line by which the high-voltage power supply signals are transmitted in the second direction Y.

In an exemplary embodiment, the first power supply lines 70 and the first vertical connecting line 95 may be disposed on the third conductive layer. The first power supply lines 70 and the first vertical connecting line 95 may be connected to each other to form an integrated structure.

In an exemplary embodiment, the second vertical connecting line 96 may be in the shape of a straight line or a fold line, which extends along the second direction Y. Because the second vertical connecting line 96 is connected to the first power supply lines 70 in the adjacent pixel regions in the second direction Y, the second vertical connecting line 96 may form another second high-voltage connecting line by which the high-voltage power supply signals are transmitted in the second direction Y.

In an exemplary embodiment, the first vertical connecting line 95 may be disposed on the third conductive layer, and the second vertical connecting line 96 may be disposed on the fourth conductive layer. Because the orthographic projection of the second vertical connecting line 96 on the substrate overlaps at least partially with the orthographic projection of the first vertical connecting line 95 on the substrate, the first vertical connecting line 95 located on the third conductive layer and the second vertical connecting line 96 located on the fourth conductive layer form a double-layer wiring in the blank region, by double-layer wiring the high-voltage power supply signals are transmitted in the second direction Y.

In an exemplary embodiment, because the pixel region includes three circuit units, three first power supply lines 70 may be provided in the pixel region. However, two first vertical lines 95 and one second vertical line 96 may be provided in the blank region to reduce the number of wirings in the blank region and improve the transmittance of the display substrate.

In an exemplary embodiment, the pixel region may further include a high-voltage mesh line 90. The high-voltage mesh line 90 and the first power supply line 70 may be disposed on different conductive layers. An orthographic projection of the high-voltage mesh line 90 on the substrate overlaps at least partially with an orthographic projection of the first power supply line 70 on the substrate. The high-voltage mesh line 90 is connected to the first power supply lines 70 through a via hole. The first power supply line 70 and the high-voltage mesh line 90 in two conductive layers form a wiring of a double-layer structure in the pixel region, the wiring of a double-layer structure provides the high-voltage power supply signals.

In an exemplary embodiment, the second vertical connecting line 96 is connected to the high-voltage mesh lines 90 in the adjacent pixel regions in the second direction Y.

In an exemplary embodiment, the high-voltage mesh line 90 and the second vertical connecting line 96 may be disposed on the fourth conductive layer. The high-voltage mesh line 90 and the second vertical connecting line 96 may be connected to each other to form an integrated structure.

In an exemplary embodiment, the high-voltage mesh line 90 may include at least two first mesh lines extending along the first direction X and at least three second mesh lines extending along the second direction Y. The two first mesh lines are connected to both ends of the three second mesh lines respectively, to form a high-voltage wiring with a mesh structure in the pixel region.

In an exemplary embodiment, an orthographic projection of each of the second mesh lines on the substrate overlaps at least partially with the orthographic projection of the first power supply line 70 on the substrate and is connected to the first power supply line 70 through a via hole.

In an exemplary embodiment, the second plate 33 and the first transverse connecting line 91 on the second conductive layer in the display area may form a wiring by which the high-voltage power supply signals are transmitted in the first direction X, the first power supply line 70 and the first vertical connecting line 95 on the third conductive layer may form a wiring by which the high-voltage power supply signals are transmitted X in the second direction Y, and the high-voltage mesh line 90 and the second vertical connecting line 96 on the fourth conductive layer may form a wiring by which the high-voltage power supply signals are transmitted in the second direction Y, therefore the second conductive layer, the third conductive layer and the fourth conductive layer may form a high-voltage wiring with a multi-layer mesh connection structure in the display area.

In an exemplary embodiment, the second power supply line 80 may be in the shape of a straight line or a fold line, which extends along the second direction Y. One second power supply line 80 may be provided in the pixel region. The second power supply line 80 may be disposed at one side of the pixel region in the opposite direction of the first direction X.

In an exemplary embodiment, the second low-voltage connecting line may at least include a third vertical connecting line 97, which may be in the shape of a mesh extending along the second direction Y. The third vertical connecting line 97 is connected to the second power supply lines 80 in the adjacent pixel regions in the second direction Y, therefore the third vertical connecting line 97 may form the second low-voltage connecting line by which the low-voltage power supply signals are transmitted in the second direction Y.

In an exemplary embodiment, the third vertical connecting line 97 may include at least three third sub-lines and at least two third connection blocks. The third sub-lines may be in the shape of a straight line or a fold line, which extends along the second direction Y, and the third connection blocks may be in the shape of a strip, which extends along the first direction X. Two of the third sub-lines and the two third connection blocks are disposed at one side of the second vertical connecting line 96 in the first direction X, and one of the third sub-lines is disposed at the other side of the second vertical connecting line 96 in the first direction X. The two third connection blocks located at the same side of the second vertical connecting line 96 are disposed at the ends of the third sub-lines in the second direction Y and are connected to the two third sub-lines respectively, to form a mesh in the shape of a rectangular ring in a blank region. The two third connection blocks are also connected to the second power supply lines 80 in the adjacent pixel regions in the second direction Y respectively, to implement the connections between the third vertical connecting line 97 and the second power supply lines 80.

In an exemplary embodiment, the third sub-lines and the third connection blocks may be disposed on the fourth conductive layer and are connected to each other to form an integrated structure.

In an exemplary embodiment, an orthographic projection of the third sub-line on the substrate overlaps at least partially with an orthographic projection of the data signal connecting line 66 on the substrate.

In an exemplary embodiment, a plurality of fourth transverse connecting lines 94 and a plurality of cathode connection electrodes 110 may be alternately arranged along the first direction X. The fourth transverse connecting lines 94 may be in the shape of a straight line or a fold line, which extends along the first direction X. The fourth transverse connecting lines 94 may be arranged between the adjacent second vertical connecting lines 96 in the first direction X and connected to the third vertical connecting line 97. The cathode connection electrodes 110 may be in the shape of a strip extending along the first direction X. The cathode connection electrodes 110 are configured to be connected to the cathode 304. The adjacent fourth transverse connecting lines 94 in the first direction X are connected to each other through the cathode connection electrodes 110, therefore the fourth transverse connecting lines 94 and the cathode connection electrodes 110 can form a first low-voltage connecting line by which the low-voltage power supply signals are transmitted in the first direction X.

In an exemplary embodiment, the fourth transverse connecting lines 94 may be disposed on the fourth conductive layer, and the cathode connection electrodes 110 may be disposed on an anode conductive layer. An orthographic projection of the cathode connection electrode 110 on the substrate overlap at least partially with an orthographic projection of the fourth transverse connecting line 94 on the substrate. The cathode connection electrodes 110 are connected to the fourth transverse connecting lines 94 located at both sides of the second vertical connecting line 96 through via holes, respectively.

In an exemplary embodiment, each fourth transverse connecting line 94 may include a fourth sub-line 94-1 and two fourth connection blocks 94-2. The fourth sub-line 94-1 may be in the shape of a straight line or a fold line, which extends along the first direction X, and the fourth connection blocks 94-2 may be in the shape of a strip, which extends along the first direction X. The two fourth connection blocks 94-2 may be disposed at both ends of the fourth sub-line 94-1 respectively and connected to the fourth sub-line 94-1.

In an exemplary embodiment, the fourth connection block 94-2 located at one side of the second vertical connecting line 96 is connected to two third sub-lines, and the fourth connection block 94-2 located at the other side of the second vertical connecting line 96 is connected to one third sub-line. There is no overlap between an orthographic projection of the fourth connection block 94-2 on the substrate and an orthographic projection of the second vertical connecting line 96 on the substrate.

In an exemplary embodiment, the fourth sub-line 94-1 and the fourth connection blocks 94-2 may be disposed on the fourth conductive layer and connected to each other to form an integrated structure.

In an exemplary embodiment, an orthographic projection of the cathode connection electrode 110 on the substrate overlaps at least partially with the orthographic projections of the two fourth connection blocks 94-2, located at both sides of the second vertical connecting line 96, on the substrate. The cathode connection electrodes 110 are connected to the two fourth connection blocks 94-2 through the via holes, respectively.

In an exemplary embodiment, the fourth transverse connecting lines 94 of the fourth conductive layer in the display area and the cathode connection electrodes 110 of the anode conductive layer may form a wiring by which the low-voltage power supply signals are transmitted in the first direction X, and the second power supply line 80 and the third vertical connecting line 97 of the fourth conductive layer may form a wiring by which the low-voltage power supply signals are transmitted in the second direction Y, therefore the fourth conductive layer and the anode conductive layer may form a low-voltage wiring of a mesh connection structure in the display area.

A manufacturing process for the display substrate will be described below by way of example. "Patterning processes" mentioned in the present disclosure include photoresist coating, mask exposure, development, etching, photoresist stripping, etc., for metal materials, inorganic materials or transparent conductive materials, and include organic material coating, mask exposure, development, etc., for organic materials. Deposition may be any one or more of sputtering, evaporation and chemical vapor deposition, coating may be any one or more of spray coating, spin coating and inkjet printing, and etching may be any one or more of dry etching and wet etching, the present disclosure is not limited thereto. "Film" refers to a layer of film formed from a certain material on a substrate using deposition, coating or other processes. If the "film" does not need to be processed through the patterning processes in the entire manufacturing process, the "film" may also be called a "layer". If the "film" needs to be processed through the patterning processes in the entire manufacturing process, the "film" is called a "film" before the patterning processes are performed and is called a "layer" after the patterning processes are performed. At least one "pattern" is contained in the "layer" which has been processed through the patterning processes. "A and B being disposed on the same layer" mentioned in the present disclosure means that A and B are formed simultaneously through the same running of the patterning processes, and the "thickness" of the film layer is the dimension of the film layer in a direction perpendicular to the display substrate. In an exemplary embodiment of the present disclosure, "an orthographic projection of B being within the range of an orthographic projection of A" or "an orthographic projection of A containing an orthographic projection of B" means that the boundary of the orthographic projection of B falls within the range of the boundary of the orthographic projection of A, or the boundary of the orthographic projection of A overlaps with the boundary of the orthographic projection of B.

In an exemplary embodiment, taking one pixel region including three circuit units (first circuit unit Q1, second circuit unit Q2 and third circuit unit Q3) as an example, the manufacturing process for the display substrate may include the following operations.

Figure 11:
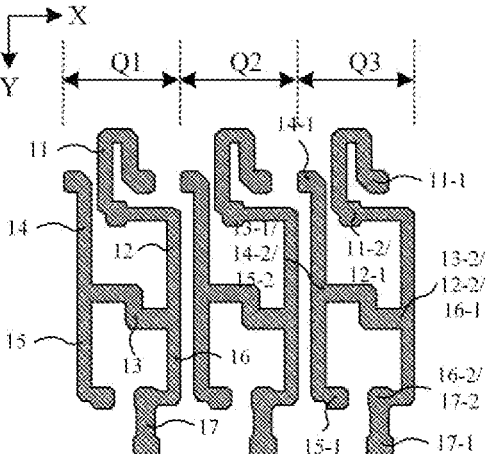
FIG. 11 is a schematic diagram after a pattern of a semiconductor layer is formed in accordance with an embodiment of the present disclosure.

(1) A pattern of a semiconductor layer is formed. In an exemplary embodiment, forming the pattern of the semiconductor layer may include: depositing sequentially a first insulating film and a semiconductor film on a substrate, and patterning the semiconductor film through the patterning processes to form a first insulating layer on the substrate and the a pattern of the semiconductor layer disposed on the first insulating layer, as shown in FIG. 11.

In an exemplary embodiment, the pattern of the semiconductor layer of each circuit unit in the pixel region may at least include a first active layer 11 of a first transistor T1 through a seventh active layer 17 of a seventh transistor T7. The first active layer 11 through the seventh active layer 17 are connected to each other to form an integrated structure.

In an exemplary embodiment, in the first direction X, the second active layer 12 and the sixth active layer 16 may be located at the same side of the third active layer 13 in the circuit unit, and the fourth active layer 14 and the fifth active layer 15 may be located at the same side of the third active layer 13 in the circuit unit. In the second direction Y, the first active layer 11, the second active layer 12 and the fourth active layer 14 may be located at a side of the third active layer 13 in the circuit unit in the opposite direction of the second direction Y, and the fifth active layer 15, the sixth active layer 16 and the seventh active layer 17 may located at a side of the third active layer 13 in the circuit unit in the second direction Y.

In an exemplary embodiment, the first active layer 11 may be in the shape of the letter "n", the second active layer 12, the fifth active layer 16 and the sixth active layer 16 may be in the shape of the letter "L", the third active layer 13 may be in the shape of a fold line extending along the first direction X, and the fourth active layer 14 and the seventh active layer 17 may be in the shape of the letter "I".

In an exemplary embodiment, the active layer of each transistor may include a first region, a second region and a channel region located between the first region and the second region. In an exemplary embodiment, the second region 11-2 of the first active layer 11 may serve as the first region 12-1 of the second active layer 12, the first region 13-1 of the third active layer 13 may serve as both the second region 14-2 of the fourth active layer 14 and the second region 15-2 of the fifth active layer 15, the second region 13-2 of the third active layer 13 may serve as both the second region 12-2 of the second active layer 12 and the first region 16-1 of the sixth active layer 16, and the second region 16-2 of the sixth active layer 16 may serve as the second region 17-2 of the seventh active layer 17. The first region 11-1 of the first active layer 11, the first region 14-1 of the fourth active layer 14, the first region 15-1 of the fifth active layer 15 and the first region 17-1 of the seventh active layer 17 may be separately provided.

Figure 12A:
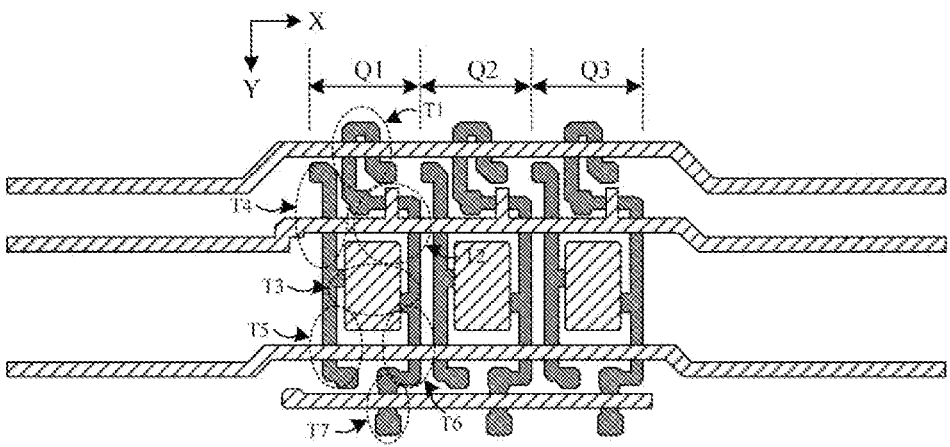
FIGS. 12a and 12b are schematic diagrams after a pattern of a first conductive layer is formed in accordance with an embodiment of the present disclosure.
Figure 12B:
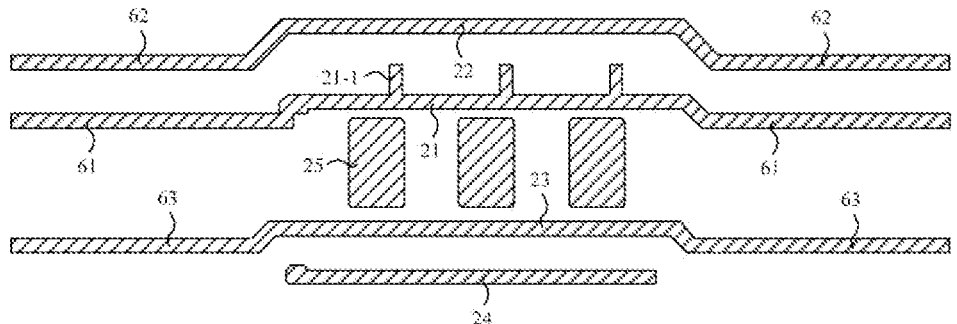

(2) A Pattern of a first conductive layer is formed. In an exemplary embodiment, forming the pattern of the first conductive layer may include: depositing sequentially a second insulating film and a first conductive film on the substrate, on which the aforementioned patterns are formed, and patterning the first conductive film through the patterning processes to form a second insulating layer overlaying the pattern of the semiconductor layer and form the pattern of the first conductive layer disposed on the second insulating layer, as shown in FIGS. 12a and 12b. FIG. 12b is a schematic plan view of the first conductive layer in FIG. 12a. In an exemplary embodiment, the first conductive layer may be referred to as a first gate metal (GATE1) layer.

In an exemplary embodiment, the pattern of the first conductive layer of each circuit unit in the pixel region may at least include a first scan signal line 21, a second scan signal line 22, a light emitting control signal line 23, an auxiliary scan signal line 24 and a first plate 25 of a storage capacitor.

In an exemplary embodiment, the first plate 25 may be in the shape of a rectangle, angles of which may be configured to be chamfer. An orthographic projection of the first plate 25 on the substrate overlaps at least partially with an orthographic projection of the third active layer of the third transistor T3 on the substrate. In an exemplary embodiment, the first plate 25 may serve as both one plate of the storage capacitor and a gate electrode of the third transistor T3.

In an exemplary embodiment, the first scan signal line 21 may be in the shape of a line, a primary portion of which extends along the first direction X. The first scan signal line 21 may be located at a side of the first plate 25 of the circuit unit in the opposite direction of the second direction Y. A gate block 21-1 is provided on the first scan signal line 21 of each circuit unit. A first end of the gate block 21-1 is connected to the first scan signal line 21, and a second end of the gate block 21-1 extends towards a direction away from the first plate 25. An area where the first scan signal line 21 and the gate block 21-1 overlap with the second active layer of the circuit unit serves as a gate electrode of the second transistor T2 of a double-gate structure, and an area where the first scan signal line 21 overlaps with the fourth active layer of the circuit unit serves as a gate electrode of the fourth transistor T4.

In an exemplary embodiment, the second scan signal line 22 may be in the shape of a line, a primary portion of which extends along the first direction X. The second scan signal line 22 may be located at a side of the first scan signal line 21 of the circuit unit away from the first plate 25. An area where the second scan signal line 22 overlaps with the first active layer of the circuit unit serves as a gate electrode of the first transistor T1 of a double-gate structure.

In an exemplary embodiment, the light emitting control signal line 23 may be in the shape of a line, a primary portion of which extends along the first direction X. The light emitting control signal line 23 may be located at a side of the first plate 25 of the circuit unit in the second direction Y. An area where the light emitting control signal line 23 overlaps with the fifth active layer of the circuit unit serves as a gate electrode of the fifth transistor T5, and an area where the light emitting control signal line 23 overlaps with the sixth active layer of the circuit unit serves as a gate electrode of the sixth transistor T6.

In an exemplary embodiment, the auxiliary scan signal line 24 may be in the shape of a line, a primary portion of which extends along the first direction X. The auxiliary scan signal line 24 may be located at a side of the light emitting control signal line 23 away from the first plate 25. An area where the auxiliary scan signal line 24 overlaps with the seventh active layer of the circuit unit serves as a gate electrode of the seventh transistor T7. In an exemplary embodiment, the auxiliary scan signal line 24 is configured to be connected to the first scan signal line 21 through a scan connection electrode, therefore scan signals transmitted by the first scan signal line 21 and the auxiliary scan signal line 24 are the same.

In an exemplary embodiment, the first scan signal line 21, the second scan signal line 22, the light emitting control signal line 23 and the auxiliary scan signal line 24 may be designed to have equal widths, or may be designed to have unequal widths, may be in the shape of a straight line or a fold line, so as to not only facilitate layout of a pixel structure, but also reduce a parasitic capacitance between the signal lines, the present disclosure is not limited thereto.

In an exemplary embodiment, the first conductive layer of the blank region may include a first scan connecting line 61, a second scan connecting line 62 and a light emitting control connecting line 63.

In an exemplary embodiment, the first scan connecting line 61 may be in the shape of a straight line or a fold line, a primary portion of which extends along the first direction X. Both ends of the first scan connecting line 61 are connected to the first scan signal lines 21 in the adjacent pixel regions in the first direction X respectively. The first scan connecting line 61 may serve as a connection line between the adjacent pixel regions in the first direction X to implement continuous transmission of first scan signals.

In an exemplary embodiment, the second scan connecting line 62 may be in the shape of a straight line or a fold line, a primary portion of which extends along the first direction X. Both ends of the second scan connecting line 62 are connected to the second scan signal lines 22 in the adjacent pixel regions in the first direction X respectively. The second scan connecting line 62 may serve as a connection line between the adjacent pixel regions in the first direction X to implement continuous transmission of second scan signals.

In an exemplary embodiment, the light emitting control connecting line 63 may be in the shape of a straight line or a fold line, a primary portion of which extends along the first direction X. Both ends of the light emitting control connecting line 63 are connected to the light emitting control signal lines 23 in the adjacent pixel regions in the first direction X respectively. The light emitting control connecting line 63 may serve as a connection line between the adjacent pixel regions in the first direction X to implement continuous transmission of light emitting control signals.

In an exemplary embodiment, after the pattern of the first conductive layer is formed, the semiconductor layer may be conductorized using the first conductive layer as a shield. An area of the semiconductor layer, shielded by the first conductive layer, forms the channel regions of the first transistor T1 through the seventh transistor T7, and an area of the semiconductor layer, not shielded by the first conductive layer, is conductorized, that is, each of the first regions and second regions of the first active layer through the seventh active layer is conductorized.

Figure 13A:
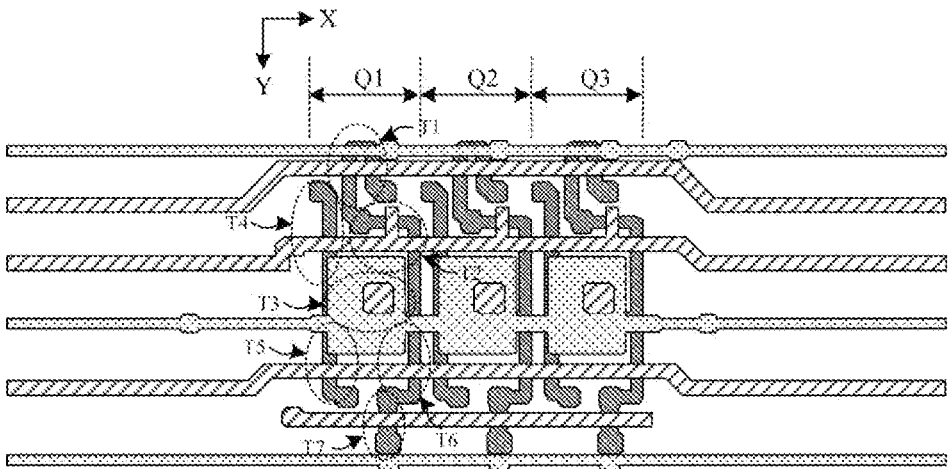
FIGS. 13a and 13b are schematic diagrams after a pattern of a second conductive layer is formed in accordance with an embodiment of the present disclosure.
Figures 13B, 14:
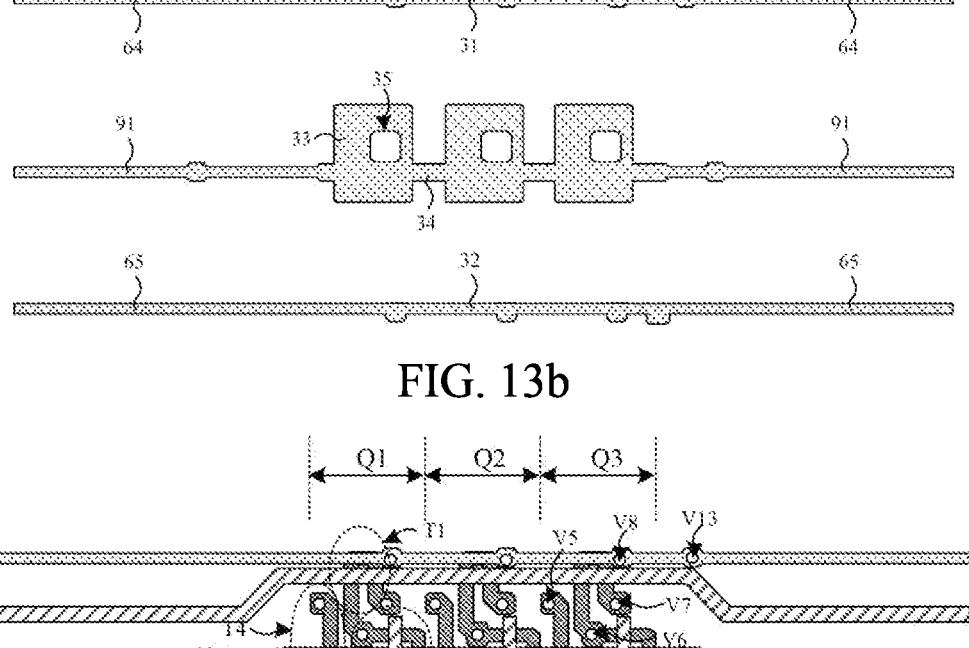
FIG. 14 is a schematic diagram after a pattern of a fourth insulating layer is formed in accordance with an embodiment of the present disclosure.

(3) A pattern of a second conductive layer is formed. In an exemplary embodiment, forming the pattern of the second conductive layer may include: depositing sequentially a third insulating film and a second conductive film on the substrate, on which the aforementioned patterns are formed, and patterning the second conductive film through the patterning processes to form a third insulating layer overlaying the first conductive layer and form the pattern of the second conductive layer disposed on the third insulating layer, as shown in FIGS. 13a and 13b. FIG. 13b is a schematic plan view of the second conductive layer in FIG. 13a. In an exemplary embodiment, the second conductive layer may be referred to as a second gate metal (GATE2) layer.

In an exemplary embodiment, the pattern of the second conductive layer of each circuit unit in the pixel region at least includes a first initial signal line 31, a second initial signal line 32, a second plate 33 of the storage capacitor and a plate connection line 34.

In an exemplary embodiment, the outline of the second plate 33 may be in the shape of a rectangle, angles of which may be configured to be chamfer. An orthographic projection of the second plate 33 on the substrate overlaps at least partially with the orthographic projection of the first plate 25 on the substrate. The second plate 33 may serve as the other plate of the storage capacitor. The first plate 25 and the second plate 33 form the storage capacitor of the pixel driving circuit.

In an exemplary embodiment, the plate connection line 34 is disposed at a side of the second plate 33 in the first direction X or in the opposite direction of the first direction X. A first end of the plate connection line 34 is connected to the second plate 33 of the circuit unit, and a second end of the plate connection line 34 is connected to the second plate 33 of its adjacent circuit unit in the first direction X after extending along the first direction X or the opposite direction of the first direction X, such that the second plates 33 of three circuit units in one pixel region are connected to each other. In an exemplary embodiment, Because the second plate 33 in each circuit unit is connected to a first power supply line formed subsequently and the second plates 33 of the adjacent circuit units are connected to each other to form an integrated structure, the second plates of the integrated structure may be reused as transverse power supply signal lines, so as to ensure that a plurality of second plates in one pixel region have the same potential.

In an exemplary embodiment, an opening 35 is provided in the second plate 33. The opening 35 may be in the shape of a rectangle and may be located in the middle of the second plate 33, so that the second plate 33 forms an annular structure. The opening 35 exposes the third insulating layer overlaying the first plate 25, and the orthographic projection of the first plate 25 on the substrate contains an orthographic projection of the opening 35 on the substrate. In an exemplary embodiment, the opening 35 is configured to accommodate a first via hole formed subsequently, the first via hole is located in the opening 35 and exposes the first plate 25, so that a second electrode of the first transistor T1, which is formed subsequently, is connected to the first plate 25.

In an exemplary embodiment, the first initial signal line 31 may be in the shape of a line, a primary portion of which extends along the first direction X. The first initial signal line 31 may be located at a side of the second scan signal line 22 of the circuit unit away from the second plate 33. The first initial signal line 31 is configured to be connected to the first region of the first active layer through a first electrode of the first transistor T1, which is formed subsequently.

In an exemplary embodiment, the second initial signal line 32 may be in the shape of a line, a primary portion of which extends along the first direction X. The second initial signal line 32 may be located at a side of the auxiliary scan signal line 24 of the circuit unit away from the second plate 33. The second initial signal line 32 is configured to be connected to the first region of the seventh active layer through a first electrode of the seventh transistor T7, which is formed subsequently.

In an exemplary embodiment, the second conductive layer of the blank region may include a first initial transverse connecting line 64, a second initial transverse connecting line 65 and a first transverse connecting line 91.

In an exemplary embodiment, the first initial transverse connecting line 64 may be in the shape of a straight line or a fold line, a primary portion of which extends along the first direction X. Both ends of the first initial transverse connecting line 64 are connected to the first initial signal lines 31 in the adjacent pixel regions in the first direction X respectively. The first initial transverse connecting line 64 may serve as a connection line between the adjacent pixel regions in the first direction X to implement continuous transmission of first initial signals in the first direction X.

In an exemplary embodiment, the second initial transverse connecting line 65 may be in the shape of a straight line or a fold line, a primary portion of which extends along the first direction X. Both ends of the second initial transverse connecting line 65 are connected to the second initial signal lines 32 in the adjacent pixel regions in the first direction X respectively. The second initial transverse connecting line 65 may serve as a connection line between the adjacent pixel regions in the first direction X to implement continuous transmission of second initial signals in the first direction X.

In an exemplary embodiment, the first transverse connecting line 91 may be in the shape of a straight line or a fold line, a primary portion of which extends along the first direction X. Both ends of the first transverse connecting line 91 are connected to the second plates 33 in the adjacent pixel regions in the first direction X respectively. Because a plurality of second plates 33 of the pixel region is connected to each other through the plate connection line 34 and is connected to the first power supply lines, the first transverse connecting line 91 may serve as a connection line between the adjacent pixel regions in the first direction X to implement continuous transmission of the first power supply signals in the first direction X, so as to ensure that the first power supply lines in a plurality of pixel regions in the first direction X have the same potential, to facilitate improvement of the voltage uniformity, thereby avoiding poor display of the display substrate and ensuring the display effect of the display substrate.

(4) A pattern of a fourth insulating layer is formed. In an exemplary embodiment, forming the pattern of the fourth insulating layer may include: depositing a fourth insulating film on the substrate, on which the aforementioned patterns are formed, and patterning the fourth insulating film through the patterning processes to form the fourth insulating layer overlaying the second conductive layer. A plurality of via holes are provided in the fourth insulating layer, as shown in FIG. 14.

In an exemplary embodiment, the plurality of via holes of each circuit unit in the pixel region at least include a first via hole V1, a second via hole V2, a third via hole V3, a fourth via hole V4, a fifth via hole V5, a sixth via hole V6, a seventh via hole V7, an eighth via hole V8, a ninth via hole V9 and a tenth via hole V10.

In an exemplary embodiment, an orthographic projection of the first via hole V1 on the substrate is within the range of the orthographic projection of the opening 35 on the substrate. The fourth insulating layer and the third insulating layer in the first via hole V1 are etched away to expose a surface of the first plate 25. The first via hole V1 is configured such that the second electrode of the first transistor T1 (which is also a first electrode of the second transistor T2), which is formed subsequently, is connected to the first plate 25 through this via hole V1.

In an exemplary embodiment, an orthographic projection of the second via hole V2 on the substrate is within the range of the orthographic projection of the second plate 33 on the substrate. The fourth insulating layer in the second via hole V2 is etched away to expose a surface of the second plate 33. The second via hole V2 is configured such that a first power supply line formed subsequently is connected to the second plate 33 through this via hole V2. In an exemplary embodiment, there may be a plurality of second via holes V2, which may be arranged in sequence along the second direction Y to improve connection reliability.

In an exemplary embodiment, an orthographic projection of the third via hole V3 on the substrate is within the range of an orthographic projection of the first region of the fifth active layer on the substrate. The fourth insulating layer, the third insulating layer and the second insulating layer in the third via hole V3 are etched away to expose a surface of the first region of the fifth active layer. The third via hole V3 is configured such that a first power supply line formed subsequently is connected to the first region of the fifth active layer through this via hole V3.

In an exemplary embodiment, an orthographic projection of the fourth via hole V4 on the substrate is within the range of an orthographic projection of the second region of the sixth active layer (which is also the second region of the seventh active layer) on the substrate. The fourth insulating layer, the third insulating layer and the second insulating layer in the fourth via hole V4 are etched away to expose a surface of the second region of the sixth active layer. The fourth via hole V4 is configured such that a second electrode of the sixth transistor T6 (which is also a second electrode of the seventh transistor T7), which is formed subsequently, is connected to the second region of the sixth active layer through this via hole V4.

In an exemplary embodiment, an orthographic projection of the fifth via hole V5 on the substrate is within the range of an orthographic projection of the first region of the fourth active layer on the substrate. The fourth insulating layer, the third insulating layer and the second insulating layer in the fifth via hole V5 are etched away to expose a surface of the first region of the fourth active layer. The fifth via hole V5 is configured such that a data signal line formed subsequently is connected to the first region of the fourth active layer through this via hole V5.

In an exemplary embodiment, an orthographic projection of the sixth via hole V6 on the substrate is within the range of an orthographic projection of the second region of the first active layer (which is also the first region of the second active layer) on the substrate. The fourth insulating layer, the third insulating layer and the second insulating layer in the sixth via hole V6 are etched away to expose a surface of the second region of the first active layer. The sixth via hole V6 is configured such that the second electrode of the first transistor T1 (which is also the first electrode of the second transistor T2), which is formed subsequently, is connected to the second region of the first active layer through this via hole V6.

In an exemplary embodiment, an orthographic projection of the seventh via hole V7 on the substrate is within the range of an orthographic projection of the first region of the first active layer on the substrate. The fourth insulating layer, the third insulating layer and the second insulating layer in the seventh via hole V7 are etched away to expose a surface of the first region of the first active layer. The seventh via hole V7 is configured such that the first electrode of the first transistor T1, which is formed subsequently, is connected to the first region of the first active layer through this via hole V7.

In an exemplary embodiment, an orthographic projection of the eighth via hole V8 on the substrate is within the range of an orthographic projection of the first initial signal line 31 on the substrate. The fourth insulating layer in the eighth via hole V8 is etched away to expose a surface of the first initial signal line 31. The eighth via hole V8 is configured such that the first electrode of the first transistor T1, which is formed subsequently, is connected to the first initial signal line 31 through this via hole V8.

In an exemplary embodiment, an orthographic projection of the ninth via hole V9 on the substrate is within the range of an orthographic projection of the first region of the seventh active layer on the substrate. The fourth insulating layer, the third insulating layer and the second insulating layer in the ninth via hole V9 are etched away to expose a surface of the first region of the seventh active layer. The ninth via hole V9 is configured such that the first electrode of the seventh transistor T7, which is formed subsequently, is connected to the first region of the seventh active layer through this via hole V9.

In an exemplary embodiment, an orthographic projection of the tenth via hole V10 on the substrate is within the range of an orthographic projection of the second initial signal line 32 on the substrate. The fourth insulating layer in the tenth via hole V10 is etched away to expose a surface of the second initial signal line 32. The tenth via hole V10 is configured such that the first electrode of the seventh transistor T7, which is formed subsequently, is connected to the second initial signal line 32 through this via hole V10.

In an exemplary embodiment, the pixel region may further include an eleventh via hole V11, a twelfth via hole V12, a thirteenth via hole V13 and a fourteenth via hole V14.

In an exemplary embodiment, the eleventh via hole V11 may be located at a side of the first circuit unit Q1 in the pixel region in the opposite direction of the first direction X. An orthographic projection of the eleventh via hole V11 on the substrate is within the range of an orthographic projection of the first scan signal line 21 on the substrate. The fourth insulating layer and the third insulating layer in the eleventh via hole V11 are etched away to expose a surface of the first scan signal line 21. The eleventh via hole V11 is configured such that a scan connection electrode formed subsequently is connected to the first scan signal line 21 through this via hole V11.

In an exemplary embodiment, the twelfth via hole V12 may be located at a side of the first circuit unit Q1 in the pixel region in the opposite direction of the first direction X. An orthographic projection of the twelfth via hole V12 on the substrate is within the range of an orthographic projection of the auxiliary scan signal line 24 on the substrate. The fourth insulating layer and the third insulating layer in the twelfth via hole V12 are etched away to expose a surface of the auxiliary scan signal line 24. The twelfth via hole V12 is configured such that a scan connection electrode formed subsequently is connected to the auxiliary scan signal line 24 through this via hole V12.

In an exemplary embodiment, the thirteenth via hole V13 may be located at a side of the third circuit unit Q3 in the pixel region in the first direction X. An orthographic projection of the thirteenth via hole V13 on the substrate is within the range of the orthographic projection of the first initial signal line 31 on the substrate. The fourth insulating layer in the thirteenth via hole V13 is etched away to expose a surface of the first initial signal line 31. The thirteenth via hole V13 is configured such that a first initial connection line formed subsequently is connected to the first initial signal line 31 through this via hole V13.

In an exemplary embodiment, the fourteenth via hole V14 may be located at a side of the third circuit unit Q3 in the pixel region in the first direction X. An orthographic projection of the fourteenth via hole V14 on the substrate is within the range of the orthographic projection of the second initial signal line 32 on the substrate. The fourth insulating layer in the fourteenth via hole V14 is etched away to expose a surface of the second initial signal line 32. The fourteenth via hole V14 is configured such that a second initial connection line formed subsequently is connected to the second initial signal line 32 through this via hole V14.

In an exemplary embodiment, the blank region may include fifteenth via holes V15. The fifteenth via holes V15 may be respectively located at a side of the first circuit unit Q1 in the pixel region in the opposite direction of the first direction X and located at a side of the third circuit unit Q3 in the pixel region in the first direction X. An orthographic projection of a fifteenth via hole V15 on the substrate is within the range of an orthographic projection of the first transverse connecting line 91 on the substrate. The fourth insulating layer in the fifteenth via hole V15 is etched away to expose a surface of the first transverse connecting line 91. The fifteenth via hole V15 is configured such that a second transverse connecting line formed subsequently is connected to the first transverse connecting line 91 through this via hole V15.

Figure 15A:
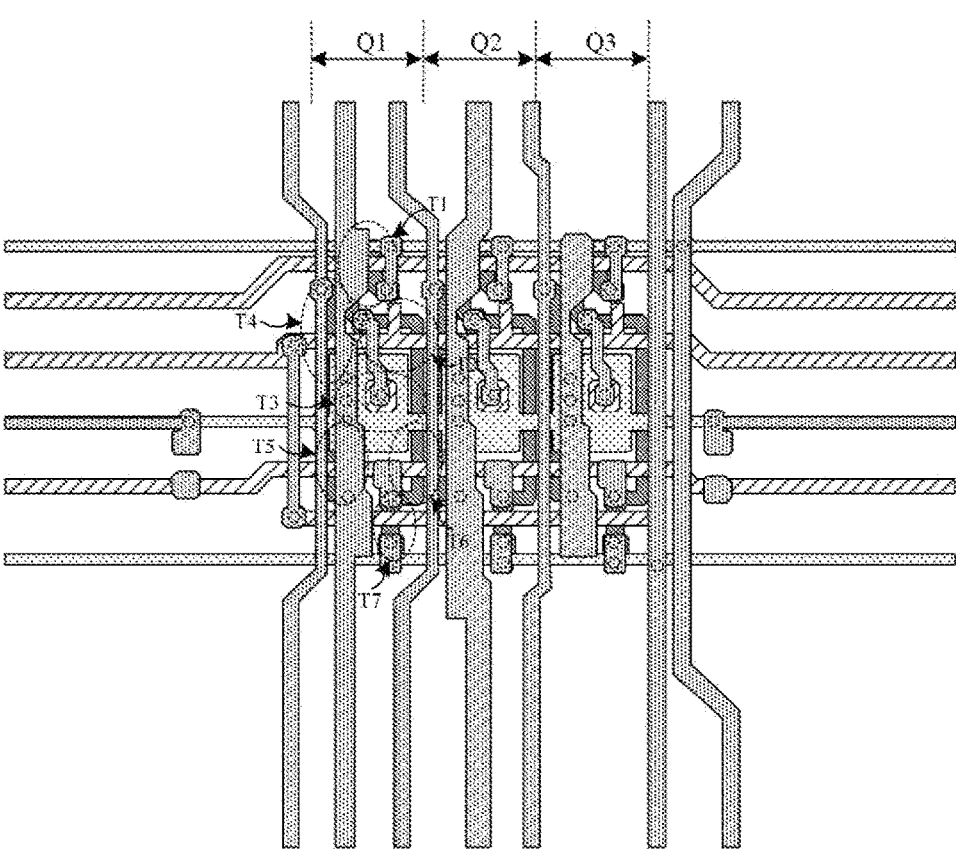
FIGS. 15a and 15b are schematic diagrams after a pattern of a third conductive layer is formed in accordance with an embodiment of the present disclosure.
Figure 15B:
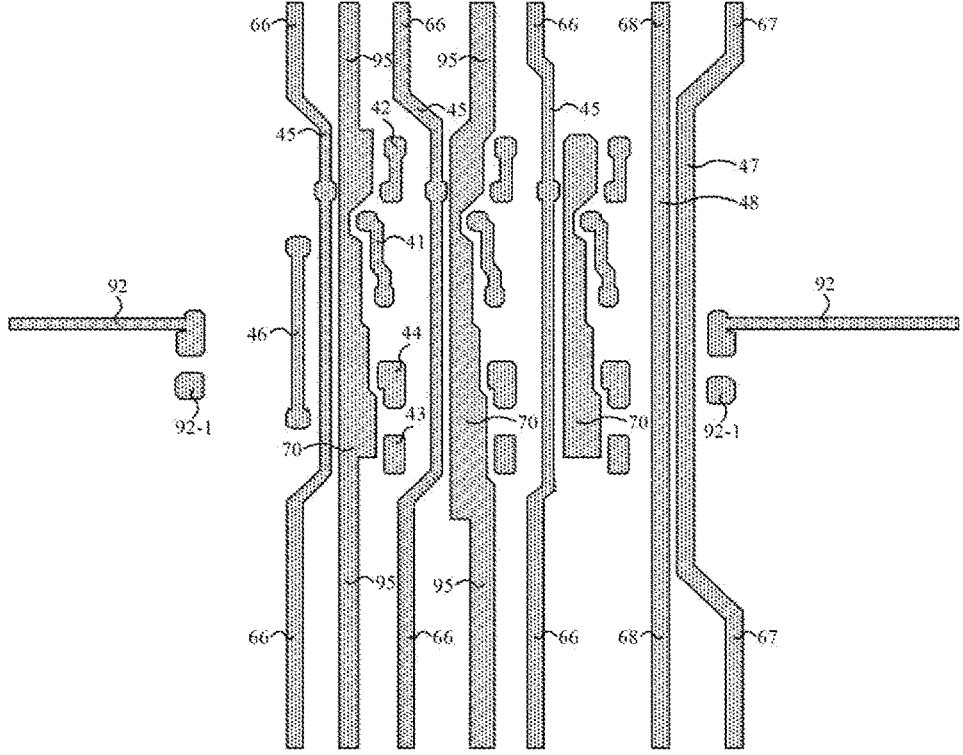

(5) A pattern of a third conductive layer is formed. In an exemplary embodiment, forming the pattern of the third conductive layer include: depositing a third conductive film on the substrate, on which the aforementioned patterns are formed, and patterning the third conductive film through the patterning processes to form the third conductive layer disposed on the fourth insulating layer, as shown in FIGS. 15a and 15b. FIG. 15b is a schematic plan view of the third conductive layer in FIG. 15a. In an exemplary embodiment, the third conductive layer may be referred to as a first source drain metal (SD1) layer.

In an exemplary embodiment, the third conductive layer of each circuit unit in the pixel region at least includes a first connection electrode 41, a second connection electrode 42, a third connection electrode 43, a fourth connection electrode 44, a data signal line 45 and a first power supply line 70.

In an exemplary embodiment, the first connection electrode 41 may be in the shape of a stripe, a primary portion of which extends along the second direction Y. A first end of the first connection electrode 41 is connected to the first plate 25 through the first via hole V1, and a second end of the first connection electrode 41 is connected to the second region of the first active layer (which is also the first region of the second active layer) through the sixth via hole V6, so that the first plate 25, the second region of the first active layer and the first region of the second active layer have the same potential. In an exemplary embodiment, the first connection electrode 41 may serve as both the second electrode of the first transistor T1 and the first electrode of the second transistor T2.

In an exemplary embodiment, the second connection electrode 42 may be in the shape of a stripe, a primary portion of which extends along the second direction Y. A first end of the second connection electrode 42 is connected to the first region of the first active layer through the seventh via hole V7, and a second end of the second connection electrode 42 is connected to the first initial signal line 31 through the eighth via hole V8. In an exemplary embodiment, the second connection electrode 42 may serve as the first electrode of the first transistor T1 to implement writing of the first initial signals to the first transistor T1 by the first initial signal line 31.

In an exemplary embodiment, the third connection electrode 43 may be in the shape of a stripe, a primary portion of which extends along the second direction Y. A first end of the third connection electrode 43 is connected to the first region of the seventh active layer through the ninth via hole V9, and a second end of the third connection electrode 43 is connected to the second initial signal line 32 through the tenth via hole V10. In an exemplary embodiment, the third connection electrode 43 may serve as the first electrode of the seventh transistor T7 to implement writing of the second initial signals to the seventh transistor T7 by the second initial signal line 32.

In an exemplary embodiment, the fourth connection electrode 44 may be in the shape of a polygon. The fourth connection electrode 44 is connected to the second region of the sixth active layer (which is also the second region of the seventh active layer) through the fourth via hole V4. In an exemplary embodiment, the fourth connection electrode 44 may serve as both the second electrode of the sixth transistor T6 and the second electrode of the seventh transistor T7. The fourth connection electrode 44 is configured to be connected to an anode connection electrode formed subsequently.

In an exemplary embodiment, the data signal line 45 may be in the shape of a straight line or a fold line, a primary portion of which extends along the second direction Y. The data signal line 45 is connected to the first region of the fourth active layer through the fifth via hole V5 to implement writing of data signals to the fourth transistor T4.

In an exemplary embodiment, the first power supply line 70 may be in the shape of a straight line or a fold line, a primary portion of which extends along the second direction Y. On the one hand, the first power supply line 70 is connected to the second plate 33 through the second via hole V2. On the other hand, the first power supply line 70 is connected to the first region of the fifth active layer through the third via hole V3 to implement writing of the first power supply signals to the fifth transistor T5, and the second plate 33 and the first electrode of the fifth transistor T5 have the same potential.

In an exemplary embodiment, the third conductive layer of the pixel region may include a scan connection electrode 46, a first initial connection line 47 and a second initial connection line 48.

In an exemplary embodiment, the scan connection electrode 46 may be located at a side of the first circuit unit Q1 in the pixel region in the opposite direction of the first direction X. The scan connection electrode 46 may be in the shape of a straight line or a fold line, a primary portion of which extends along the second direction Y. A first end of the scan connection electrode 46 is connected to the first scan signal line 21 through the eleventh via hole V11, and a second end of the scan connection electrode 46 is connected to the auxiliary scan signal line 24 through the twelfth via hole V12 to implement the connection between the first scan signal line 21 and the auxiliary scan signal line 24, so that the first scan signal line 21 and the auxiliary scan signal line 24 can transmit the same scan signals.

In an exemplary embodiment, the first initial connection line 47 may be located at a side of the third circuit unit Q3 in the pixel region in the first direction X. The first initial connection line 47 may be in the shape of a straight line or a fold line, a primary portion of which extends along the second direction Y. The first initial connection line 47 is connected to the first initial signal line 31 through the thirteenth via hole V13.

In an exemplary embodiment, the second initial connection line 48 may be located at a side of the third circuit unit Q3 in the pixel region in the first direction X. The second initial connection line 48 may be in the shape of a straight line or a fold line, a primary portion of which extends along the second direction Y. The second initial connection line 48 is connected to the second initial signal line 32 through the fourteenth via hole V14.

In an exemplary embodiment, the first initial connection line 47 may be located at a side of the second initial connection line 48 away from the third circuit unit Q3.

In an exemplary embodiment, the third conductive layer of the blank region may include a data signal connecting line 66, a first initial vertical connecting line 67, a second initial vertical connecting line 68, a second transverse connecting line 92, a transverse connection electrode 92-1 and a first vertical connecting line 95.

In an exemplary embodiment, the data signal connecting line 66 may be in the shape of a straight line or a fold line, a primary portion of which extends along the second direction Y. Both ends of the data signal connecting line 66 are connected to the data signal lines 45 in the adjacent pixel regions in the second direction Y respectively. The data signal connecting line 66 may serve as a connection line between the adjacent pixel regions in the second direction Y to implement continuous transmission of the data signals.

In the exemplary embodiment, because the pixel region includes three circuit units, three data signal lines 45 are provided in the pixel region, and three data signal connecting lines 66 are provided in the blank region. The three data signal connecting lines 66 are connected to the three data signal lines 45 correspondingly.

In an exemplary embodiment, the first initial vertical connecting line 67 may be in the shape of a straight line or a fold line, a primary portion of which extends along the second direction Y. Both ends of the first initial vertical connecting line 67 are connected to the first initial connection lines 47 in the adjacent pixel regions in the second direction Y respectively. The first initial vertical connecting line 67 may serve as a connection line between the adjacent pixel regions in the second direction Y to implement continuous transmission of the first initial signals in the second direction Y.

In an exemplary embodiment, the second initial vertical connecting line 68 may be in the shape of a straight line or a fold line, a primary portion of which extends along the second direction Y. Both ends of the second initial vertical connecting line 68 are connected to the second initial connection lines 48 in the adjacent pixel regions in the second direction Y respectively. The second initial vertical connecting line 68 may serve as a connection line between the adjacent pixel regions in the second direction Y to implement continuous transmission of the second initial signals in the second direction Y.

In an exemplary embodiment, the second transverse connecting line 92 may be in the shape of a straight line or a fold line, a primary portion of which extends along the first direction X. An orthographic projection of the second transverse connecting line 92 on the substrate overlaps at least partially with the orthographic projection of the first transverse connecting line 91 on the substrate. Both ends of the second transverse connecting line 92 are connected to both ends of the first transverse connecting line 91 in the first direction X through the fifteenth via holes V15 respectively, to implement continuous transmission of the first power supply signals in the first direction X. Because both the first transverse connecting line 91 and the second transverse connecting line 92 can implement continuous transmission of the first power supply signals, a double-layer wiring by which the first power supply signals are transmitted is formed in the blank region, so as to effectively reduce the resistance of the wiring and effectively decrease the voltage drop of the transmission of the first power supply signals.

In an exemplary embodiment, both ends of the second transverse connecting line 92 may be connected to connection blocks, which are connected to the first transverse connecting line 91 through the fifteenth via holes V15.

In an exemplary embodiment, the transverse connection electrode 92-1 may be in the shape of a rectangle. An orthographic projection of the transverse connection electrode 92-1 on the substrate overlaps at least partially with an orthographic projection of the light emitting control connecting line 63 on the substrate. The transverse connection electrode 92-1 is configured to be connected to a third transverse connecting line formed subsequently.

In an exemplary embodiment, the first vertical connecting line 95 may be in the shape of a straight line or a fold line, a primary portion of which extends along the second direction Y. Both ends of the first vertical connecting line 95 are connected to the first power supply lines 70 in the adjacent pixel regions in the second direction Y respectively. The first vertical connecting line 95 may serve as a connection line between the adjacent pixel regions in the second direction Y to implement continuous transmission of the first power supply signals in the second direction Y.

In an exemplary embodiment, two first vertical connecting lines 95 may be provided in the blank region. Two first power supply lines 70 in the pixel region are connected to the two first vertical connecting lines 95 correspondingly, and another first power supply line 70 is only provided in the pixel region, so as to reduce the quantity of signal lines in the blank region and improve the transmittance of the display substrate on the premise that reliable transmission of signals is ensured.

In an exemplary embodiment, the second plate 33 and the first transverse connecting line 91 of the second conductive layer in the display area may form a wiring by which the first (high-voltage) power supply signals are transmitted in the first direction X, and the first power supply line 70 and the first vertical connecting line 95 of the third conductive layer may form a wiring by which the first power supply signals are transmitted in the second direction Y, therefore a first power supply wiring with a mesh connection structure is formed in the display area, so as to effectively reduce the resistance of the wiring, effectively decrease the voltage drop of in the transmission of the first power supply signals and facilitate improvement of the voltage uniformity, thereby avoiding poor display of the display substrate and ensuring the display effect of the display substrate.

In an exemplary embodiment, the first initial signal line 31 and the first initial transverse connecting line 64 of the second conductive layer in the display area may form a wiring by which the first initial signals are transmitted in the first direction X, and the first initial connection line 47 and the first initial vertical connecting line 67 of the third conductive layer may form a wiring by which the first initial signals are transmitted in the second direction Y, therefore a first initial signal wiring with a mesh connection structure is formed in the display area, so as to effectively reduce the resistance of the wiring, effectively decrease the voltage drop in the transmission of the first initial signals and facilitate improvement of the voltage uniformity, thereby avoiding poor display of the display substrate and ensuring the display effect of the display substrate.

In an exemplary embodiment, the second initial signal line 32 and the second initial transverse connecting line 65 of the second conductive layer in the display area may form a wiring by which the second initial signals are transmitted in the first direction X, and the second initial connection line 48 and the second initial vertical connecting line 68 of the third conductive layer may form a wiring by which the second initial signals are transmitted in the second direction Y, therefore a second initial signal wiring with a mesh connection structure is formed in the display area, so as to effectively reduce the resistance of the wiring, effectively decrease the voltage drop in the transmission of the second initial signals and facilitate improvement of the voltage uniformity, thereby avoiding poor display of the display substrate and ensuring the display effect of the display substrate.

Figure 16:
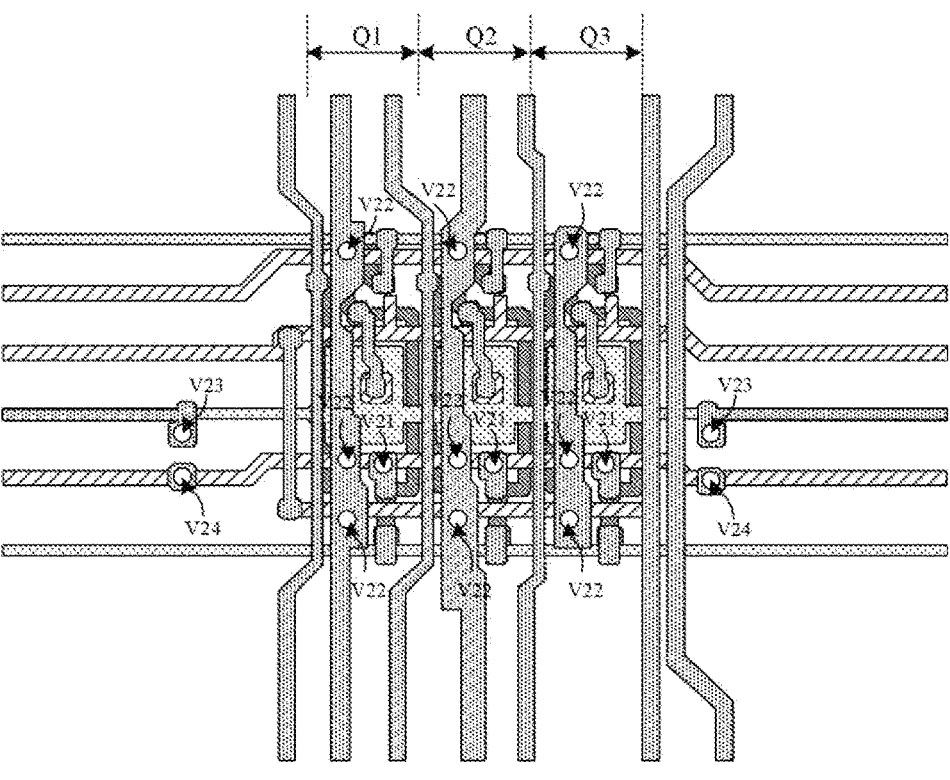
FIG. 16 is a schematic diagram after a pattern of a first planarization layer is formed in accordance with an embodiment of the present disclosure.

(6) A pattern of a first planarization layer is formed. In an exemplary embodiment, forming the pattern of the first planarization layer may include: first depositing a fifth insulating film on the substrate, on which the aforementioned patterns are formed, then coating a planarization film, and patterning the first planarization film and the fifth insulating film through the patterning processes to form a fifth insulating layer overlaying the pattern of the third conductive layer and form the first planarization layer disposed on the fifth insulating layer. A plurality of via holes is provided in the first planarization layer, as shown in FIG. 16.

In an exemplary embodiment, the plurality of via holes of each circuit unit in the pixel region at least include a twenty-first via hole V21 and a twenty-second via hole V22.

In an exemplary embodiment, an orthographic projection of the twenty-first via hole V21 on the substrate is within the range of an orthographic projection of the fourth connection electrode 44 on the substrate. The first planarization layer and the fifth insulating layer in the twenty-first via hole V21 are etched away to expose a surface of the fourth connection electrode 44. The twenty-first via hole V21 is configured such that an anode connection electrode formed subsequently is connected to the fourth connection electrode 44 through this via hole V21.

In an exemplary embodiment, an orthographic projection of the twenty-second via hole V22 on the substrate is within the range of an orthographic projection of the first power supply line 70 on the substrate. The first planarization layer and the fifth insulating layer in the twenty-second via hole V22 are etched away to expose a surface of the first power supply line 70. The twenty-second via hole V22 is configured such that a power supply mesh line formed subsequently is connected to the first power supply line 70 through the twenty-second via hole V22. In an exemplary embodiment, there may be a plurality of second via holes V22, which may be arranged in sequence along the second direction Y to improve connection reliability.

In an exemplary embodiment, the orthographic projection of one of the twenty-second via holes V22 on the substrate overlaps at least partially with an orthographic projection of the second scan signal line 22 on the substrate, the orthographic projection of another one of the twenty-second via holes V22 on the substrate overlaps at least partially with an orthographic projection of the light emitting control signal line 23 on the substrate, and the orthographic projection of still another one of the twenty-second via holes V22 on the substrate overlaps at least partially with the orthographic projection of the auxiliary scan signal line 24 on the substrate.

In an exemplary embodiment, the blank region may include a twenty-third via hole V23 and a twenty-fourth via hole V24. The twenty-third via hole V23 and the twenty-fourth via hole V24 may be located in positions in the blank region close to the pixel region.

In an exemplary embodiment, an orthographic projection of the twenty-third via hole V23 on the substrate is within the range of an orthographic projection of a connection block on the second transverse connecting line 92 on the substrate. The first planarization layer and the fifth insulating layer in the twenty-third via hole V23 are etched away to expose a surfaces of the connection block on the second transverse connecting line 92. The twenty-third via hole V23 is configured such that a third transverse connecting line formed subsequently is connected to the second transverse connecting line 92 through this via hole V23.

In an exemplary embodiment, an orthographic projection of the twenty-fourth via hole V24 on the substrate is within the range of the orthographic projection of the transverse connection electrode 92-1 on the substrate. The first planarization layer and the fifth insulating layer in the twenty-fourth via hole V24 are etched away to expose a surface of the transverse connection electrode 92-1. The twenty-fourth via hole V24 is configured such that a third transverse connecting line formed subsequently is connected to the transverse connection electrode 92-1 through this via hole V24.

Figure 17A:
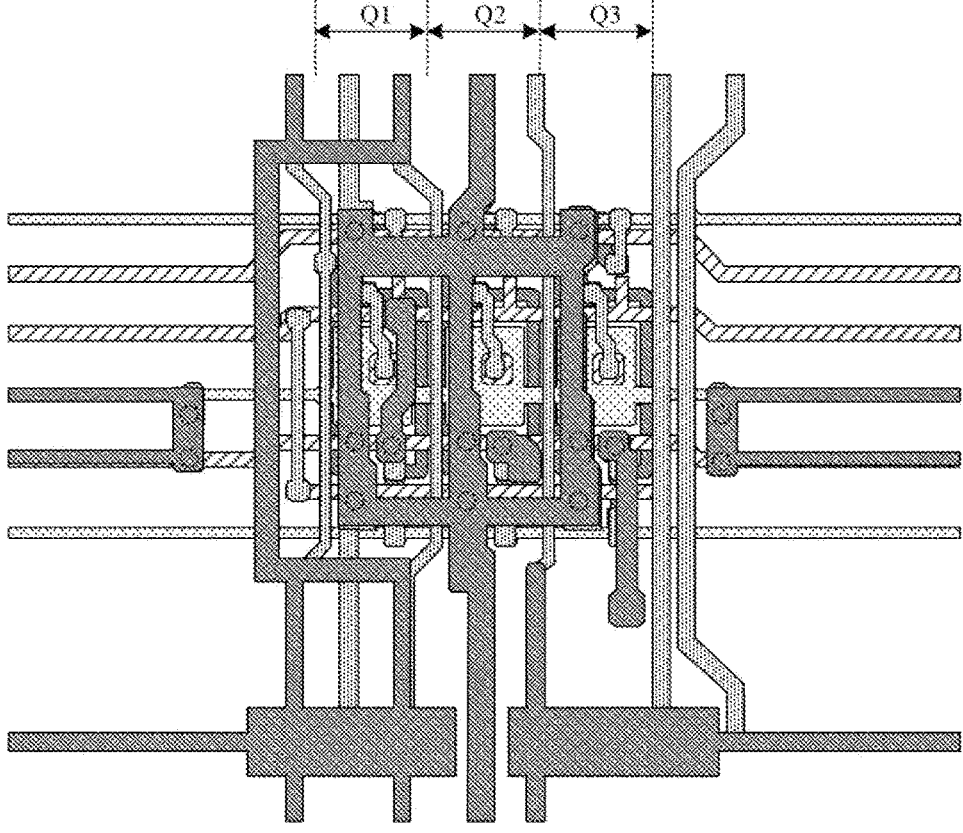
FIGS. 17a to 17d are schematic diagrams after a pattern of a fourth conductive layer is formed in accordance with an embodiment of the present disclosure.
Figure 17B:
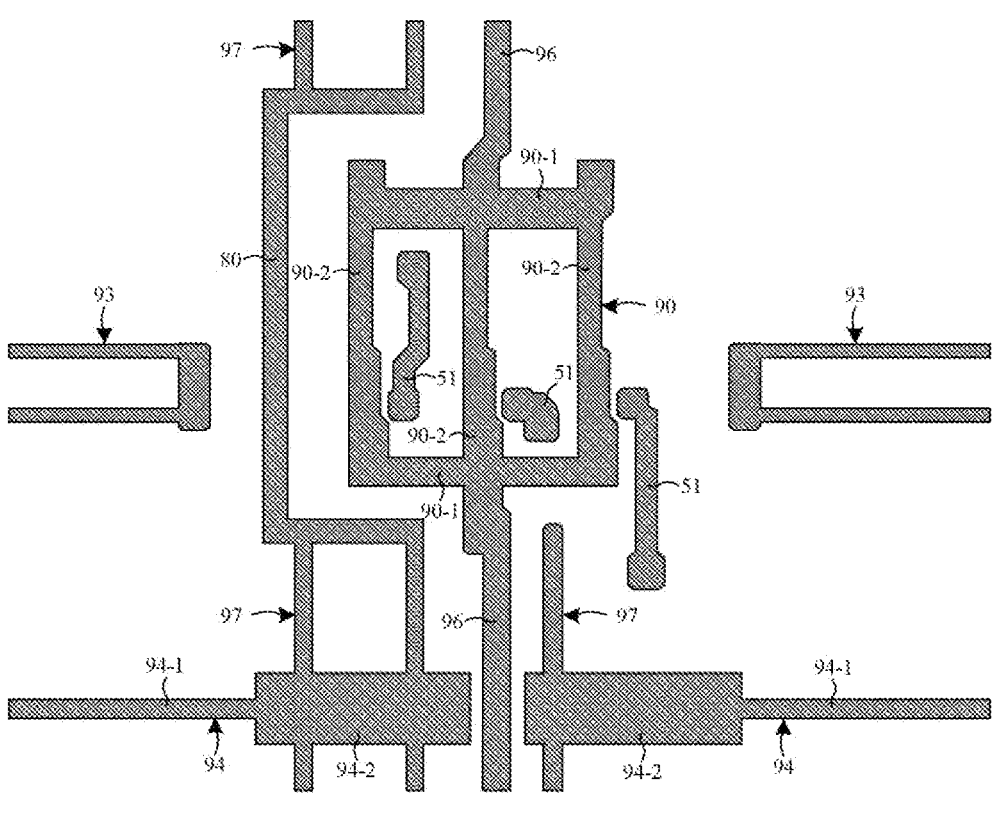
Figure 17C:
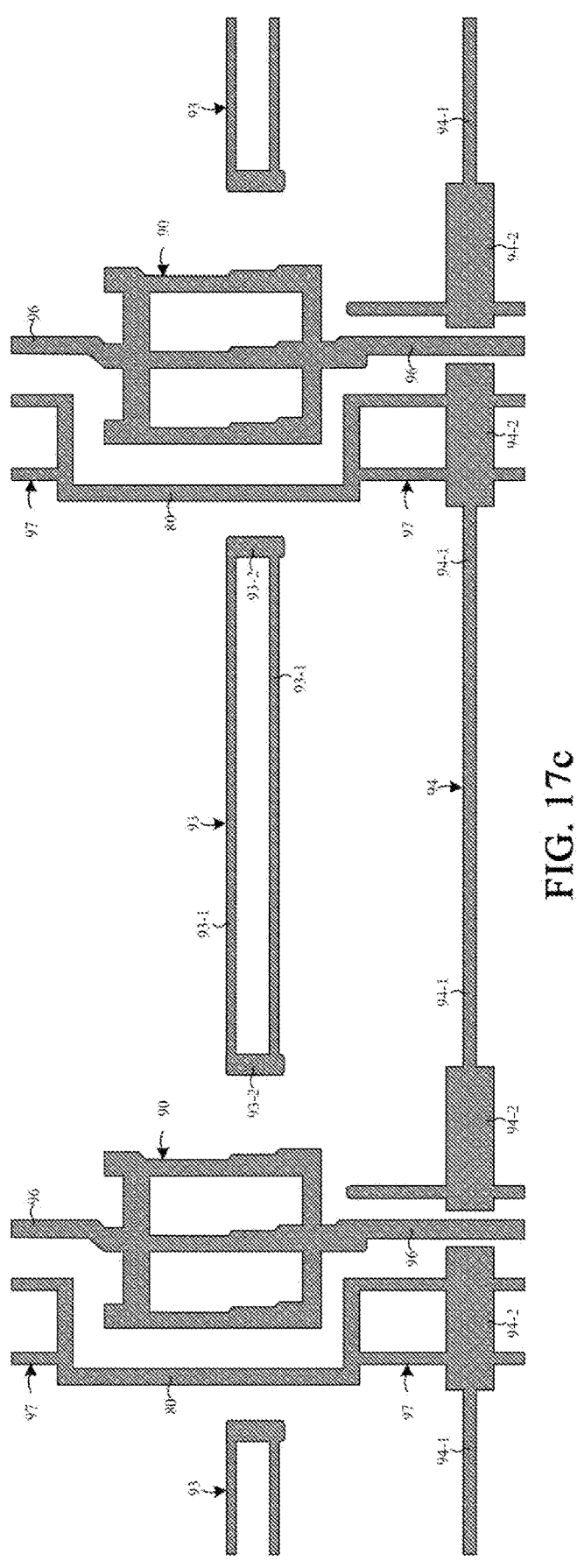
Figure 17D:
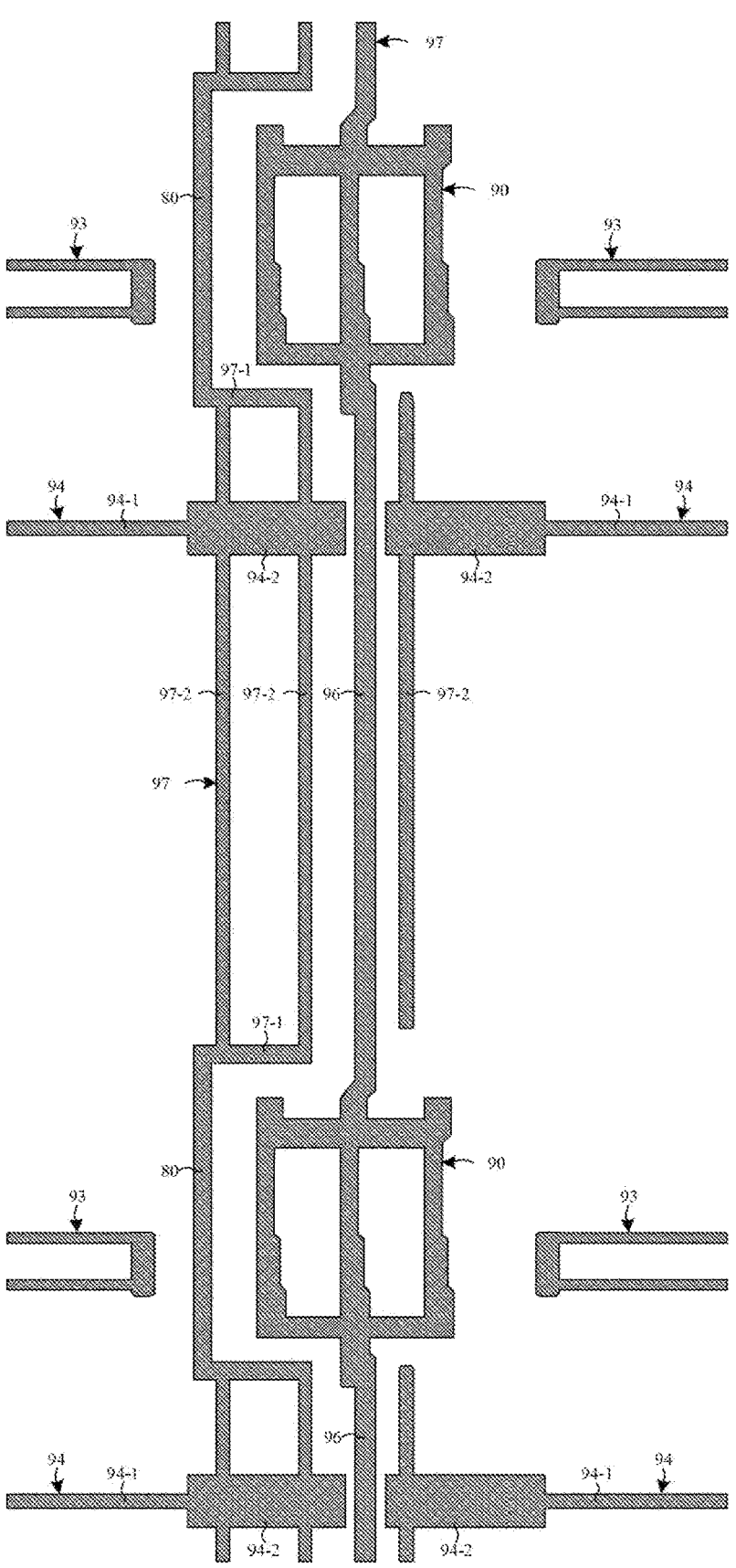

(7) A patter of a fourth conductive layer is formed. In an exemplary embodiment, forming the fourth conductive layer may include: depositing a fourth conductive film on the substrate, on which the aforementioned patterns are formed, and patterning the fourth conductive film through the patterning processes to form the fourth conductive layer disposed on the first planarization layer, as shown in FIGS. 17*a* to 17*d*. FIG. 17*b* is a schematic plan view of the fourth conductive layer in FIG. 17*a*, FIG. 17*c* is a schematic plan view of the fourth conductive layer of two adjacent pixel regions in the first direction X, and FIG. 17*d* is a schematic plan view of the fourth conductive layer of two adjacent pixel regions in the second direction Y. In an exemplary embodiment, the fourth conductive layer may be referred to as a second source drain metal (SD2) layer.

In an exemplary embodiment, the fourth conductive layer of each circuit unit in the pixel region at least includes an anode connection electrode 51. The shapes of the anode connection electrodes 51 of the three circuit units in the pixel region may be different to accommodate the positions of anodes formed subsequently.

In an exemplary embodiment, the anode connection electrode 51 of the first circuit unit Q1 may be in the shape of a strip, a primary portion of which extends along the second direction Y. A first end of the anode connection electrode 51 of the first circuit unit Q1 is connected to a fourth connection electrode 54 of the first circuit unit Q1 through the twenty-first via hole V21, and a second end of the anode connection electrode 51 of the first circuit unit Q1 extends along the opposite direction of the second direction Y.

In an exemplary embodiment, the anode connection electrode 51 of the second circuit unit Q2 may be in the shape of a polygon. The anode connection electrode 51 of the second circuit unit Q2 is connected to a fourth connection electrode 54 of the second circuit unit Q2 through the twenty-first via hole V21.

In an exemplary embodiment, the anode connection electrode 51 of the third circuit unit Q3 may be in the shape of a strip, a primary portion of which extends along the second direction Y. A first end of the anode connection electrode 51 of the third circuit unit Q3 is connected to a fourth connection electrode 54 of the third circuit unit Q3 through the twenty-first via hole V21, and a second end of the anode connection electrode 51 of the third circuit unit Q3 extends along the second direction Y.

In an exemplary embodiment, Because the fourth connection electrode 54 of each circuit unit is connected to the second region of the sixth active layer (which is also the second region of the seventh active layer) through the via hole, connections between anodes formed subsequently and the second electrode of the sixth transistor T6 and the second electrode of the seventh transistor T7 can be implemented.

In an exemplary embodiment, the fourth conductive layer of the pixel region may further include a second power supply line 80 and a high-voltage mesh line 90.

In an exemplary embodiment, the second power supply line 80 may be in the shape of a straight line or a fold line, a primary portion of which extends along the second direction Y. The second power supply line 80 may be located at a side of the first circuit unit Q1 in the pixel region in the opposite direction of the first direction X.

In an exemplary embodiment, the high-voltage mesh line 90 may in the shape of a mesh. The high-voltage mesh line 90 is connected to the first power supply lines 70 in the three circuit units through a plurality of twenty-second via holes V22, so that the first power supply line 70 on the third conductive layer and the high-voltage mesh line 90 on the fourth conductive layer form a double-layer wiring in the pixel region, by the double-layer wiring, the first power supply signals are transmitted.

In an exemplary embodiment, the high-voltage mesh line 90 may include at least two first mesh lines 90-1 and at least three second mesh lines 90-2. The first mesh lines 90-1 may be in the shape of a straight line or a fold line, a primary portion of which extends along the first direction X. The second mesh lines 90-2 may be in the shape of a straight line or a fold line, a primary portion of which extends along the second direction Y. One of the first mesh lines 90-1 is connected to first ends of the plurality of second mesh lines 90-2 respectively, and the other one of the first mesh lines 90-1 is connected to second ends of the plurality of second mesh lines 90-2 respectively, to form a mesh-shaped high-voltage mesh line 90.

In an exemplary embodiment, the at least three second mesh lines 90-2 may be disposed in the three circuit units respectively. An orthographic projection of a second mesh line 90-2 on the substrate overlaps at least partially with the orthographic projection of the first power supply line 70 in the circuit unit, in which the second mesh line 90-2 is located, on the substrate, and the second mesh line 90-2 is connected to the first power supply line 70 of the circuit unit, in which the second mesh line 90-2 is located, through a plurality of twenty-second via holes V22.

In an exemplary embodiment, the at least two first mesh lines 90-1 and the at least three second mesh lines 90-2 in each pixel region may be connected to each other to form an integrated structure, to form a mesh wiring in the pixel region, by the mesh wiring, the first power supply signals are transmitted, so as to effectively reduce the resistance of the wiring, decrease the voltage drop in the transmission of the first power supply signals, and facilitate improvement of the voltage uniformity, thereby avoiding poor display of the display substrate and ensuring the display effect of the display substrate.

In an exemplary embodiment, the blank region may include a third transverse connecting line 93, a fourth transverse connecting line 94, a second vertical connecting line 96 and a third vertical connecting line 97.

In an exemplary embodiment, the third transverse connecting line 93 may in the shape of a mesh extending along the first direction X. Both ends of the third transverse connecting line 93 in the first direction X are connected to both ends of the second transverse connecting line 92 in the first direction X through the via holes respectively. The third transverse connecting line 93 may serve as a connection line between the adjacent pixel regions in the first direction X to implement continuous transmission of the first power supply signals in the first direction X.

In an exemplary embodiment, the third transverse connecting line 93 may include at least two first sub-lines 93-1 and at least two second sub-lines 93-2. The first sub-lines 93-1 may be in the shape of a straight line or a fold line, a primary portion of which extends along the first direction X, and the second sub-lines 93-2 may be in the shape of a strip, a primary portion of which extends along the second direction Y. The at least two second sub-lines 93-2 are connected to both ends of the at least two first sub-lines 93-1 respectively, to form a mesh in the shape of a rectangular ring in the blank region.

In an exemplary embodiment, the at least two first sub-lines 93-1 and the at least two second sub-lines 93-2 may be connected to each other to form an integrated structure.

In the exemplary embodiment, on the one hand, the second sub-line 93-2 is connected to the second transverse connecting line 92 through the twenty-third via hole V23. On the other hand, the second sub-line 93-2 is connected to the transverse connection electrode 92-1 through the twenty-fourth via hole V24. Because the third transverse connecting line 93 is connected to the second transverse connecting line 92 through the via hole, the second transverse connecting line 92 is connected to the first transverse connecting line 91 through the via hole, and the first transverse connecting line 91 is connected to the first power supply line 70, a wiring of a three-layer structure, by which the first power supply signals are transmitted, is formed in the blank region, so as to reduce the resistance of the wiring to the greatest extent, decrease the voltage drop in the transmission of the first power supply signals, and facilitate improvement of the voltage uniformity, thereby avoiding poor display of the display substrate and ensuring the display effect of the display substrate.

In an exemplary embodiment, an orthographic projection of one of the first sub-lines 93-1 on the substrate overlaps at least partially with the orthographic projection of the second transverse connecting line 92 on the substrate, and an orthographic projection of the other one of the first sub-lines 93-1 on the substrate overlaps at least partially with the orthographic projection of the light emitting control connecting line 63 on the substrate. The signal lines is configured to be overlapped, so as to effectively improve the transparency of the display substrate.

In an exemplary embodiment, the second vertical connecting line 96 may be in the shape of a straight line or a fold line, a primary portion of which extends along the second direction Y. Both ends of the second vertical connecting line 96 are connected to high-voltage mesh lines 90 in the adjacent pixel regions in the second direction Y respectively. The second vertical connecting line 96 may serve as a connection line between the adjacent pixel regions in the second direction Y to implement continuous transmission of the first power supply signals in the second direction Y.

In an exemplary embodiment, because the first vertical connecting line 95 is connected to the first power supply line 70, the high-voltage mesh line 90 is connected to the first power supply line 70, and the second vertical connecting line 96 is connected to the high-voltage mesh line 90, the first vertical connecting line 95 located on the third conductive layer and the second vertical connecting line 96 located on the fourth conductive layer form a double-layer wiring in the blank region, by the double-layer wiring, the first power supply signals are transmitted, so as to effectively reduce the resistance of the wiring, decrease the voltage drop in the transmission of the first power supply signals, and facilitate improvement of the voltage uniformity, thereby avoiding poor display of the display substrate and ensuring the display effect of the display substrate.

In an exemplary embodiment, one second vertical connecting line 96 may be provided in the blank region. An orthographic projection of the second vertical connecting line 96 on the substrate overlaps at least partially with an orthographic projection of one first vertical connecting line 95 on the substrate. The quantity of vertical connecting lines may be reduced and the vertical connecting lines may be configured to be overlapped, so as to effectively improve the transparency of the blank region.

In an exemplary embodiment, the third vertical connecting line 97 may be in the shape of a mesh extending along the second direction Y. The third vertical connecting line 97 is connected to the second power supply lines 80 in the adjacent pixel regions in the second direction Y. The third vertical connecting line 97 may serve as a connection line between the adjacent pixel regions in the second direction Y to implement continuous transmission of the second power supply signals in the second direction Y.

In an exemplary embodiment, the third vertical connecting line 97 may include at least two third connection blocks 97-1 and at least three third sub-lines 97-2. The third connection blocks 97-1 may be in the shape of a strip extending along the first direction X, or the third connection blocks 97-1 may be in the shape of a straight line or a fold line extending along the second direction Y. The at least two third connection blocks 97-1 and at least two of the third sub-lines 97-2 may be disposed at a side of the second vertical connecting line 96 in the first direction X, and at least one of the third sub-lines 97-2 may be disposed at the other side of the second vertical connecting line 96 in the first direction X.

In an exemplary embodiment, the two third connection blocks 97-1 located at the same side of the second vertical connecting line 96 are disposed at the ends of the at least two of the third sub-lines 97-2 in the second direction Y, and are connected to the at least two of the third sub-lines 97-2 respectively, to form a mesh in the shape of a rectangular ring in the blank region.

In an exemplary embodiment, the two third connection blocks 97-1 are connected to the second power supply lines 80 in the adjacent pixel regions in the second direction Y respectively, to implement the connections between the third vertical connecting line 97 and the second power supply lines 80.

In an exemplary embodiment, the at least two third connection blocks 97-1 and the at least two of the third sub-lines 97-2 may be connected to each other to form an integrated structure.

In an exemplary embodiment, an orthographic projection of a third sub-line 97-2 on the substrate overlaps at least partially with an orthographic projection of the data signal connecting line 66 on the substrate, to take effect in shielding on the one hand, and effectively improve the transparency of the blank region on the other hand.

In an exemplary embodiment, a plurality of fourth transverse connecting lines 94 may be arranged at intervals along the first direction X. The fourth transverse connecting lines 94 may be in the shape of a straight line or a fold line, which extends along the first direction X. Each of the fourth transverse connecting lines 94 may be arranged between the adjacent second vertical connecting lines 96 in the first direction X and connected to the third sub-lines 97-2 of the third vertical connecting line 97.

In an exemplary embodiment, the fourth transverse connecting line 94 may include a fourth sub-line 94-1 and at least two fourth connection blocks 94-2. The fourth sub-line 94-1 may be in the shape of a straight line or a fold line, which extends along the first direction X, and the fourth connection blocks 94-2 may be in the shape of a strip extending along the first direction X. The at least two fourth connection blocks 94-2 may be connected to both ends of the fourth sub-line 94-1 respectively. The fourth connection blocks 94-2 located at a side of the second vertical connecting line 96 is connected to two of the third sub-lines 97-2, the fourth connection blocks 94-2 located at the other side of the second vertical connecting line 96 is connected to one of the third sub-lines 97-2. There is no overlap between an orthographic projection of a fourth connection block 94-2 on the substrate and the orthographic projection of the second vertical connecting line 96 on the substrate. The fourth connection block 94-2 is configured to be connected to a cathode connection electrode formed subsequently, so that the fourth transverse connecting lines 94 located at both sides of the second vertical connecting line 96 are connected to each other through the cathode connection electrode 110. The fourth transverse connecting lines 94 and the cathode connection electrode implement continuous transmission of the second power supply signals in the first direction X.

In an exemplary embodiment, the fourth sub-line 94-1 and the at least two fourth connection blocks 94-2 may be connected to each other to form an integrated structure.

In an exemplary embodiment, the second transverse connecting lines 94 and the cathode connection electrode may implement continuous transmission of the second power supply signals in the first direction X, and the second power supply line 80 and the third vertical connecting line 97 may implement continuous transmission of the second power supply signals in the second direction Y. Because the second transverse connecting lines 94 and the third vertical connecting line 97 are connected to each other, a wiring with a mesh connection structure, by which the second power supply signals are transmitted, is formed in the display area, so as to reduce the resistance of the wiring effectively, decrease the voltage drop in the transmission of the second power supply signals, and facilitate improvement of the voltage uniformity, thereby avoiding poor display of the display substrate and ensuring the display effect of the display substrate.

Figure 18:
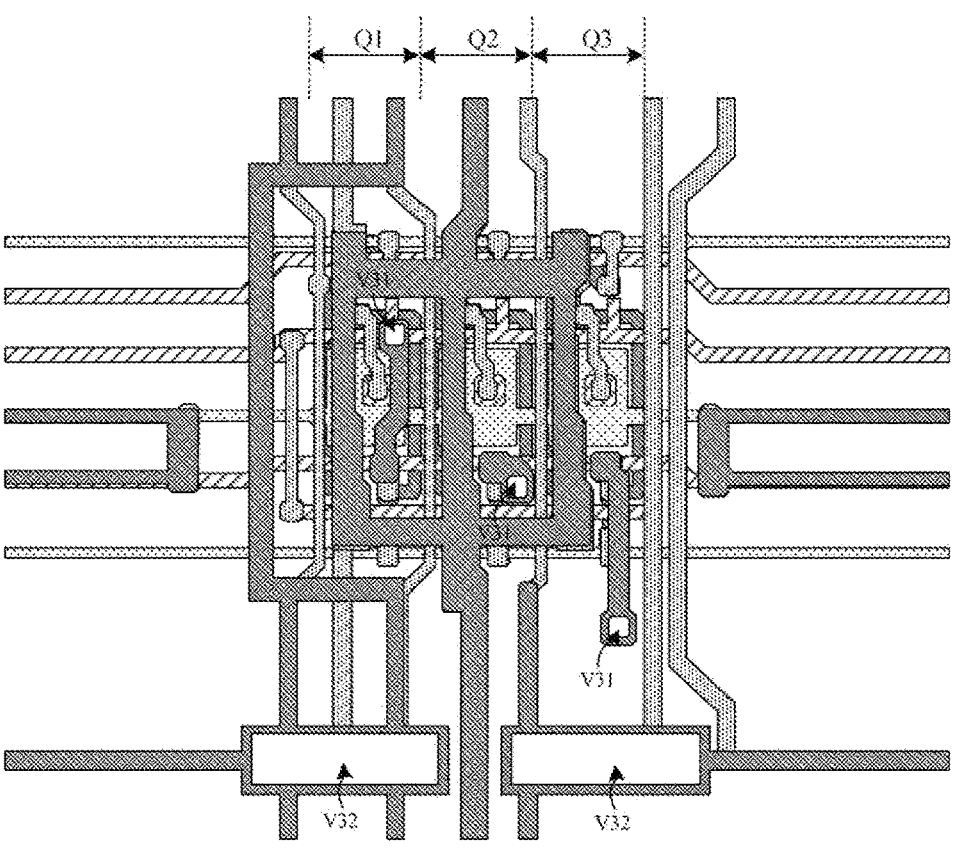
FIG. 18 is a schematic diagram after a pattern of a second planarization layer is formed in accordance with an embodiment of the present disclosure.

(8) A pattern of a second planarization layer is formed. In an exemplary embodiment, forming the pattern of the second planarization layer may include: coating a second planarization film on the substrate, on which the aforementioned patterns are formed, and patterning the second planarization film through the patterning processes to form the second planarization layer overlaying the pattern of the fourth conductive layer. A plurality of via holes is provided in the second planarization layer, as shown in FIG. 18.

In an exemplary embodiment, the via hole of each circuit unit in the pixel region at least includes a thirty-first via hole V31. An orthographic projection of the thirty-first via hole V31 on the substrate is within the range of an orthographic projection of the anode connection electrode 51 on the substrate. The second planarization layer in the thirty-first via hole V31 is removed to expose a surface of the anode connection electrode 51. The thirty-first via hole V31 is configured such that an anode formed subsequently is connected to the anode connection electrode 51 through this via hole V31.

In an exemplary embodiment, the positions of the thirty-first via holes V31 of the three circuit units in the pixel region may be different to accommodate the positions of the anodes formed subsequently.

In an exemplary embodiment, the blank region includes a thirty-second via hole V32. An orthographic projection of the thirty-second via hole V32 on the substrate is within the range of the orthographic projection of the fourth connection block 94-2 on the substrate. The second planarization layer in the thirty-second via hole V32 is removed to expose a surface of the fourth connection block 94-2. The thirty-second via hole V32 is configured such that an anode connection electrode formed subsequently is connected to the fourth connection block 94-2 through this via hole V32.

So far, a driving circuit layer has been manufactured on the substrate. In a plane parallel to the display substrate, the driving circuit layer may include a plurality of pixel regions. At least one pixel region may include three circuit units, each of which may include a pixel driving circuit. The pixel driving circuit is connected to a first scan signal line, a second scan signal line, a light emitting control signal line, a first initial signal line, a second initial signal line, a data signal line and a first power supply line respectively. In a plane perpendicular to the display substrate, the driving circuit layer in the pixel regions may include a first insulating layer, a semiconductor layer, a second insulating layer, a first conductive layer, a third insulating layer, a second conductive layer, a fourth insulating layer, a third conductive layer, a fifth insulating layer, a first planarization layer, a fourth conductive layer and the second planarization layer which are disposed sequentially on the substrate. The semiconductor layer may at least include active layers of a first transistor through a seventh transistor, the first conductive layer may at least include gate electrodes of the first transistor through the seventh transistor and a first plate of a storage capacitor, the second conductive layer may at least include a first initial signal line, a second initial signal line and a second plate of the storage capacitor, the third conductive layer may at least include a first power supply line, a data signal line and first electrodes and second electrodes of a plurality of transistors, and the fourth conductive layer may at least include an anodic connection electrode and a second power supply line.

In an exemplary embodiment, the substrate may be a flexible substrate or a rigid substrate. The rigid substrate may be may be made of, but be not limited to, one or more of glass and quartz. The flexible substrate may be made of, but be not limited to, one or more of polyethylene terephthalate, ethylene terephthalate, polyether ether ketone, polystyrene, polycarbonate, polyarylate, polyarylester, polyimide, polyvinyl chloride, polyethylene and textile fibers. The first conductive layer, the second conductive layer, the third conductive layer and the fourth conductive layer may be made of metal materials, such as any one or more of silver (Ag), copper (Cu), aluminum (Al), titanium (Ti) and molybdenum (Mo), or an alloy material of the aforementioned metals, such as aluminum neodymium alloy (AlNd) or molybdenum niobium alloy (MoNb), and may be single-layered structures or multi-layered composite structures, such as Mo/Cu/Mo, etc. The first insulating layer, the second insulating layer, the third insulating layer, the fourth insulating layer and the fifth insulating layer may be made of any one or more of silicon oxide (SiOx), silicon nitride (SiNx) and silicon oxynitride (SiON), and may be single-layers, multi-layers or composite layers. The first insulating layer may be referred to as a buffer layer, the second insulating layer and the third insulating layer may be referred to as gate insulation (GI) layers, the fourth insulating layer may be referred to as an interlayer dielectric (ILD) layer, and the fifth insulating layer may be referred to as a passivation (PVX) layer. The first planarization layer and the second planarization layer may be made of organic materials, such as resin. The semiconductor layer may be made of a material, such as amorphous indium gallium zinc oxide (a-IGZO), zinc oxynitride (ZnON), indium zinc tin oxide (IZTO), amorphous silicon (a-Si), polycrystalline silicon (p-Si), sexithiophene and polythiophene, that is, the present disclosure is applicable to transistors manufactured based on oxide technology, silicon technology and organic matter technology.

Figure 19:
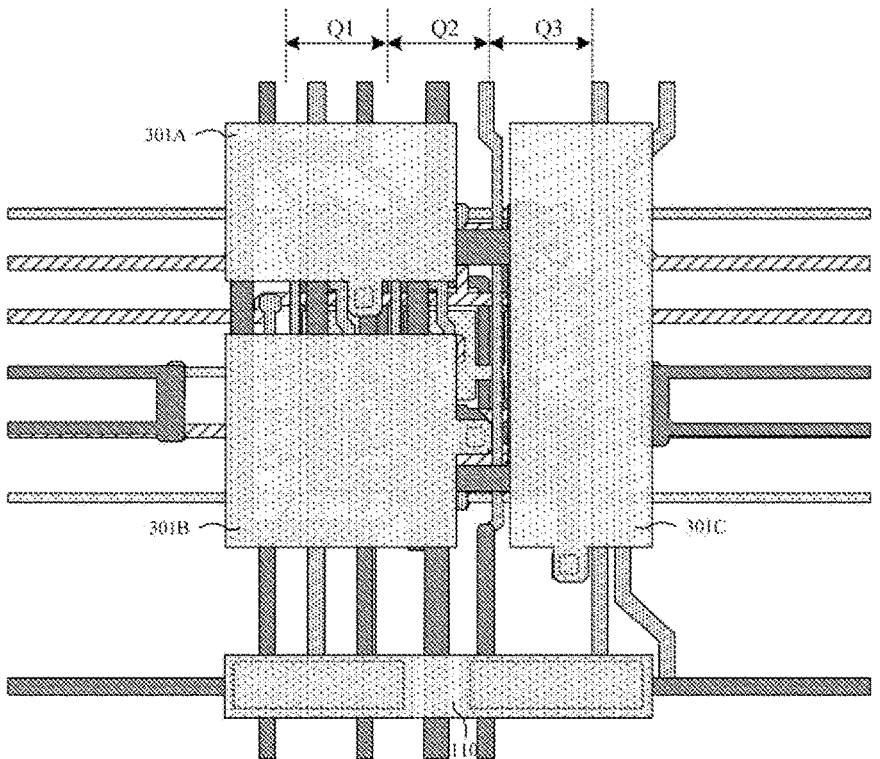
FIG. 19 is a schematic diagram after a pattern of an anode conductive layer is formed in accordance with an embodiment of the present disclosure.

In an exemplary embodiment, after the driver circuit layer has been manufactured, a light emitting structure layer is manufactured on the driver circuit layer. The manufacturing process of the light emitting structure layer may include the following operations:

(9) A pattern of an anode conductive layer is formed. In an exemplary embodiment, forming the pattern of the anode conductive layer may include: depositing an anode conductive film on the substrate, on which the aforementioned patterns are formed, and patterning the anode conductive film through the patterning processes to form the anode conductive layer disposed on the second planarization layer, as shown in FIG. 19.

In an exemplary embodiment, the anode conductive layer in the pixel region may at least include a first anode 301A, a second anode 301B and a third anode 301C.

In an exemplary embodiment, the first anode 301A may be an anode of a red light emitting device, the second anode 301B may be an anode of a blue light emitting device, and the third anode 301C may be an anode of a green light emitting device. The first anode 301A may form a red sub-pixel emitting red light, the second anode 301B may form a blue sub-pixel emitting blue light, and the third anode 301C may form a green sub-pixel emitting green light.

In an exemplary embodiment, the first anode 301A and the second anode 301B may be arranged in sequence along the second direction Y, the third anode 301C may be disposed at one side of the first anode 301A and the second anode 301B in the first direction X. The shapes and areas of the three anodes in one pixel region may be the same or different.

In an exemplary embodiment, the positions of the first anode 301A, the second anode 301B and the third anode 301C do not correspond to the positions of the first circuit unit Q1, the second circuit unit Q2 and the third circuit unit Q3. An orthographic projection of the first anode 301A on the substrate overlaps at least partially with an orthographic projection of the pixel driving circuit in the first circuit unit Q1 or the second circuit unit Q2 on the substrate, and an orthographic projection of the third anode 301C on the substrate overlaps at least partially with an orthographic projection of the pixel driving circuit in the third circuit unit Q3 on the substrate.

In an exemplary embodiment, the first anode 301A, the second anode 301B and the third anode 301C each include an anode body part and an anode connection part. The anode body part may be in the shape of a rectangle, angles of which may be configured to be arc-shaped chamfer, and the anode connection part may be in the shape of a strip. A first end of the anode connection part is connected to the anode body part, and a second end of the anode connection part extends towards a direction away from the anode body part. The anode connection part is connected to the anode connection electrode 51 of the circuit unit, in which the anode connection part is located, through the thirty-first via hole V31.

In an exemplary embodiment, the anode conductive layer in the blank region may at least include a cathode connection electrode 110.

In an exemplary embodiment, the cathode connection electrode 110 may be in the shape of a strip extending along the first direction X, an orthographic projection of the cathode connection electrode 110 on the substrate overlaps at least partially with orthographic projections of the two fourth connection blocks 94-2, located at both sides of the second vertical connecting line 96, on the substrate. The cathode connection electrode 110 is connected to the two fourth connection blocks 94-2 through two thirty-second via holes V32, respectively, such that the connection between the two fourth connection blocks 94-2 are implemented through the cathode connection electrode 110. Thus, the adjacent fourth transverse connecting lines 94 in the first direction X are connected to each other through the cathode connection electrode 110, so that the fourth transverse connecting lines 94 and the cathode connection electrode 110 implement continuous transmission of the second power supply signals in the first direction X.

In an exemplary embodiment, the cathode connection electrode 110 is configured to be connected to a cathode subsequently formed, to provide the second power supply signals for the cathode of each pixel region.

In the present disclosure, the cathode connection electrode is provided in the display area, such that the cathode can be connected to the second power supply line through the cathode connection electrode, so as to effectively alleviate the voltage drop (IR Drop) of the large-size transparent display, thereby ensuring the display uniformity. In the present disclosure, the cathode connection electrode is provided in the blank region, so as to not only simplify the structure layout of the pixel region, reduce the occupied space of the pixel region, improve the area ratio of the transparent region and improve the resolution and transparency, but also weaken the diffraction effect using the cathode connecting electrode, thereby avoiding a blurring phenomenon of an object behind a screen and improving the transparent display effect.

In an exemplary embodiment, the anode conductive layer may be a single-layer structure, such as indium tin oxide (ITO) or indium zinc oxide (IZO), or may be a multi-layer composite structure, such as ITO/Ag/ITO.

Figure 20:
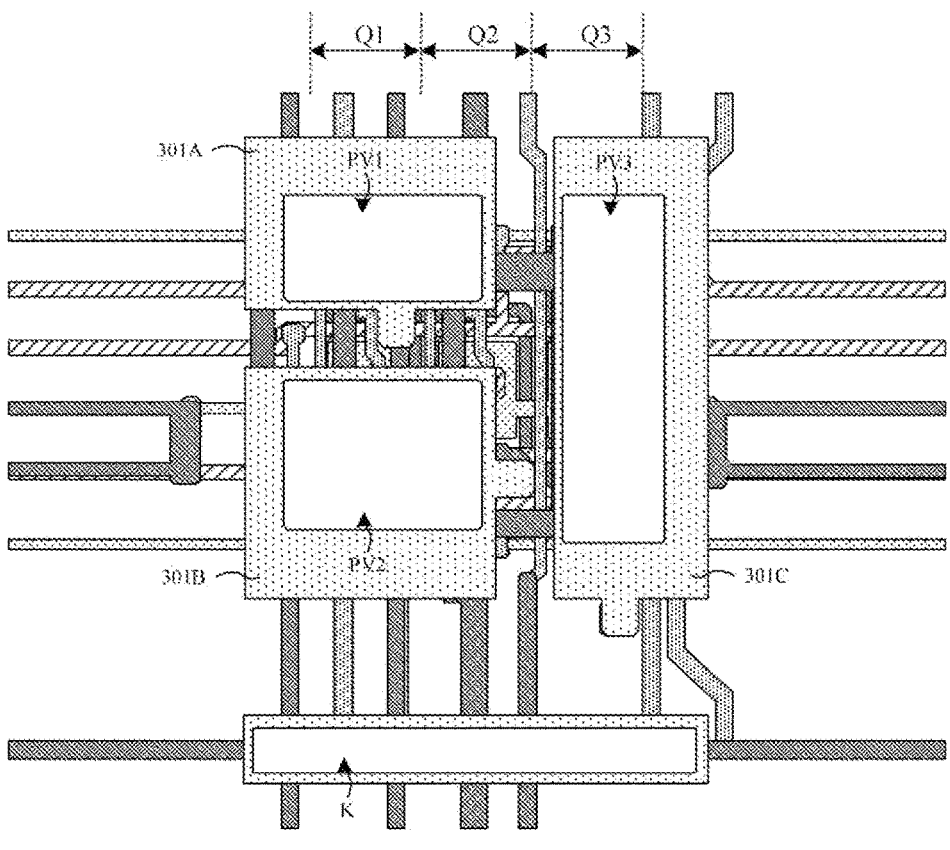
FIG. 20 is a schematic diagram after a pattern of a pixel definition layer is formed in accordance with an embodiment of the present disclosure.

(10) A pattern of a pixel definition layer is formed. In an exemplary embodiment, forming the pattern of the pixel definition layer may include: coating a pixel definition film on the substrate, on which the aforementioned patterns are formed, and patterning the pixel definition film through the patterning processes to form the pattern of the pixel definition layer, as shown in FIG. 20.

In an exemplary embodiment, the pattern of the pixel definition layer in the pixel region may at least include a first pixel opening PV1, a second pixel opening PV2, a third pixel opening PV3 and a cathode electrode opening K.

In an exemplary embodiment, an orthographic projection of the first pixel opening PV1 on the substrate may be within the range of the orthographic projection of the first anode 301A on the substrate, and the pixel defining film in the first pixel opening PV1 is removed to expose a surface of the first anode 301A. An orthographic projection of the second pixel opening PV2 on the substrate may be within the range of an orthographic projection of the second anode 301B on the substrate, and the pixel defining film in the second pixel opening PV2 is removed to expose a surface of the second anode 301B. An orthographic projection of the third pixel opening PV3 on the substrate may be within the range of the orthographic projection of the third anode 301C on the substrate, and the pixel defining film in the third pixel opening PV3 is removed to expose a surface of the third anode 301C.

In an exemplary embodiment, an orthographic projection of the cathode electrode opening K on the substrate overlaps at least partially with the orthographic projection of the cathode connection electrode 110 on the substrate, and the pixel defining film in the cathode electrode opening K is removed to expose a surface of the cathode connection electrode 110. The cathode electrode opening K is configured such that a cathode subsequently formed is connected to the cathode connection electrode 110 through this opening K.

Figure 21:
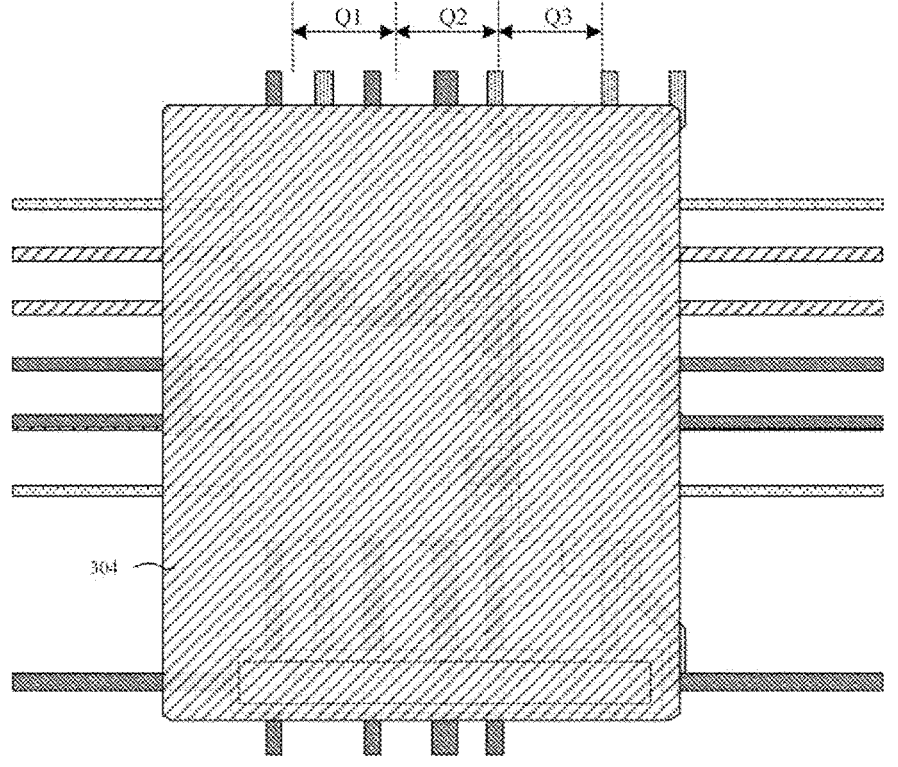
FIG. 21 is a schematic diagram after a pattern of a cathode is formed in accordance with an embodiment of the present disclosure.

(11) An organic light emitting layer and a pattern of a cathode are formed. In an exemplary embodiment, forming the organic light emitting layer and the pattern of the cathode may include: forming the organic light emitting layer through a evaporation or inkjet printing process on the substrate, on which the aforementioned patterns are formed, the organic light emitting layer of the red light emitting device being connected to the first anode 301A through the first pixel opening PV1, the organic light emitting layer of the blue light emitting device being connected to the second anode 301B through the second pixel opening PV2, and the organic light emitting layer of the green light emitting device being connected to the third anode 301C through the third pixel opening PV3; and forming the pattern of the patterned cathode through the patterning processes on the substrate, on which the aforementioned patterns are formed, as shown in FIG. 21.

In an exemplary embodiment, the patterned cathode 304 may be in the shape of a blocky structure. A body area of larger area of the cathode 304 is provided in an area where the pixel region is located, and a connection area or other areas of smaller area of the cathode 304 are provided in an area where the blank region is located, that is, the cathode 304 in a larger area of the blank region is removed, so as to effectively improve the overall transmittance of the display substrate.

In an exemplary embodiment, the area of the orthographic projection of the cathode 304 on the substrate may be about 1.1 to 1.3 times the area of an orthographic projection of the pixel region on the substrate.

In an exemplary embodiment, the cathode 304 with a blocky structure within the pixel region laps over the organic light emitting layer, so that the organic light emitting layer is sandwiched between the anode and the cathode, to implement emission of light under the control of the anode and the cathode. The cathode 304 in the blank region is connected to the cathode connection electrode 110 through the cathode electrode opening K. Because the cathode connection electrode 110 is connected to the fourth transverse connecting line 94 through the via hole, and the fourth transverse connecting line 94 is connected to the second power supply line 80, the second power supply line 80 may provide the second power supply signals to the cathode 304 of each pixel region.

In an exemplary embodiment, the orthographic projection of the cathode 304 on the substrate overlaps at least partially with the orthographic projection of the second transverse connecting line 92 on the substrate.

The subsequent manufacturing process may include forming an encapsulation structure layer. The encapsulation structure layer may include a first encapsulation layer, a second encapsulation layer and a third encapsulation layer that are stacked. The first encapsulation layer and the third encapsulation layer may be made of inorganic materials, and the second encapsulation layer may be made of an organic material. The second encapsulation layer is disposed between the first encapsulation layer and the third encapsulation layer so as to ensure that external water vapor cannot enter the light emitting structure layer.

Figure 22:
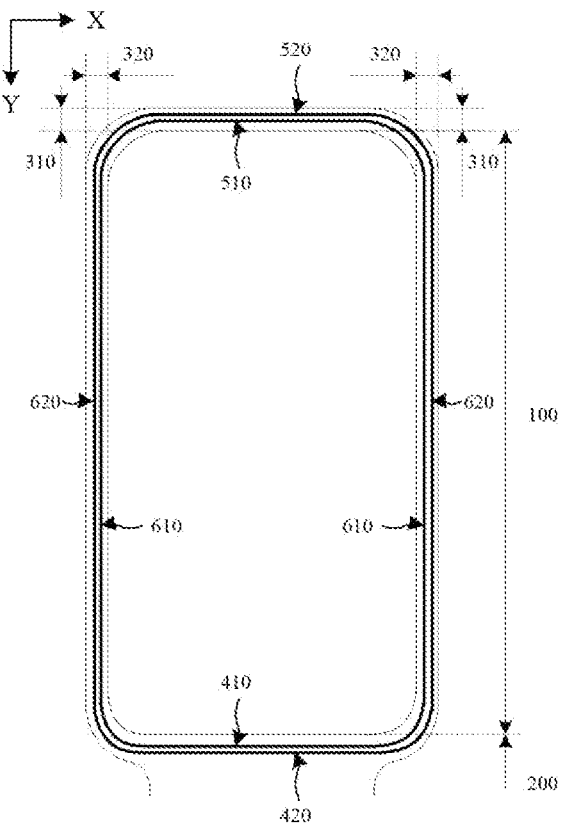
FIG. 22 is a schematic diagram of a planar structure of power supply leads in a bonding area and a bezel area in accordance with an embodiment of the present disclosure.

FIG. 22 is a schematic diagram of a planar structure of power supply leads in a bonding area and a bezel area in accordance with an exemplary embodiment of the present disclosure. As shown in FIG. 22, the display substrate may include a display area 100, a bonding area 200 located at a side of the display area 100 in the second direction Y and a bezel area 300 located at other sides of the display area 100. In an exemplary embodiment, the bezel area 300 may include a top bezel region 310 located at a side of the display area 100 in the opposite direction of the second direction Y (at a side of the display area 100 away from the bonding area 200) and a side bezel region 320 located at one or both sides of the display area 100 in the first direction X.

In an exemplary embodiment, the display area 100 may include a plurality of pixel regions, a plurality of blank regions, a first power supply wiring with a mesh connection structure and a second power supply wiring with a mesh connection structure. The first power supply wiring may at least include a first power supply line located in the pixel region and a high-voltage power supply connecting line located in the blank region, and the second power supply wiring may at least include a second power supply line located in the pixel region and a low-voltage power supply connecting line located in the blank region.

In an exemplary embodiment, a bonding high-voltage lead 410 and a bonding low-voltage leads 420 may be provided in the bonding area 200. The bonding low-voltage lead 420 may be disposed at a side of the bonding high-voltage lead 410 away from the display area 100. The bonding high-voltage lead 410 may be connected to the first power supply wiring in the display area 100, and the bonding low-voltage lead 420 may be connected to the second power supply wiring in the display area 100.

In an exemplary embodiment, the bonding area 200 may include a plurality of conductive layers. The bonding high-voltage lead 410 and the bonding low-voltage lead 420 may be disposed on at least two of the conductive layers to form a double-layer lead, so as to effectively reduce the resistance of the wiring, decrease the voltage drop in the transmission of the power signals, facilitate improvement of the voltage uniformity, thereby avoiding poor display of the display substrate and ensuring the display effect of the display substrate.

In an exemplary embodiment, a top bezel high-voltage lead 510 and a top bezel low-voltage lead 520 may be provided in the top bezel region 310. The top bezel low-voltage lead 520 may be disposed at a side of the top bezel high-voltage lead 510 away from the display area 100. The top bezel high-voltage lead 510 may be connected to the first power supply wiring in the display area 100, and the top bezel low-voltage lead 520 may be connected to the second power supply wiring in the display area 100.

In an exemplary embodiment, the top bezel region 310 may include a plurality of conductive layers. The top bezel high-voltage lead 510 and the top bezel low-voltage lead 520 may be disposed on at least two of the conductive layers to form a double-layer lead, so as to effectively reduce the resistance of the wiring, decrease the voltage drop in the transmission of the power signals, facilitate improvement of the voltage uniformity, thereby avoiding poor display of the display substrate and ensuring the display effect of the display substrate.

In an exemplary embodiment, a side bezel high-voltage lead 610 and a side bezel low-voltage lead 620 may be provided in the side bezel region 320. The side bezel low-voltage lead 620 may be disposed at a side of the side bezel high-voltage lead 610 away from the display area 100. The side bezel high-voltage lead 610 may be connected to the first power supply wiring in the display area 100, and the side bezel low-voltage lead 620 may be connected to the second power supply wiring in the display area 100.

In an exemplary embodiment, the side bezel region 320 may include a plurality of conductive layers. The side bezel high-voltage lead 610 and the side bezel low-voltage lead 620 may be disposed on at least two of the conductive layers to form a double-layer lead, so as to effectively reduce the resistance of the wiring, decrease the voltage drop in the transmission of the power signals, facilitate improvement of the voltage uniformity, thereby avoiding poor display of the display substrate and ensuring the display effect of the display substrate.

In an exemplary embodiment, the bonding high-voltage lead 410 in the bonding area 200, the top bezel high-voltage lead 510 in the top bezel region 310 and the side bezel high-voltage lead 610 in the side bezel region 320 may be connected to each other to form an integrated structure, so as to form an annular high-voltage lead surrounding the display area 100.

In an exemplary embodiment, the bonding low-voltage lead 420 in the bonding area 200, the top bezel low-voltage lead in the top bezel region 310 and the side bezel low-voltage lead 620 in the side bezel region 320 may be connected to each other to form an integrated structure, so as to form an annular low-voltage lead surrounding the display area 100.

In an exemplary embodiment, the annular low-voltage lead may be located at a side of the annular high-voltage lead away from the display area, i.e., the annular low-voltage lead may surround the annular high-voltage lead.

Figure 23A:
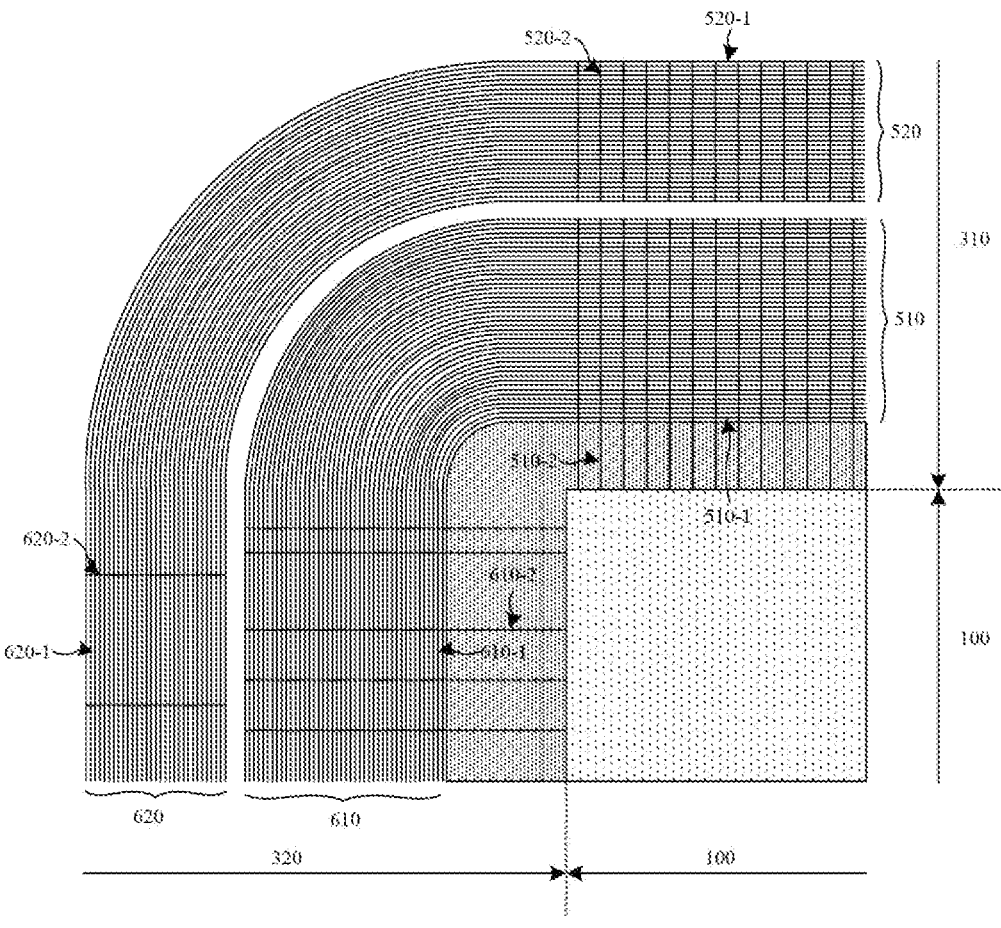
FIGS. 23a and 23b are schematic diagrams of a planar structure of power supply leads in a bezel area in accordance with an embodiment of the present disclosure.
Figures 23B, 24A, 24B:
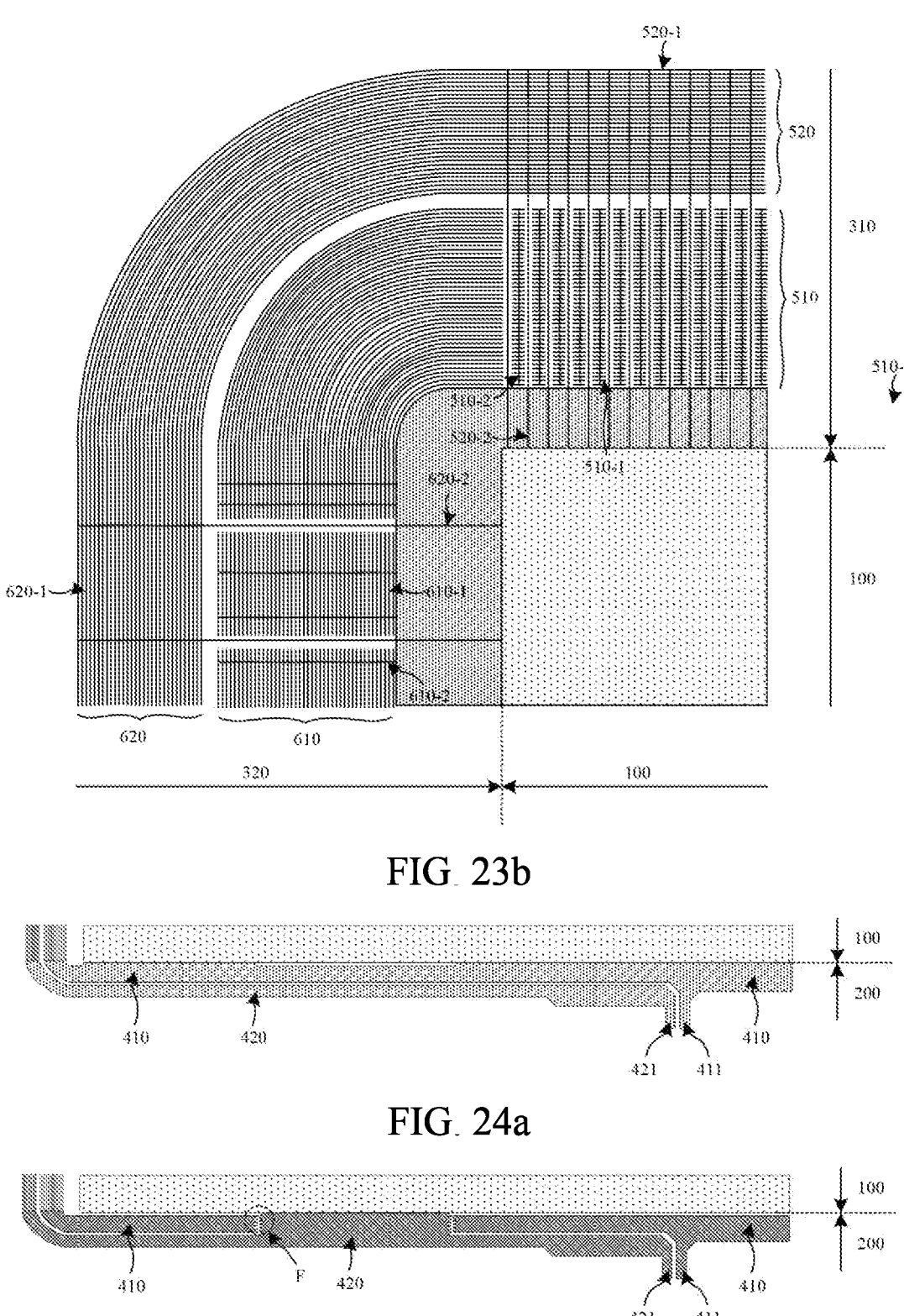
FIGS. 24a and 24b are schematic diagrams of a planar structure of power supply leads in a bonding area in accordance with an embodiment of the present disclosure.

FIGS. 23*a* and 23*b* are schematic diagrams of a planar structure of power supply leads in a bezel area in accordance with an exemplary embodiment of the present disclosure, which illustrate power supply lead structures in the top bezel region 310 and the side bezel region 320. FIG. 23*a* shows a power supply lead structure of the third conductive layer, and FIG. 23*b* shows a power supply lead structure of the fourth conductive layer. In an exemplary embodiment, the power supply leads in both the top bezel region 310 and the side bezel region 320 are configured in the form of a patterned structure of a multi-line layout, so as to facilitate improvement of the transmittance of the bezel area.

As shown in FIG. 23*a*, in the process of forming the pattern of the third conductive layer in the display area, the top bezel high-voltage lead 510 and the top bezel low-voltage lead 520 are formed synchronously in the top bezel region 310, and the side bezel high-voltage lead 610 and the side bezel low-voltage lead 620 are formed synchronously in the side bezel region 320. The top bezel high-voltage lead 510 in the top bezel region 310 and the side bezel high-voltage lead 610 in the side bezel region 320 are connected to each other to form an integrated structure, and the top bezel low-voltage lead 520 in the top bezel region 310 and the side bezel low-voltage lead 620 in the side bezel region 320 are connected to each other to form an integrated structure.

In an exemplary embodiment, the top bezel high-voltage lead 510 of the third conductive layer may include a plurality of top bezel high-voltage sub-lines 510-1, and the side bezel high-voltage lead 610 of the third conductive layer may include a plurality of side bezel high-voltage sub-lines 610-1. The top bezel high-voltage sub-lines 510-1 and the side bezel high-voltage sub-lines 610-1 may be in the shape of a line extending along a direction surrounding the display area. The plurality of the top bezel high-voltage sub-lines 510-1 and the plurality of the side bezel high-voltage sub-lines 610-1 may be arranged sequentially along a direction away from the display area 100. The plurality of the top bezel high-voltage sub-lines 510-1 is connected to the plurality of the side bezel high-voltage sub-lines 610-1 correspondingly.

In an exemplary embodiment, the top bezel high-voltage leads 510 of the third conductive layer may include a plurality of top bezel high-voltage connecting lines 510-2. The top bezel high-voltage connecting lines 510-2 may be in the shape of a line extending along the direction away from the display area 100. First ends of the plurality of top bezel high-voltage lines 510-2 are respectively connected to the first power supply wiring in the display area 100. Second ends of the plurality of top bezel high-voltage connecting lines 510-2 are respectively connected to the plurality of top bezel high-voltage sub-lines 510-1 after extending towards the direction away from the display area 100, so as to implement the connection between the plurality of top bezel high-voltage sub-lines 510-1 and the first power supply wiring in the display area 100 through the plurality of top bezel high-voltage connecting lines 510-2.

In an exemplary embodiment, the side bezel high-voltage lead 610 of the third conductive layer may include a plurality of side bezel high-voltage connecting lines 610-2. The side bezel high-voltage connecting lines 610-2 may be in the shape of a line extending towards the direction away from the display area 100. First ends of the plurality of side bezel high-voltage connecting lines 610-2 are respectively connected to the first power supply wiring in the display area 100. Second ends of the plurality of side bezel high-voltage connecting lines 610-2 are respectively connected to the plurality of side bezel high-voltage sub-lines 610-1 after extending towards the direction away from the display area 100, so as to implement the connection between the plurality of side bezel high-voltage sub-lines 610-1 and the first power supply wiring in the display area 100 through the plurality of side bezel high-voltage connecting lines 610-2.

In an exemplary embodiment, the top bezel low-voltage lead 520 of the third conductive layer may include a plurality of top bezel low-voltage sub-lines 520-1, and the side bezel low-voltage lead 620 of the third conductive layer may include a plurality of side bezel low-voltage sub-lines 620-1. The top bezel low-voltage sub-lines 520-1 and the side bezel low-voltage sub-lines 620-1 may be in the shape of a line extending along the direction surrounding the display area. The plurality of the top bezel low-voltage sub-lines 520-1 and the plurality of the side bezel low-voltage sub-lines 620-1 may be arranged sequentially along the direction away from the display area 100. The plurality of the top bezel low-voltage sub-lines 520-1 is connected to the plurality of the side bezel low-voltage sub-lines 620-1 correspondingly.

In an exemplary embodiment, the top bezel low-voltage lead 520 of the third conductive layer may include a plurality of top bezel low-voltage connecting lines 520-2. The top bezel low-voltage connecting lines 520-2 may be in the shape of a line extending towards the direction away from the display area 100. The plurality of top bezel low-voltage connecting lines 520-2 are disposed only in an area where the top bezel low-voltage lead 520 is located, and are respectively connected to the plurality of top bezel low-voltage sub-lines 520-1 to form a mesh low-voltage wiring.

In an exemplary embodiment, the side bezel low-voltage lead 620 of the third conductive layer may include a plurality of side bezel low-voltage connecting lines 620-2. The side bezel low-voltage connecting lines 620-2 may be in the shape of a line extending towards the direction away from the display area 100. The plurality of side bezel low-voltage connecting lines 620-2 are disposed only in an area where the side bezel low-voltage lead 620 is located, and are respectively connected to the plurality of side bezel low-voltage sub-lines 620-1 to form a mesh low-voltage wiring.

In an exemplary embodiment, the top bezel high-voltage lead 510 and the side bezel high-voltage lead 610 of the third conductive layer are connected to the first power supply wiring in the display area 100, while the top bezel low-voltage lead 520 and the side bezel low-voltage lead 620 of the third conductive layer are not connected to the second power supply wiring in the display area 100, therefore the high-voltage leads (VDD) in the bezel area are led to the display area 100 through the third conductive layer (SD1).

As shown in FIG. 23b, in the process of forming the pattern of the fourth conductive layer in the display area, the top bezel high-voltage lead 510 and the top bezel low-voltage lead 520 are formed synchronously in the top bezel region 310, and the side bezel high-voltage lead 610 and the side bezel low-voltage lead 620 are formed synchronously in the side bezel region 320. The top bezel high-voltage lead 510 in the top bezel region 310 and the side bezel high-voltage lead 610 in the side bezel 320 are connected to each other to form an integrated structure.

In an exemplary embodiment, the top bezel high-voltage lead 510 of the fourth conductive layer may include a plurality of top bezel high-voltage sub-lines 510-1, and the side bezel high-voltage lead 610 of the fourth conductive layer may include a plurality of side bezel high-voltage sub-lines 610-1. The top bezel high-voltage sub-lines 510-1 and the side bezel high-voltage sub-lines 610-1 may include a plurality of high-voltage line segments arranged at intervals. The high-voltage line segments may be in the shape of a linear segment, which extends in the direction surrounding the display area. The plurality of top bezel high-voltage sub-lines 510-1 and the plurality of side bezel high-voltage sub-lines 610-1 may be sequentially arranged along the direction away from the display area 100.

In an exemplary embodiment, the top bezel high-voltage lead 510 of the fourth conductive layer may include a plurality of top bezel high-voltage connecting lines 520-2. The top bezel high-voltage connecting lines 520-2 may be in the shape of a line extending towards the direction away from the display area 100. The plurality of top bezel high-voltage connecting lines 520-2 may be disposed only in an area where the top bezel high-voltage lead 510 is located, and be respectively connected to the plurality of top bezel high-voltage sub-lines 520-1 to form a mesh high-voltage wiring.

In an exemplary embodiment, the side bezel high-voltage lead 610 of the fourth conductive layer may include a plurality of side bezel high-voltage connecting lines 620-2. The side bezel high-voltage connecting lines 620-2 may be in the shape of a line extending towards the direction away from the display area 100. The plurality of side bezel high-voltage connecting lines 620-2 may be disposed only in an area where the side bezel high-voltage lead 610 is located, and be respectively connected to the plurality of side bezel high-voltage sub-lines 620-1 to form a mesh high-voltage wiring.

In an exemplary embodiment, the top bezel low-voltage lead 520 of the fourth conductive layer may include a plurality of top bezel low-voltage sub-lines 520-1, and the side bezel low-voltage lead 620 of the fourth conductive layer may include a plurality of side bezel low-voltage sub-lines 620-1. The top bezel low-voltage sub-lines 520-1 and the side bezel low-voltage sub-lines 620-1 may be in the shape of a line extending towards the direction surrounding the display area. The plurality of the top bezel low-voltage sub-lines 520-1 and the plurality of the side bezel low-voltage sub-lines 620-1 may be arranged sequentially along the direction away from the display area 100. The plurality of the top bezel low-voltage sub-lines 520-1 are connected to the plurality of the side bezel low-voltage sub-lines 620-1 correspondingly.

In an exemplary embodiment, the top bezel low-voltage lead 520 of the fourth conductive layer may include a plurality of top bezel low-voltage connecting lines 520-2. The top bezel low-voltage connecting lines 520-2 may be in the shape of a line extending towards the direction away from the display area 100. First ends of the plurality of top bezel low-voltage connecting lines 520-2 are respectively connected to the second power supply wiring in the display area 100, and second ends of the plurality of top bezel low-voltage connecting lines 520-2 are respectively connected to the plurality of top bezel low-voltage sub-lines 520-1 after extending towards the direction away from the display area 100 and spanning the top bezel high-voltage lead 510, so as to implement the connection between the plurality of top bezel low-voltage sub-lines 520-1 and the second power supply wiring in the display area 100 through the plurality of top bezel low-voltage connecting lines 520-2.

In an exemplary embodiment, the side bezel low-voltage lead 620 of the fourth conductive layer may include a plurality of side bezel low-voltage connecting lines 620-2. The side bezel low-voltage connecting lines 620-2 may be in the shape of a line extending towards the direction away from the display area 100. First ends of the plurality of side bezel low-voltage connecting lines 620-2 are respectively connected to the second power supply wiring in the display area 100, and second ends of the plurality of side bezel low-voltage connecting lines 620-2 are respectively connected to the plurality of side bezel low-voltage sub-lines 620-1 after extending towards the direction away from the display area 100 and spanning the side bezel high-voltage lead 610, so as to implement the connection between the plurality of side bezel low-voltage sub-lines 620-1 and the second power supply wiring in the display area 100 through the plurality of side bezel low-voltage connecting lines 620-2.

In an exemplary embodiment, the top bezel low-voltage lead 520 and the side bezel low-voltage lead 620 of the fourth conductive layer are connected to the second power supply wiring in the display area 100, while the top bezel high-voltage lead 510 and the side bezel high-voltage lead 610 of the fourth conductive layer are not connected to the first power supply wiring in the display area 100, therefore the low-voltage leads (VSS) in the bezel area are led to the display area 100 through the fourth conductive layer (SD2).

In an exemplary embodiment, an orthographic projection of the top bezel high-voltage sub-line of the third conductive layer on the substrate overlaps at least partially with an orthographic projection of the top bezel high-voltage sub-line of the fourth conductive layer on the substrate, and an orthographic projection of the top bezel low-voltage sub-line of the third conductive layer on the substrate overlaps at least partially with an orthographic projection of the top bezel low-voltage sub-line of the fourth conductive layer on the substrate, so as to facilitate improvement of the trans-mittance of the bezel area.

In an exemplary embodiment, the orthographic projection of the top bezel high-voltage connecting line of the third conductive layer on the substrate overlaps at least partially with the orthographic projection of the top bezel high-voltage connecting line of the fourth conductive layer on the substrate, and the top bezel high-voltage connecting lines of the two layers are connected to each other through a via hole to implement the connection between the top bezel high-voltage leads of the two layers.

In an exemplary embodiment, an orthographic projection of the side bezel high-voltage connecting line of the third conductive layer on the substrate overlaps at least partially with an orthographic projection of the side bezel high-voltage connecting line of the fourth conductive layer on the substrate, and the side bezel high-voltage connecting lines of the two layers are connected to each other through a via hole to implement the connection between the side bezel high-voltage leads of the two layers.

In an exemplary embodiment, an orthographic projection of the top bezel low-voltage connecting line of the third conductive layer on the substrate overlaps at least partially with an orthographic projection of the top bezel low-voltage connecting line of the fourth conductive layer on the substrate, and the top bezel low-voltage connecting lines of the two layers are connected to each other through a via hole to implement the connection between the top bezel low-voltage leads of the two layers.

In an exemplary embodiment, an orthographic projection of the side bezel low-voltage connecting line of the third conductive layer on the substrate overlaps at least partially with an orthographic projection of the side bezel low-voltage connecting line of the fourth conductive layer on the substrate, and the side bezel low-voltage connecting lines of the two layers are connected to each other through a via hole to implement the connection between the side bezel low-voltage leads of the two layers.

In an exemplary embodiment, the width of the top bezel high-voltage sub-line may be about 10 to 20 μm, and the spacing between the adjacent top bezel high-voltage sub-lines may be about 40 to 60 μm, the width and spacing being dimensions in the direction away from the display area. For example, the width of the top bezel high-voltage sub-line may be about 150 μm, and the spacing between the adjacent top bezel high-voltage sub-lines may be about 50 μm.

In an exemplary embodiment, the width of the top bezel low-voltage sub-line may be about 10 to 20 μm, and the spacing between the adjacent top bezel low-voltage sub-line may be about 40 to 60 μm. For example, the width of the top bezel low-voltage sub-line may be about 15 μm, and the spacing between the adjacent top bezel low-voltage sub-lines may be about 50 μm.

In an exemplary embodiment, the width of the side bezel high-voltage sub-line may be about 10 to 20 μm, and the spacing between the adjacent side bezel high-voltage sub-lines may be about 40 to 60 μm. For example, the width of the side bezel high-voltage sub-line may be about 15 μm, and the spacing between the adjacent side bezel high-voltage sub-lines may be about 50 μm.

In an exemplary embodiment, the width of the side bezel low-voltage sub-line may be about 10 to 20 μm, and the spacing between the adjacent side bezel low-voltage sub-lines may be about 40 to 60 μm. For example, the width of the side bezel low-voltage sub-line may be about 15 μm, and the spacing between the adjacent side bezel low-voltage sub-lines may be about 50 μm.

FIGS. 24a and 24b are schematic diagrams of a planar structure of power supply leads in a bonding area in accordance with an exemplary embodiment of the present disclosure. FIG. 24a shows a power supply lead structure of the third conductive layer, and FIG. 24b shows a power supply lead structure of the fourth conductive layer. In an exemplary embodiment, all the power supply leads in the bonding area 200 are in the form of a planar structure, so as to facilitate reduction in current density.

As shown in FIG. 24a, in the process of forming the pattern of the third conductive layer in the display area, a bonding high-voltage lead 410 and a bonding low-voltage lead 420 are formed synchronously in the bonding area 200. The bonding high-voltage lead 410 is connected to the side bezel high-voltage lead 610 of the third conductive layer in the side bezel region 320, and the bonding low-voltage lead 420 is connected to the side bezel low-voltage lead 620 of the third conductive layer in the side bezel region 320.

In an exemplary embodiment, the bonding high-voltage lead 410 on the third conductive layer may be in the shape of a stripe extending along the direction surrounding the display area. The bonding high-voltage lead 410 is connected to the first power supply wiring in the display area. At least one bonding pad high-voltage connecting line 411 is disposed at a side of the bonding high-voltage lead line 410 away from the display area 100. The bonding pad high-voltage connecting line 411 may be in the shape of a stripe extending along the direction away from the display area. A first end of the bonding pad high-voltage connecting line 411 is connected to the bonding high-voltage lead 410, and a second end of the bonding pad high-voltage connecting line 411 is connected to a bonding high-voltage bonding pad in the bonding area after extending towards the direction away from the display area 100.

In an exemplary embodiment, the bonding low-voltage lead 420 on the third conductive layer may be in the shape of a strip extending around the direction surrounding the display area. The bonding low-voltage lead 420 may be disposed at a side of the bonding high-voltage lead 410 away from the display area 100. A bonding pad low-voltage connecting line 421 is disposed at a side of the bonding low-voltage lead 420 away from the display area 100. The bonding pad low-voltage connecting line 412 may be in the shape of a stripe extending along the direction away from the display area. A first end of the bonding pad low-voltage connecting line 421 is connected to the bonding low-voltage lead 420, and a second end of the bonding pad low-voltage connecting line 421 is connected to a bonding low-voltage bonding pad in the bonding area after extending towards the direction away from the display area 100.

In an exemplary embodiment, the bonding high-voltage lead 410 on the third conductive layer and the bonding pad high-voltage connecting line 411 may be connected to each other to form an integrated structure, and the bonding low-voltage lead 420 on the third conductive layer and the bonding pad low-voltage connecting line 421 may be connected to each other to form an integrated structure.

As shown in FIG. 24*b*, in the process of forming the pattern of the fourth conductive layer in the display area, a bonding high-voltage lead 410 and a bonding low-voltage lead 420 are formed synchronously in the bonding area 200. The bonding high-voltage lead 410 is connected to the side bezel high-voltage lead 610 of the fourth conductive layer in the side bezel region 320, and the bonding low-voltage lead 420 is connected to the side bezel low-voltage lead 620 of the fourth conductive layer in the side bezel region 320.

In an exemplary embodiment, the bonding high-voltage lead 410 on the fourth conductive layer may include at least two bonding high-voltage segments arranged at intervals. The bonding high-voltage segment may be in the shape of a strip-shaped segment, which extends in the direction surrounding the display area. A bonding pad high-voltage connecting line 411 is disposed at a side of at least one bonding high-voltage lead 410 away from the display area 100. The bonding pad high-voltage connecting line 411 may be in the shape of a stripe extending towards the direction away from the display area. A first end of the bonding pad high-voltage connecting line 411 is connected to the bonding high-voltage lead 410, and a second end of the bonding pad high-voltage connecting line 411 is connected to a bonding high-voltage bonding pad in the bonding area after extending towards the direction away from the display area 100.

In an exemplary embodiment, the bonding low-voltage lead 420 on the fourth conductive layer may be in the shape of a strip extending in the direction surrounding the display area. One portion of the bonding low-voltage lead 420 may be disposed at a side of the bonding high-voltage lead 410 away from the display area 100, and the other portion of the bonding low-voltage lead 420 may be disposed between two bonding high-voltage segments. A bonding pad low-voltage connecting line 421 is disposed at a side of the bonding low-voltage lead 420 away from the display area 100. A first end of the bonding pad low-voltage connecting line 421 is connected to the bonding low-voltage lead 420, and a second end of the bonding pad low-voltage connecting line 421 is connected to a bonding low-voltage bonding pad in the bonding area after extending towards the direction away from the display area 100.

In an exemplary embodiment, the bonding high-voltage lead 410 and pad high-voltage connecting line 411 on the fourth conductive layer may be connected to each other to form an integrated structure, and the bonding low-voltage lead 420 and bonding pad low-voltage connecting line 421 on the third conductive layer may be connected to each other to form an integrated structure.

In an exemplary embodiment, an orthographic projection of the bonding high-voltage lead 410 on the third conductive layer on the substrate overlaps at least partially with an orthographic projection of the bonding high-voltage lead 410 on the fourth conductive layer on the substrate, and an orthographic projection of the bonding low-voltage lead 420 on the third conductive layer on the substrate overlaps at least partially with an orthographic projection of the bonding low-voltage lead 420 on the fourth conductive layer on the substrate. Forming a power supply lead of a double-layer structure in the bonding area, may effectively reduce the resistance of the wiring, decrease the voltage drop in the transmission of the power supply signals, and facilitate improvement of the voltage uniformity, thereby avoiding poor display of the display substrate and ensuring the display effect of the display substrate.

In an exemplary embodiment, the orthographic projection of the bonding high-voltage lead 410 on the third conductive layer on the substrate overlaps at least partially with an orthographic projection of a bonding low-voltage connecting line 420-1 on the fourth conductive layer on the substrate, to form a double layer structure with a bottom layer being a high-voltage lead and a top layer being a low-voltage lead.

In an exemplary embodiment, the bonding high-voltage lead on the third conductive layer is connected to the first power supply wiring in the display area through a bonding high-voltage connecting line, while the bonding low-voltage connecting line of the third conductive layer is not connected to the first power supply wiring in the display area, therefore the high-voltage leads (VDD) in the bonding area are led to the display area through the third conductive layer (SD1). The bonding low-voltage connecting line on the fourth conductive layer is connected to the second power supply wiring in the display area through the bonding low-voltage connecting line, while the bonding high-voltage lead of the fourth conductive layer is not connected to the second power supply wiring in the display area, therefore the low-voltage leads (VSS) in the bonding area are led to the display area through the fourth conductive layer (SD2).

Figure 25A:
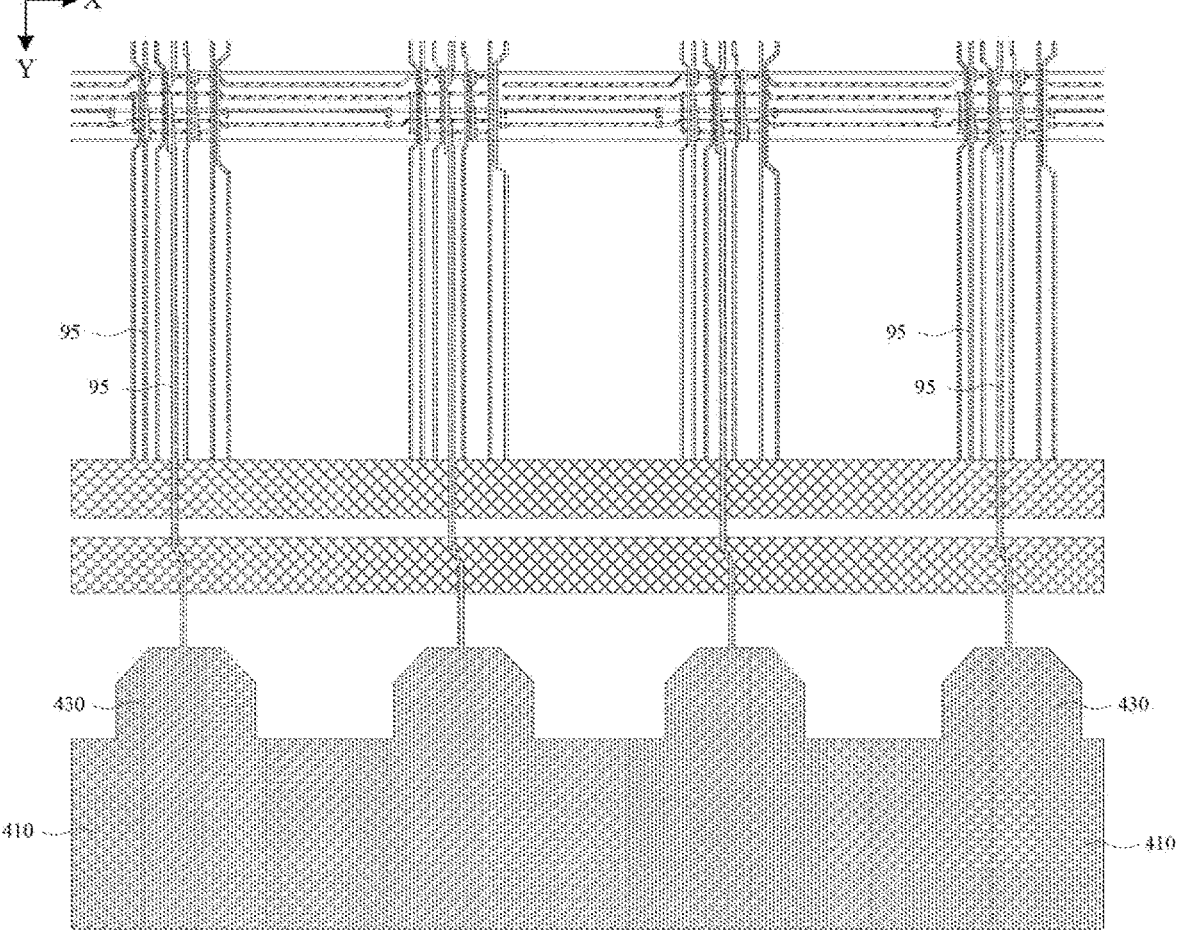
FIGS. 25*a* to 25*c* are schematic diagrams of connection structures of power supply leads in a bonding area in accordance with an embodiment of the present disclosure.
Figure 25B:
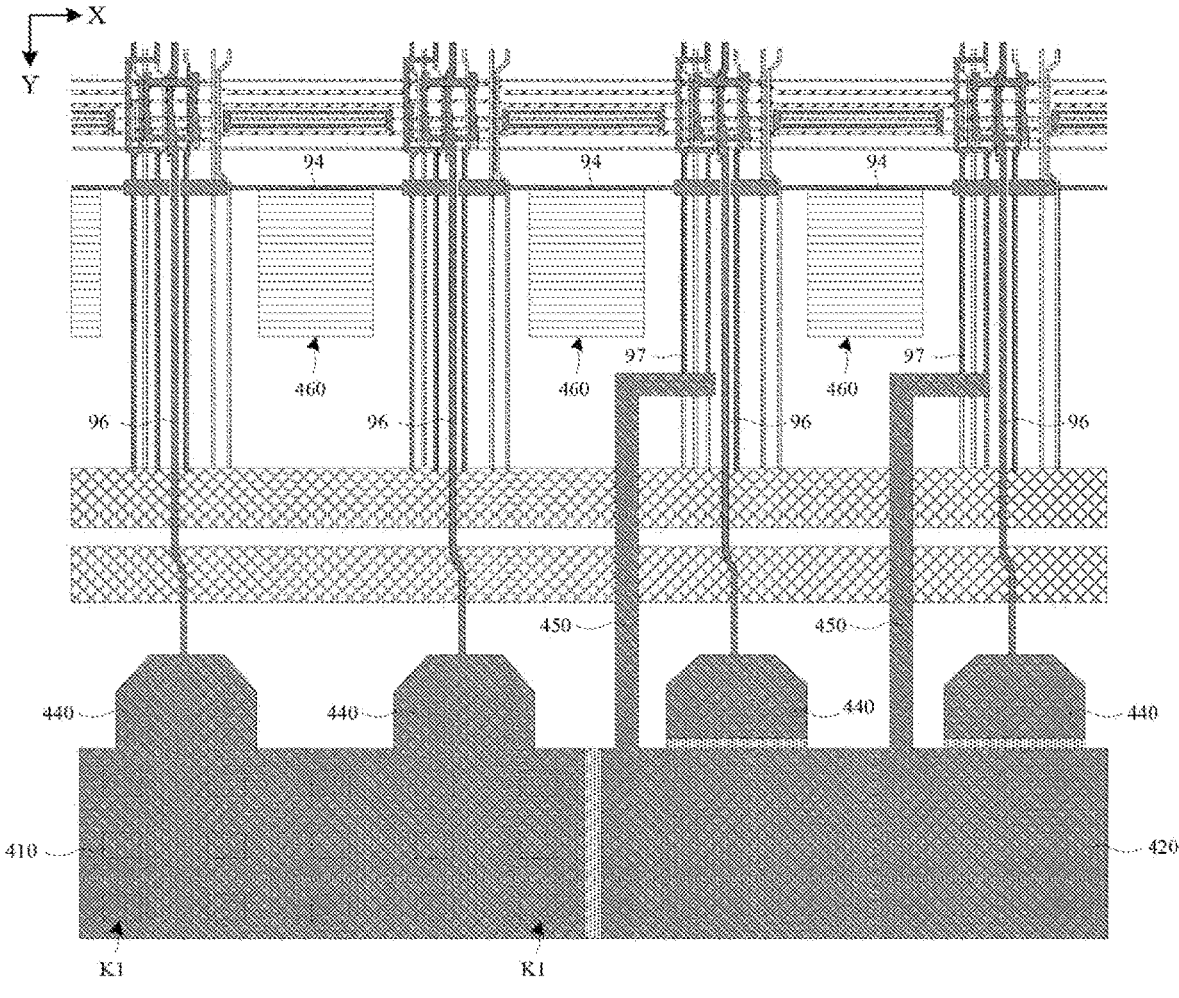
Figure 25C:
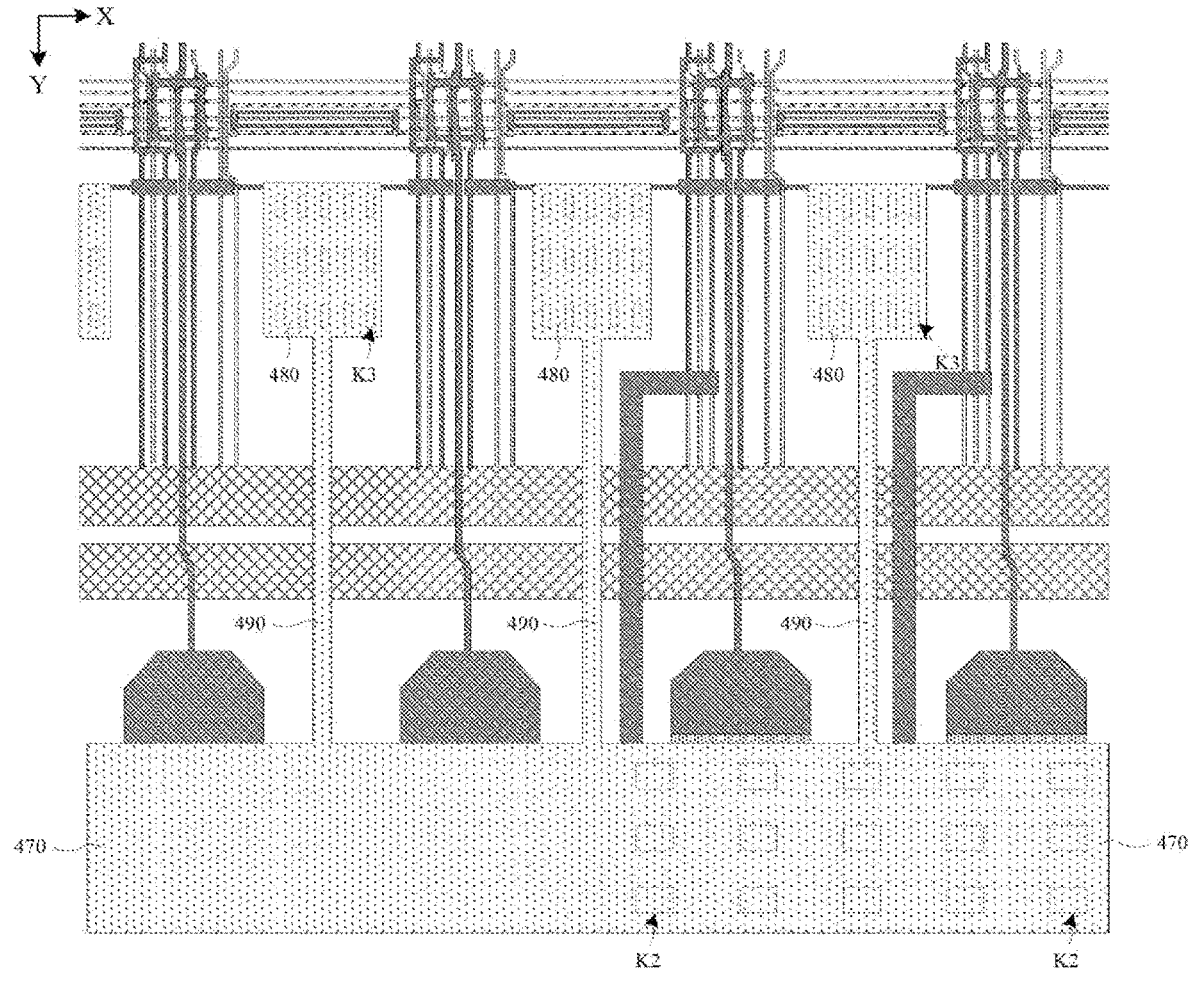

FIGS. 25*a* to 25*c* are schematic diagrams of connection structures of power supply leads in a bonding area in accordance with an embodiment of the present disclosure, which are enlarged views of an area F in FIG. 24*b*. FIG. 25*a* is a schematic diagram of a connection structure of the third conductive layer in the area F, FIG. 25*b* is a schematic diagram of a connection structure of the fourth conductive layer in the area F, and FIG. 25*c* is a schematic diagram of a connection structure of the anode conductive layer in the area F.

As shown in FIG. 25*a*, in the process of forming the pattern of the third conductive layer in the display area, a bonding high-voltage lead 410 and a plurality of first high-voltage bonding pads 430 are formed synchronously in the area F of the bonding area. The bonding high-voltage lead 410 on the third conductive layer may be in the shape of a strip extending in the direction surrounding the display area, and the first high-voltage bonding pads 430 may be in the shape of a trapezoid. The first high-voltage bonding pads 430 are disposed at a side of the bonding high-voltage lead

410 close to the display area, and are connected to the bonding high-voltage lead 410.

In an exemplary embodiment, a plurality of first vertical connecting lines 95, by which the high-voltage power supply signals are transmitted in the second direction Y, is connected to the plurality of first high-voltage bonding pads 430 after extending to the bonding area. The plurality of first vertical connecting lines 95 extending in the bonding area form a bonding high-voltage connecting line, so as to implement the connection between the bonding high-voltage lead 410 in the bonding area and the first power supply wiring in the display area. The high-voltage power supply signals (VDD) in the bonding area are led to the display area through the third conductive layer (SD1).

In an exemplary embodiment, the pattern of the third conductive layer of the bonding area may include signal leads, such as a plurality of data leads and initial leads, the present disclosure is not limited thereto.

As shown in FIG. 25b, in the process of forming the pattern of the fourth conductive layer in the display area, the bonding high-voltage lead 410, the bonding low-voltage lead 420, the second high-voltage bonding pads 440 and a low-voltage transition line 450 are formed synchronously in the area F of the bonding area.

In an exemplary embodiment, in an area at the left side of the area F, the bonding high-voltage lead 410 on the fourth conductive layer may be in the shape of a strip-shaped segment extending in the direction surrounding the display area. The orthographic projection of the bonding high-voltage lead 410 on the fourth conductive layer on the substrate overlaps at least partially with the orthographic projection of the bonding high-voltage lead 410 on the third conductive layer on the substrate. The bonding high-voltage leads 410 on the two conductive layers are connected to each other through a plurality of first via holes K1. The second high-voltage bonding pads 440 may be in the shape of a trapezoid. The second high-voltage bonding pads 440 are disposed at a side of the bonding high-voltage lead 410 close to the display area, and are connected to the bonding high-voltage lead 410. An orthographic projection of a second high-voltage bonding pad 440 on the fourth conductive layer on the substrate overlaps at least partially with an orthographic projection of a first high-voltage bonding pad 430 on the third conductive layer on the substrate. A plurality of second vertical connecting lines 96, by which the high-voltage power supply signals are transmitted in the second direction Y, are connected to the plurality of second high-voltage bonding pads 440 after extending to the bonding area.

In an exemplary embodiment, in an area at the right side of the area F, the bonding low-voltage lead 420 on the fourth conductive layer may be in the shape of a strip extending in the direction surrounding the display area. The orthographic projection of the bonding low-voltage lead 420 on the fourth conductive layer on the substrate overlaps at least partially with the orthographic projection of the bonding high-voltage lead 410 on the third conductive layer on the substrate. The low-voltage transition line 450 may be in the shape of a fold line, which extends along the second direction Y. A first end of the low-voltage transition line 450 is connected to the third vertical connecting line 97 (by which the low-voltage power supply signals are transmitted in the second direction Y) extending to the bonding area, and a second end of the low-voltage transition line 450 is connected to the bonding low-voltage lead 420 after extending along the second direction Y, so as to implement the connection between the bonding low-voltage lead 420 in the bonding area and the second power supply wiring in the display area. The low-voltage power supply signals (VSS) in the bonding area are led to the display area through the fourth conductive layer (SD2).

In an exemplary embodiment, a plurality of second high-voltage bonding pads 440 may be included in the area at the right side of the area F. The plurality of second high-voltage bonding pads 440 are connected to the plurality of second vertical connecting lines 96 correspondingly, but the plurality of second high-voltage bonding pads 440 are disposed in isolation from the bonding low-voltage leads 420.

In an exemplary embodiment, in the process of forming the pattern of the fourth conductive layer, a plurality of low-voltage connection blocks 460 may be formed at the edge of the bonding area close to the display area. The plurality of low-voltage connection blocks 460 are respectively disposed between the adjacent third vertical connecting lines 97 in the first direction X. A side of the plurality of low-voltage connection blocks 460 close to the display area is connected to the fourth transverse connecting line 94 (by which the low-voltage power supply signals are transmitted in the first direction X). The low-voltage connection blocks 460 are configured to be connected to a transparent low-voltage lead formed subsequently.

In an exemplary embodiment, each of the low-voltage connection blocks 460 may have of a mesh structure. The outline of the low-voltage connection block 460 may be in the shape of a rectangle. The low-voltage connection block 460 may include a plurality of horizontal sub-lines with primary portions extending along the first direction X, and at least two vertical sub-lines with primary portions extending along the second direction Y. One of the vertical sub-lines is connected to first ends of the plurality of horizontal sub-lines, and the other one of the vertical sub-lines is connected to second ends of the plurality of horizontal sub-lines, to form a mesh low-voltage connection block 460.

In an exemplary embodiment, the low-voltage connection block 460 may be of a whole-surface structure. The low-voltage connection block 460 may be in the shape of a rectangle to form a low-voltage connection block 460 of a whole-surface structure.

As shown in FIG. 25c, in the process of forming pattern of a transparent conductive layer in the display area, a transparent low-voltage lead 470, transparent pads 480 and transparent connecting lines 490 are formed synchronously in the area F of the bonding area. The transparent low-voltage lead 470 on the transparent conductive layer may be in the shape of a strip extending in the direction surrounding the display area. An orthographic projection of the transparent low-voltage lead 470 on the substrate overlaps at least partially with the orthographic projections of the bonding high-voltage lead 410 and the bonding low-voltage lead 420 on the fourth conductive layer on the substrate. The transparent low-voltage lead 470 is connected to the bonding low-voltage lead 420 through a plurality of second via holes K2.

In an exemplary embodiment, the transparent bonding pads 480 may be in the shape of a rectangle. An orthographic projection of a transparent bonding pad 480 on the substrate overlaps at least partially with an orthographic projection of a low-voltage connection block 460 on the fourth conductive layer on the substrate. The transparent bonding pads 480 are connected to the low-voltage connection blocks 460 through one or more third via holes K3.

In an exemplary embodiment, the transparent connecting lines 490 may be in the shape of a straight line or a fold line, which extends along the second direction Y. First ends of the transparent connecting lines 490 are connected to the transparent bonding pads 480, and second ends of the transparent connecting lines 490 are connected to the transparent low-voltage lead 470 after extending along the second direction Y.

In an exemplary embodiment, because both the bonding low-voltage lead 420 and the low-voltage connection blocks 460 transmit the low-voltage power supply signals, the transparent low-voltage lead 470 located on the transparent conductive layer transmits the low-voltage power supply signals, to form a transparent bonding low-voltage lead in the form of a planar structure in the bonding area. Because the planar bonding low-voltage connecting lines are formed in all the third conductive layer, the fourth conductive layer and the transparent conductive layer, a low-voltage power supply lead of a three-layer structure is formed in the bonding area, so as to effectively reduce the resistance of the wiring, decrease the voltage drop in the transmission of the power supply signals, and facilitate improvement of the voltage uniformity, thereby avoiding poor display of the display substrate and ensuring the display effect of the display substrate.

It can be seen from the structure and manufacturing process of the display substrate described above that, in the display substrate in accordance with the present disclosure, the cathode in the blank region can be removed by providing the patterned cathode in the pixel region, so as to effectively improve the transparency of the display substrate and improve the transparent display effect. In the present disclosure, the high-voltage power supply wiring and the low-voltage power supply wiring with a mesh connection structure are formed in the display area, so as to not only effectively reduce the resistance of the power supply wiring and effectively decrease the voltage drop of the power supply signals to implement low power consumption, but also effectively improve the uniformity of the power supply signals in the display substrate, effectively improve the display uniformity, and improve the display quality. In the present disclosure, the annular high-voltage lead and the annular low-voltage lead surrounding the display area are formed in the bonding area and the bezel area, the annular high-voltage lead is connected to the high-voltage power supply wiring in the display area in a plurality of directions, and the annular low-voltage lead is connected to the low-voltage power supply wiring in the display area in a plurality of directions, so as to effectively ensure the uniformity and reliability of the power supply signals input to the display area and improve the display quality. In the present disclosure, the power supply leads in the bezel area are configured in the form of a patterned structure of a multi-line layout, and the line width and spacing are designed reasonably, thereby improving the transmittance of the bezel area effectively. Compared with the existing whole-surface metal structure of the bezel area, the transmittance is guaranteed effectively and the transmittance loss is reduced effectively in the present disclosure. In the present disclosure, the characteristic that there is no need for transparent display in the bonding area is utilized to configure the power supply leads in the bonding area in the form of a whole-surface metal planar structure, so as to effectively reduce the current density, effectively decrease the voltage drop of the power supply signals and implement low power consumption. In the present disclosure, a good balance between the display voltage drop and the transmittance is maintained through power supply wiring structures in the display area, the bonding area and the bezel area, so as to meet not only the transparent requirements of the large-size transparent display but also the voltage drop requirements of the large-size transparent display. The manufacturing process in accordance with an exemplary embodiment of the present disclosure may be compatible well with the existing manufacturing process, be simple to implement and be easy to carry out, and have advantages such as high production efficiency, low production cost and high yield rate.

The structure and the manufacturing process thereof described above in the present disclosure are illustrated by way of example only. In an exemplary embodiment, corresponding structures may be changed and patterning processes may be added or reduced according to actual needs, the present disclosure is not limited thereto.

In an exemplary embodiment, the display substrate in accordance with the present disclosure may be applied to other display devices having pixel driving circuits, such as quantum dot displays and the like, the present disclosure is not limited thereto.

The present disclosure further provides a manufacturing method for a display substrate so as to manufacture the display substrate in accordance with the embodiments described above. The display substrate includes a display area, which includes a plurality of pixel regions and a plurality of blank regions, the blank regions being arranged between their adjacent pixel regions in a first direction and between their adjacent pixel regions in a second direction, the first direction intersecting the second direction, the pixel regions being configured to display images, the blank regions being configured to transmit light, and the manufacturing method including:

forming a driving circuit layer on a substrate, wherein the driving circuit layer of each pixel region includes a plurality of circuit units, a plurality of first power supply lines and at least one second power supply line, each of the circuit units at least includes a pixel driving circuit, and the first power supply lines are configured to continuously provide high-level signals to the pixel driving circuit; the driving circuit layer of each blank region includes high-voltage power supply connecting lines connected to the first power supply lines in the adjacent pixel regions and low-voltage power supply connecting lines connected to the second power supply lines in the adjacent pixel regions, the first power supply lines and the high-voltage power supply connecting lines form a high-voltage power supply wiring with a mesh connection structure, and the second power supply line and the low-voltage power supply connecting lines form a low-voltage power supply wiring with a mesh connection structure; and forming a light emitting structure layer on the driving circuit layer, wherein the light emitting structure layer of the pixel region at least includes a patterned cathode, the area of an orthographic projection of the cathode on the substrate is 1.1 to 1.3 times the area of an orthographic projection of the pixel region on the substrate, and the second power supply line is configured to continuously provide low-level signals to the cathode.

The present disclosure further provides a display device including the display substrate described above. The display device may be any product or component with a display function, such as a mobile phone, a tablet computer, a television, a display, a notebook computer, a digital photo frame or a navigator, the embodiments of the present invention are not limited thereto.

Although the embodiments disclosed in the present disclosure are described as above, the described contents are only embodiments which are adopted in order to facilitate understanding the present invention, and are not intended to limit the present disclosure. Any skilled person in the art to which the present invention pertains can make any modifications and alterations in forms and details of implementation without departing from the spirit and scope of the present invention. However, the patent protection scope of the present invention should be subject to the scope defined by the appended claims.

The invention claimed is:

1. A display substrate, comprising a display area, wherein: the display area comprises a plurality of pixel regions and a plurality of blank regions, the blank regions are arranged between adjacent pixel regions in a first direction and between adjacent pixel regions in a second direction, the first direction is intersected with the second direction, the pixel regions are configured to display images, and the blank regions are configured to transmit light; in a direction perpendicular to the display substrate, the display substrate comprises a driving circuit layer disposed on a substrate and a light emitting structure layer disposed on a side of the driving circuit layer away from the substrate, the driving circuit layer of at least one pixel region of the plurality of pixel regions comprises a plurality of circuit units, a plurality of first power supply lines and at least one second power supply line, at least one circuit unit of the plurality of circuit units at least comprises a pixel driving circuit, the light emitting structure layer of the pixel region at least comprises a patterned cathode, an area of an orthographic projection of the cathode on the substrate is 1.1 to 1.3 times an area of an orthographic projection of the pixel region on the substrate; the first power supply lines are configured to continuously provide high-level signals to the pixel driving circuit, and the second power supply line is configured to continuously provide low-level signals to the cathode; the driving circuit layer of at least one blank region of the plurality of blank regions comprises high-voltage power supply connecting lines connected to the first power supply lines in adjacent pixel regions and low-voltage power supply connecting lines connected to second power supply lines in adjacent pixel regions, the first power supply lines and the high-voltage power supply connecting lines form a high-voltage power supply wiring with a mesh connection structure, and the second power supply lines and the low-voltage power supply connecting lines form a low-voltage power supply wiring with a mesh connection structure; the high-voltage power supply connecting lines comprise first high-voltage connecting lines extending along the first direction and second high-voltage connecting lines extending along the second direction; the first high-voltage connecting lines are connected to the first power supply lines in the adjacent pixel regions in the first direction respectively, and the second high-voltage connecting lines are connected to the first power supply lines in the adjacent pixel regions in the second direction respectively; the driving circuit layer comprises a plurality of conductive layers, the first high-voltage connecting lines are disposed on at least two of the conductive layers, and the second high-voltage connecting lines are disposed on at least two of the conductive layers; and the pixel driving circuit comprises a storage capacitor comprising a first plate and a second plate, an orthographic projection of the first plate on the substrate is overlapped at least partially with an orthographic projection of the second plate on the substrate, and the second plate is connected to the first power supply lines; the first high-voltage connecting lines comprise a first transverse connecting line, the first transverse connecting line is connected to second plates in adjacent pixel regions in the first direction respectively, and the first transverse connecting line and the second plates are disposed on a same layer and are connected to each other to form an integrated structure.

2. The display substrate according to claim 1, wherein the first high-voltage connecting lines further comprise a second transverse connecting line, the second transverse connecting line and the first transverse connecting line are disposed on different conductive layers, both ends of the second transverse connecting line in the first direction are connected to both ends of the first transverse connecting line in the first direction through via holes respectively, and an orthographic projection of the second transverse connecting line on the substrate is overlapped at least partially with an orthographic projection of the first transverse connecting line on the substrate.

3. The display substrate according to claim 2, wherein the first high-voltage connecting lines further comprise a third transverse connecting line, the third transverse connecting line and the second transverse connecting line are disposed on different conductive layers, the third transverse connecting line is connected to the both ends of the second transverse connecting line in the first direction through via holes respectively, and an orthographic projection of the third transverse connecting line on the substrate is overlapped at least partially with the orthographic projection of the second transverse connecting line on the substrate.

4. The display substrate according to claim 3, wherein the third transverse connecting line comprises at least two first sub-lines extending along the first direction and at least two second sub-lines extending along the second direction, the at least two second sub-lines are respectively connected to both ends of the at least two first sub-lines to form a mesh in the blank region, and an orthographic projection of at least one of the first sub-lines on the substrate is overlapped at least partially with the orthographic projection of the second transverse connecting line on the substrate.

5. The display substrate according to claim 4, wherein the pixel region further comprises a light emitting control signal line, the light emitting control signal line is configured to provide a light emitting control signal to the pixel driving circuit, the blank region further comprises a light emitting control connecting line connected to light emitting control signal lines in the adjacent pixel regions in the first direction, and the orthographic projection of the at least one of the first sub-lines on the substrate is overlapped at least partially with an orthographic projection of the light emitting control signal line on the substrate.

6. The display substrate according to claim 1, wherein the second high-voltage connecting lines comprise at least one first vertical connecting line, the first vertical connecting line is connected to the first power supply lines in adjacent pixel regions in the second direction respectively, and the first vertical connecting line and the first power supply lines are disposed on a same layer and are connected to each other to form an integrated structure.

7. The display substrate according to claim 6, wherein the second high-voltage connecting lines further comprise at least one second vertical connecting line, the second vertical connecting line and the first vertical connecting line are disposed on different conductive layers, the second vertical connecting line is connected to the first power supply lines in adjacent pixel regions in the second direction respectively, and an orthographic projection of the second vertical connecting line on the substrate is overlapped at least partially with an orthographic projection of the first vertical connecting line on the substrate.

8. The display substrate according to claim 1, wherein the pixel region further comprises a high-voltage mesh line, at least one first power supply line of the plurality of first power supply lines and the high-voltage mesh line are disposed on different conductive layers, the high-voltage mesh line is connected to the first power supply line through a via hole, and an orthographic projection of the high-voltage mesh line on the substrate is overlapped at least partially with an orthographic projection of the first power supply line on the substrate.

9. The display substrate according to claim 8, wherein the high-voltage mesh line and a second vertical connecting line of the second high-voltage connecting lines are disposed on a same layer and are connected to each other to form an integrated structure.

10. The display substrate according to claim 8, wherein the high-voltage mesh line comprises at least two first mesh lines extending along the first direction and a plurality of second mesh lines extending along the second direction, the at least two first mesh lines are connected to both ends of the plurality of second mesh lines respectively, an orthographic projection of the second mesh lines on the substrate is overlapped at least partially with the orthographic projection of the first power supply line on the substrate, and the second mesh lines are connected to the first power supply line through via holes.

11. The display substrate according to claim 1, wherein the low-voltage power supply connecting lines comprise first low-voltage connecting lines extending along the first direction and second low-voltage connecting lines extending along the second direction; the second low-voltage connecting lines are connected to the second power supply lines in the adjacent pixel regions in the second direction respectively, and the first low-voltage connecting lines are connected to adjacent second low-voltage connecting lines in the first direction respectively; the driving circuit layer comprises a plurality of conductive layers, and the first low-voltage connecting lines and the second low-voltage connecting lines are disposed on a same conductive layer.

12. The display substrate according to claim 11, wherein the second low-voltage connecting lines at least comprise a third vertical connecting line, third vertical connecting line comprises a plurality of third sub-lines extending along the second direction and at least two third connection blocks, the at least two third connection blocks being connected to both ends of at least two third sub-lines.

13. The display substrate according to claim 12, wherein the pixel region further comprises a plurality of data signal lines, the data signal lines are configured to provide data signals to the pixel driving circuit, the blank region further comprises a data signal connecting line connected to the data signal lines in adjacent pixel regions in the second direction, and an orthographic projection of the third sub-lines on the substrate is overlapped at least partially with an orthographic projection of the data signal connecting line on the substrate.

14. The display substrate according to claim 12, wherein the first low-voltage connecting lines comprise a plurality of fourth transverse connecting lines and a plurality of cathode connection electrodes alternately arranged along the first direction, the fourth transverse connecting lines being connected to the third sub-lines, and adjacent fourth transverse connecting lines in the first direction being connected to each other through the cathode connection electrodes.

15. The display substrate according to claim 14, wherein each of the fourth transverse connecting lines at least comprises fourth sub-lines extending along the first direction and fourth connection blocks respectively disposed at both ends of the fourth sub-lines, the fourth connection blocks being connected to the third sub-lines, and the cathode connection electrodes being connected to the fourth connection blocks through via holes.

16. The display substrate according to claim 14, wherein the cathode is connected to the cathode connection electrodes through cathode electrode openings.

17. The display substrate according to claim 1, wherein the display substrate further comprises a bonding area located at a side of the display area in the second direction and a bezel area located at other sides of the display area, the bezel area comprises a top bezel region located at a side of the display area away from the bonding area and a side bezel region located at one or two sides of the display area in the first direction; a bonding high-voltage lead and a bonding low-voltage lead are provided in the bonding area, a top bezel high-voltage lead and a top bezel low-voltage lead are provided in the top bezel region, and a side bezel high-voltage lead and a side bezel low-voltage lead are provided in the side bezel region; the bonding high-voltage lead is connected to the side bezel high-voltage lead and the side bezel high-voltage lead is connected to the top bezel high-voltage lead to form an annular high-voltage lead surrounding the display area; the bonding low-voltage lead is connected to the side bezel low-voltage lead and the side bezel low-voltage lead is connected to the top bezel low-voltage lead to form an annular low-voltage lead surrounding the display area.

18. A display device, comprising the display substrate according to claim 1.

* * * * *